US010843923B2

(12) United States Patent
Greer et al.

(10) Patent No.: US 10,843,923 B2
(45) Date of Patent: *Nov. 24, 2020

(54) PROPERTY CONTROL OF MULTIFUNCTIONAL SURFACES

(71) Applicant: NANOCLEAR TECHNOLOGIES, INC., Los Angeles, CA (US)

(72) Inventors: Harold Frank Greer, Los Angeles, CA (US); Ryan Morrow Briggs, Pasadena, CA (US)

(73) Assignee: NANOCLEAR TECHNOLOGIES, INC., Los Angeles, CA (US)

( * ) Notice: Subject to any disclaimer, the term of this patent is extended or adjusted under 35 U.S.C. 154(b) by 187 days.

This patent is subject to a terminal disclaimer.

(21) Appl. No.: 16/029,290

(22) Filed: Jul. 6, 2018

(65) Prior Publication Data

US 2019/0016593 A1 Jan. 17, 2019

Related U.S. Application Data

(63) Continuation of application No. 15/668,283, filed on Aug. 3, 2017, now Pat. No. 10,017,384.

(Continued)

(51) Int. Cl.
*B82B 1/00* (2006.01)
*B82B 3/00* (2006.01)
(Continued)

(52) U.S. Cl.
CPC ............. *B82B 1/005* (2013.01); *B05D 1/12* (2013.01); *B05D 1/18* (2013.01); *B82B 3/008* (2013.01);
(Continued)

(58) Field of Classification Search
CPC ... B82B 1/005; B82B 3/008; H01L 31/02168; H01L 31/043; H01L 31/035218;
(Continued)

(56) References Cited

U.S. PATENT DOCUMENTS 4,332,974 A   6/1982 Fraas
6,632,993 B2  10/2003 Hayashi et al.
(Continued)

FOREIGN PATENT DOCUMENTS

EP     2838130 A1      2/2015
KR  20140023311 A      2/2014
(Continued)

OTHER PUBLICATIONS

Non-Final Office Action for U.S. Appl. No. 16/150,914, filed Oct. 3, 2018 on behalf of Nanoclear Technologies Inc. dated Jun. 6, 2019. 9 pages.

(Continued)

*Primary Examiner* — Nathan L Van Sell
(74) *Attorney, Agent, or Firm* — Steinfl + Bruno LLP

(57) ABSTRACT

The physical and chemical properties of surfaces can be controlled by bonding nanoparticles, microspheres, or nanotextures to the surface via inorganic precursors. Surfaces can acquire a variety of desirable properties such as antireflection, antifogging, antifrosting, UV blocking, and IR absorption, while maintaining transparency to visible light. Micro or nanomaterials can also be used as etching masks to texture a surface and control its physical and chemical properties via its micro or nanotexture.

17 Claims, 36 Drawing Sheets

Related U.S. Application Data

(60) Provisional application No. 62/532,857, filed on Jul. 14, 2017, provisional application No. 62/443,558, filed on Jan. 6, 2017.

(51) Int. Cl.
| | |
|---|---|
| *B05D 1/12* | (2006.01) |
| *B05D 1/18* | (2006.01) |
| *G02B 5/28* | (2006.01) |
| *G02B 1/18* | (2015.01) |
| *H01L 31/0216* | (2014.01) |
| *G02B 1/118* | (2015.01) |
| *H01L 31/043* | (2014.01) |
| *H01L 31/0352* | (2006.01) |
| *H01L 25/04* | (2014.01) |
| *G02B 1/11* | (2015.01) |
| *H01L 31/0236* | (2006.01) |
| *B82Y 30/00* | (2011.01) |
| *B82Y 40/00* | (2011.01) |
| *H01L 33/00* | (2010.01) |

(52) U.S. Cl.
CPC .............. *G02B 1/11* (2013.01); *G02B 1/118* (2013.01); *G02B 1/18* (2015.01); *G02B 5/282* (2013.01); *H01L 25/043* (2013.01); *H01L 31/02168* (2013.01); *H01L 31/02363* (2013.01); *H01L 31/035218* (2013.01); *H01L 31/043* (2014.12); *B82Y 30/00* (2013.01); *B82Y 40/00* (2013.01); *G02B 2207/101* (2013.01); *H01L 33/0054* (2013.01)

(58) Field of Classification Search
CPC ............. H01L 25/043; H01L 31/02363; H01L 33/0054; G02B 2207/101; G02B 1/118; G02B 5/282; G02B 1/18; G02B 1/11; B05D 1/12; B05D 1/18; B82Y 30/00; B82Y 40/00

See application file for complete search history.

(56) References Cited

U.S. PATENT DOCUMENTS

| | | | |
|---|---|---|---|
| 8,290,318 B2 | 10/2012 | Vasylyev | |
| 8,691,104 B2 | 4/2014 | Greer et al. | |
| 9,249,016 B2 | 2/2016 | Aria et al. | |
| 10,017,384 B1 | 7/2018 | Greer et al. | |
| 10,121,919 B2 | 11/2018 | Greer et al. | |
| 10,319,868 B2 | 6/2019 | Greer et al. | |
| 10,510,911 B2 | 12/2019 | Greer et al. | |
| 2004/0187914 A1 | 9/2004 | Matsuda et al. | |
| 2007/0089784 A1 | 4/2007 | Noh et al. | |
| 2007/0131275 A1 | 6/2007 | Kinsey et al. | |
| 2008/0102201 A1 | 5/2008 | Choi et al. | |
| 2008/0238299 A1 | 10/2008 | Cho et al. | |
| 2009/0188558 A1 | 6/2009 | Jen et al. | |
| 2010/0150513 A1 | 6/2010 | Zhang et al. | |
| 2010/0187404 A1 | 7/2010 | Klem et al. | |
| 2010/0196695 A1* | 8/2010 | Garcia | D01F 9/127 428/323 |
| 2012/0234460 A1 | 9/2012 | Zhang et al. | |
| 2013/0064990 A1* | 3/2013 | Lu | B82Y 30/00 427/535 |
| 2014/0106491 A1 | 4/2014 | Park et al. | |
| 2014/0203258 A1 | 7/2014 | Guo et al. | |
| 2014/0213005 A1 | 7/2014 | Zhang et al. | |
| 2014/0339565 A1 | 11/2014 | Choi et al. | |
| 2015/0174625 A1* | 6/2015 | Hart | B08B 17/065 428/141 |
| 2015/0194242 A1 | 7/2015 | Muscat et al. | |
| 2015/0299848 A1 | 10/2015 | Haukka et al. | |
| 2016/0049563 A1 | 2/2016 | Krishnamoorthy et al. | |
| 2016/0136685 A1 | 5/2016 | Ettrich et al. | |
| 2016/0258114 A1 | 9/2016 | Firth et al. | |
| 2017/0327951 A1 | 11/2017 | Kianinia et al. | |
| 2018/0194619 A1 | 7/2018 | Greer et al. | |
| 2018/0198003 A1 | 7/2018 | Greer et al. | |
| 2018/0198006 A1 | 7/2018 | Greer et al. | |
| 2019/0074389 A1 | 3/2019 | Greer et al. | |
| 2019/0326454 A1 | 10/2019 | Greer et al. | |
| 2019/0355854 A1 | 11/2019 | Greer et al. | |
| 2020/0025981 A1 | 1/2020 | Greer et al. | |
| 2020/0066927 A1 | 2/2020 | Greer et al. | |

FOREIGN PATENT DOCUMENTS

| | | |
|---|---|---|
| KR | 20146134375 A | 11/2014 |
| WO | 2008/140601 A1 | 11/2008 |
| WO | 2012/138651 A2 | 10/2012 |
| WO | 2020/018906 A1 | 1/2020 |

OTHER PUBLICATIONS

Notice of Allowance for U.S. Appl. No. 15/668,227, filed Aug. 3, 2017 on behalf of Nanoclear Technologies. dated Jan. 28, 2019. 12 pages.
Notice of Allowance for U.S. Appl. No. 16/150,914, filed Oct. 3, 2018 on behalf of Nanoclear Technologies Inc. dated Aug. 2, 2019 8 pages.
European Patent Office Communication Rule 161 and 162 for European Application No. 17838108.3 , dated Aug. 21, 2019, 3 pages.
European Patent Office Communication Rule 161 and 162 for European Application No. 18709123.6 , dated Aug. 19, 2019, 3 pages.
International Search Report and Written Opinion for International Application No. PCT/US2019/042606 filed Jul. 19, 2019 on behalf of Nanoclear Techologies. dated Nov. 4, 2019. 10 pages.
Xiaodan Huang , et al, "Plasmonic Lattice Mode Formed by AG Nanospheres on Silica Pillar Arrays", arxiv.org, Cornell University Library, 201 Olin Library Cornell University Ithaca, NY, 14853, Nov. 23, 2017, pp. 1,2, figures 1,2.
International Search Report for International Application No. PCT/US2018/012423 filed Jan. 4, 2018 on behalf of Nanoclear Technologies, Inc. dated Aug. 22, 2018. 6 pages.
Written Opinion for International Application No. PCT/US2018/012423 filed Jan. 4, 2018 on behalf of Nanoclear Technologies, Inc. dated Aug. 22, 2018. 9 pages.
Fernandes, R.V., et al., "Development of multidye UV filters for OPVs using luminescent materials." *Journal of Physics D: Applied Physics* 50 (2), 25103, (2016).
Invitation to Pay Additional Fees for International Application No. PCT/US2018/012423 filed Jan. 4, 2018 on behalf of Nanoclear Technologies, Inc. dated Jun. 26, 2018. 12 pages.
Final Office Action for U.S. Appl. No. 15/668,227, filed Aug. 3, 2017 on behalf of Nanoclear Technologies, Inc. dated Apr. 10, 2018. 18 pages.
Non-Final Office Action for U.S. Appl. No. 15/668,164, filed Aug. 3, 2017 on behalf of Nanoclear Technologies, Inc. dated Jan. 26, 2018. 21 pages.
Non-Final Office Action for U.S. Appl. No. 15/668,227, filed Aug. 3, 2017 on behalf of Nanoclear Technologies, Inc. dated Dec. 21, 2017. 12 pages.
Notice of Allowance for U.S. Appl. No. 15/668,164, filed Aug. 3, 2017 on behalf of Nanoclear Technologies, Inc. dated Mar. 22, 2018. 9 pages.
Notice of Allowance for U.S. Appl. No. 15/668,164, filed Aug. 3, 2017 on behalf of Nanoclear Technologies, Inc. dated Jul. 10, 2018. 10 pages.
Restriction Requirement for U.S. Appl. No. 15/668,164, filed Aug. 3, 2017 on behalf of Nanoclear Technologies, Inc. dated Nov. 8, 2017. 6 pages.
Restriction Requirement for U.S. Appl. No. 15/668,227, filed Aug. 3, 2017 on behalf of Nanoclear Technologies, Inc. dated Sep. 20, 2017. 7 pages.

(56) References Cited

OTHER PUBLICATIONS

International Search Report and Written Opinion for International PCT Application No. PCT/US2019/065387 filed on Dec. 19, 2019. Filed on behalf of Nanoclear Technologies, Inc. dated Mar. 26, 2020. 9 pages.

Non-Final Office Action for U.S. Appl. No. 16/669,322, filed Oct. 30, 2019 on behalf of Nanoclear Technologies Inc. dated Mar. 9, 2020. 10 pages.

\* cited by examiner

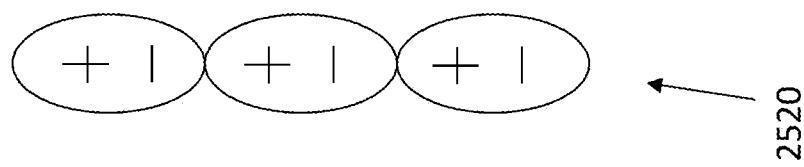
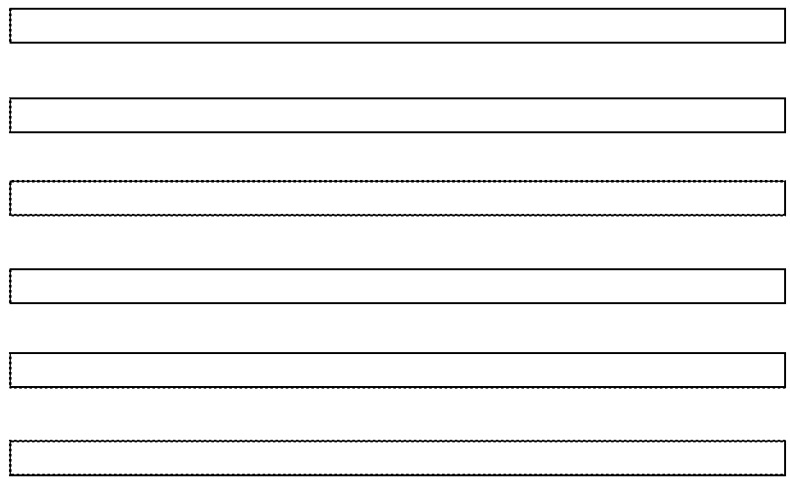
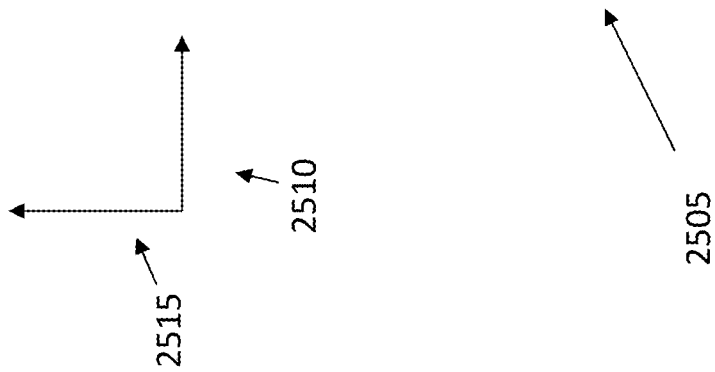
FIG. 25

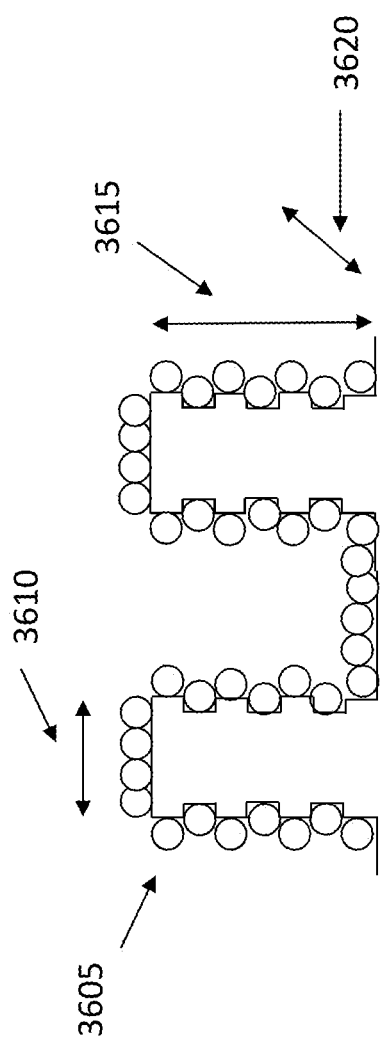

PROPERTY CONTROL OF MULTIFUNCTIONAL SURFACES

CROSS REFERENCE TO RELATED APPLICATIONS

The present application is a continuation application of U.S. patent application Ser. No. 15/668,283 filed on Aug. 3, 2017, which claims priority to U.S. Provisional Patent Application No. 62/532,857, filed on Jul. 14, 2017, and U.S. Provisional Patent Application No. 62/443,558, filed on Jan. 6, 2017, the disclosures of each being incorporated herein by reference in their entirety.

TECHNICAL FIELD

The present disclosure relates to multifunctional surfaces. More particularly, it relates to methods to control surface properties by nanoparticle monolayers.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 25 illustrates an array of conductive wires spaced apart and parallel to each other.

FIG. 36 illustrates solid applications.

SUMMARY

Figure 1:
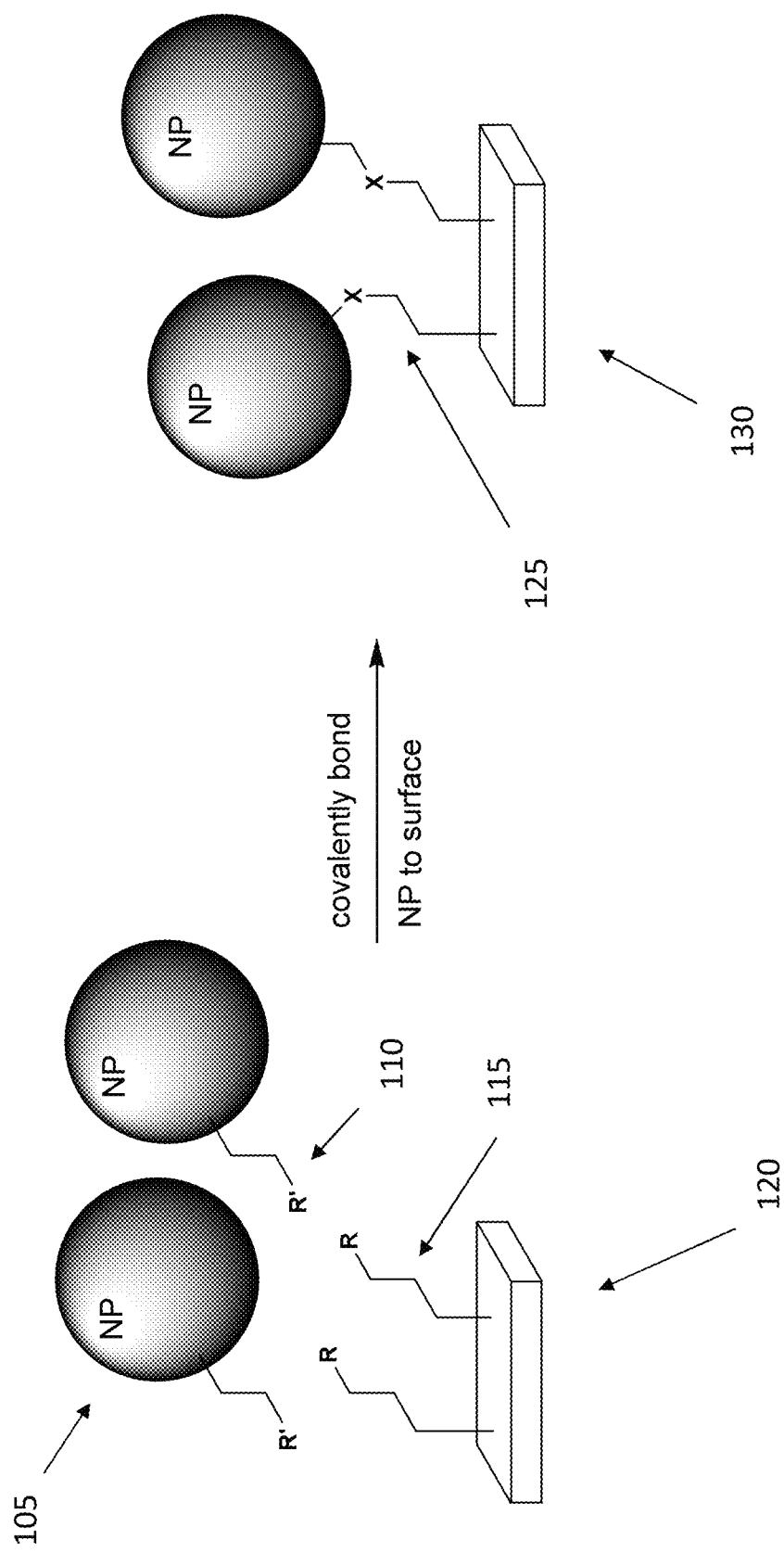
FIG. 1 is a schematic illustration of the covalent attachment of nanoparticles (NP) to a substrate.

In a first aspect of the disclosure, a method is described, the method comprising: determining a first lateral dimension of each element in a structure on a surface, the structure comprising a plurality of elements, the determining based on a first physical characteristic of the structure, the first lateral dimension being in a horizontal orientation relative to the surface; determining a second lateral dimension of each element, the second lateral dimension being perpendicular to the first lateral dimension and in a horizontal orientation relative to the surface; determining a height of each element based on a second physical characteristic of the structure, the height being in a vertical orientation relative to the surface; determining a spacing between the elements based on the first and second physical characteristics; and fabricating the structure.

In a second aspect of the disclosure, a method is described, comprising: determining a first lateral dimension of each element in a structure on a surface based on a desired transparency of the structure to incident electromagnetic radiations, the structure comprising a plurality of elements, the first lateral dimension being in a horizontal orientation relative to the surface and being less than half of a wavelength of an electromagnetic radiation to be blocked by the structure; determining a height of each element based on a desired reflectivity for the incident electromagnetic radiation, the height being in a vertical orientation relative to the surface; determining a spacing between the elements based on the desired transparency and reflectivity; and fabricating the structure.

In a third aspect of the disclosure, a structure is described, the structure comprising: an array of pillars on a surface, each pillar having a first lateral dimension x, a second lateral dimension z, and a height y; and a monolayer of particles covering each pillar, wherein x is between 50 nm and 250 nm, thereby blocking ultraviolet radiation, y is between 120 nm and 180 nm, thereby reducing reflected radiation, each particle of the monolayer has a diameter less than 200 nm and is made of a material capable of absorbing infrared radiation.

DETAILED DESCRIPTION

Several existing products include coatings and other types of surface modifications to obtain particular physical, chemical, or electrical properties for the product surface. For example, modification of surface properties may be achieved by the deposition of nanoparticles on the surface by a non-bonding process. These nanoparticles may be applied to the surface by a spin, spray, or dip coating process. Nanoparticles may be attached to surfaces for a variety of reasons, such as Raman enhancement or to act as a catalyst. While these techniques, known to the person of ordinary skill in the art, are effective in certain applications, they nevertheless may present some drawbacks, mainly due to the fact that these known techniques do not robustly attach the nanoparticles to the surface. Many of these known techniques also do not have specificity, require extreme care during deposition, and do not generally attach a single layer of nanoparticles uniformly on a surface. Additionally, these processes may not be able to effectively apply a single layer of nanoparticles onto curved or other non-uniform surfaces.

Alternatively, there are other methods known to the person of ordinary skill in the art, in which nanoparticles are bonded to the surface. For example, nanoparticles can be bonded to one portion of a complementary base pair of deoxyribonucleic acids (DNA), while the other portion of the complementary base pair is bonded to the surface. While this technique creates a single nanoparticle layer, there can be shortcomings. First, DNA denatures when it is heated; thus, the nanoparticle layer is not stable at high temperatures. Second, the DNA linkage may not be chemically stable against strong acids/bases or extreme solvents. Third, attaching DNA to a particular substrate is a very complex process. Lastly, the raw materials for DNA attachment are expensive.

The present disclosure describes methods to deposit monolayers of nanoparticles with inexpensive and technologically less complex techniques, which allow for significantly increased control over the chemical and physical (e.g. optical and electrical) properties of the resultant surface coated with nanoparticles. Three dimensional structures with multiple levels and sizes of nanoparticles can also be created using this technique. Therefore, while this technique describes how to modify a surface with nanoparticles, the ability to coat multiple layers of conformal and uniform particles enables not only the production of novel surfaces, but also enables the fabrication of three-dimensional materials and metamaterials as well.

In general terms, various methods disclosed herein are directed to the application of a single layer of nanoparticles on a substrate surface. The methods disclosed herein provide a stable and uniform coating on a wide variety of surfaces (flat, curved, or non-uniform). In some embodiments, the size of the particles deposited can be in the nanometer range, or in the micrometer range (e.g. microspheres). These particles can be attached to a surface, for example, by different methods: 1. Inorganic bonding; 2. Organic bonding (click chemistry); 3. carefully controlled spraying or dipping. For example, fluids can be applied in successive, distinct steps to the particles and the surface, to create bonds or attraction between particles and surface. For example, a first liquid can be sprayed or otherwise applied to the particles, while a second liquid mixture can be applied to the surface, in distinct steps. Excess amounts of liquids can be removed, for example with a neat solvent (or solvent mixture) or by drying. The first and second liquids are chosen so as to be able to create a bond or attractive force between the particles and the surface, creating a single uniform monolayer of particles on the surface. This technique can be modified to create more complex, hierarchical surfaces comprising multiple monolayers or other structures. A similar process can be carried out using organic chemistry. Instead of liquids, gases may be used. The fluids may also be termed "precursors", as they prepare the different surfaces for subsequent bonding (or attraction forces in general) between functional groups. In some embodiments, the particles (or particle suspension) are one of the two precursors. In this case, the particles can be functionalized, rendering their surface reactive to the substrate, though in other embodiments the particles may be suitable for attraction upon being formed or fabricated. The particles can therefore be prepared in a separate step, to render them a precursor. The other precursor is applied to the surface of the substrate. The particle precursor can then attach to the surface treated with the other precursor. In other words, the process comprises the following steps: 1. The substrate is sprayed or otherwise prepared with a first precursor; 2. The substrate is sprayed with a neat solvent or fluid mixture; 3. The substrate is sprayed with a dispersion of particles (the particles are a precursor suspended in a fluid); 4. The substrate is sprayed with a neat solvent. The precursors and solvents are chosen so as to allow the different functional groups to interact, or not interact, as desired, in order to allow application of one monolayer while discouraging the attachment of a second monolayer. Once the first monolayer is formed, the process can be repeated, if necessary, to attach a second monolayer, and so forth. In other embodiments, the particles can be sprayed directly onto the surface, relaying only on physical interactions, with no permanent bonds. For example, the particles may remain attached through van der Waals or electrostatic forces.

In some embodiments, functional groups like —OH and Al—$CH_3$ are used to bond particles to a surface. This approach is different from DNA-based functionalization, because DNA methods are based on hydrogen bonds. The complementary base pairs have hydrogen-type bonds. These hydrogen bonds denature at high temperature. At high temperatures, the shape of the DNA strands change and therefore the hydrogen bonding breaks up.

Examples of the nanoparticles used with the disclosed methods comprise, but are not limited to, metals, metal oxides, metal nitrides, carbon nanotubes, buckyballs (e.g. spherical fullerene molecules with the formula $C_{60}$), or architectured 3D nanostructures such as metal-organic frameworks (MOF).

Examples of the substrates used with the disclosed methods comprise, but are not limited to, glass, ceramics, plastics, polymers, textiles, semiconductors, metals, 3D printed materials, or 3D architectured materials.

In some embodiments, a single, uniform layer of nanoparticles is deposited on arbitrary surfaces by liquid phase atomic layer deposition. As known to the person of ordinary skill in the art, atomic layer deposition (ALD) is a thin film deposition technique based on the sequential application of precursor components (e.g. two precursors), that are deposited on a substrate, where they chemically interact to form atomic bonds. ALD is considered a subclass of chemical vapour deposition, as the precursors are generally introduced in the gas state inside a deposition chamber. However, if the precursors are in the liquid state, the technique can be referred to as liquid phase atomic layer deposition or solution atomic layer deposition (sALD), because the precursors are dissolved in a noninteracting solvent.

In some embodiments, the layers are formed using a three-step process. In a first step, the nanoparticles are functionalized with "—OH" alcohol groups. As the person of ordinary skill in the art will understand, there are many different chemical synthetic methods that can be used to attach "—OH" functional groups onto a nanoparticle of arbitrary composition (by way of example but not of limitation, the nanoparticles may comprise a pure metal or oxide). In a second step, the target substrate (i.e., the surface that is to be coated) is exposed to trimethylaluminum (TMA) in a vacuum chamber, solution, or other methods known or developed in the art. In this second step, the substrate surface is functionalized with a "—$CH_3$" or methyl groups.

In a third step of this embodiment, the "—$CH_3$" functionalized substrate can be submerged in a bath of "—OH" functionalized nanoparticles. The bath is composed of the functionalized nanoparticles suspended in an organic solvent such as hexane (or other organic solvents that are free of water or of reactive molecules which contain —OH groups). The methyl groups on the substrate surface react with the alcohol or, more generically, —OH group on the functionalized nanoparticles to form a sub strate-oxygen-nanoparticle (substrate-Al—O-nanoparticle) covalent bond, and a methane by-product ($CH_4$) (which exits the bath as a dissolved gas, or bubbles out of the bath).

The covalent bond permanently attaches the nanoparticles to the surface in a single layer. The attachment stops when all the "—$CH_3$" groups have been converted into covalent nanoparticle bonds. Subsequent nanoparticles that approach the surface may loosely adhere to the substrate, but they do not form covalent bonds. Accordingly, when the coated substrate is removed from the bath and rinsed, the loosely bound nanoparticles will be removed, and the covalently bonded ones remain on the substrate surface. In this way, it is possible to form a monolayer of covalently bonded nanoparticles, while any nanoparticle that possibly attached as a second or third monolayer, etc. can be removed due to the fact that such possible multilayers of nanoparticles are not covalently bonded to the substrate. Only the first nanoparticle layer is covalently bonded. In some embodiments, after each step, the substrate is rinsed with an organic solvent such as hexane. For example, the hexane can rinse off any nanoparticle weakly attached as a second monolayer or any number of additional multilayers. In some cases, sonication can be used to help remove the excess multilayers.

In other embodiments, the above process, which forms a single monolayer of nanoparticles covalently attached to a substrate, can be repeated as many times as desired to build up precise layers of nanoparticles, one layer at a time. In this process, the first monolayer covalently bonded to the substrate is now functionalized—similarly to how the substrate had been functionalized in the first iteration. A second monolayer of nanoparticles will then covalently bond to the first monolayer, while any nanoparticle weakly bonded as a possible third monolayer can be easily removed (e.g., rinsed off). In each subsequent iteration, another monolayer of nanoparticles is deposited. The subsequent layers of nanoparticles can be identical to the nanoparticles in the first layer. Alternatively, different nanoparticles may be added in the subsequent layers. For example, each subsequent monolayer may be formed with a different type or size of nanoparticles, or two types of nanoparticles may alternate. By choice of appropriate nanoparticle compositions for each of the layers, three dimensional materials and metamaterials can be fabricated with arbitrary compositions, grading of material properties, and dimensions. Structured nanoparticle assemblies of this type may have "metamaterial" properties such as tunable (and potentially negative) index of refraction, cloaking, wavelength selectable reflection, polarizations, or superlens focusing effects.

In other embodiments, the above process can be stopped before it forms a fully closed monolayer of nanoparticles. In some embodiments, the excess nanoparticles multilayers do not have to be removed. In other embodiments, in the above process does not have to have perfectly separated steps. In these embodiments, the modifications from the ideal steps could compromise the quality of the final monolayer, but a slightly imperfect process could be used to shorten fabrication times. In other words, depending on the tolerance to defects of the final application, the process may be modified as a trade off between quality and ease of fabrication.

In other embodiments, a single, uniform layer of nanoparticles is deposited on arbitrary surfaces by a combination of gas and liquid phase atomic layer deposition. According to this method, the substrate surface can be functionalized by exposing the substrate to TMA, in the gas phase. This first step may take place, for example, in an atmospheric pressure conveyor belt system or similar systems. Once the substrate is functionalized with —$CH_3$ groups, the substrate is exposed to —OH functionalized nanoparticles by spray coating (or other types of coating such as dip coating) in a dry nitrogen environment. Similarly to how was described above, the nanoparticles will covalently bond to the surface of the substrate.

Therefore, the methods described above can be summarized as 1. Functionalization of the nanoparticles; 2. Functionalization of the substrate; 3. Covalent bonding of a single monolayer of nanoparticles on the substrate. The first and second steps may also be performed in reverse order, or simultaneously. As noted above, either one or both of the nanoparticle-substrate combo can be bonding without pretreatment.

In other embodiments, the three steps may be modified to be performed with functionalizing agents in the gas phase, under vacuum, or in the liquid phase, as long as the functionalization of the substrate and the covalent bonding steps are carried out in an environment substantially free of water or any —OH groups other than the —OH groups on the nanoparticles. Otherwise these additional —OH groups may interfere with the methods by preferentially bonding the nanoparticles on other, non target, surfaces. Additionally, any of the embodiments may be performed in batch or in a conveyor belt-style continuous process. By way of example and not of limitation, according to one embodiment, a substrate is placed in a first zone and the substrate is sprayed with TMA, the TMA being in the liquid phase. The substrate is then moved to a second zone with a neat solvent (a stoichiometric solvent) to flush any unreacted TMA from the substrate. The substrate then moves to a third zone which sprays functionalized nanoparticles onto the substrate surface. The substrate then moves to a fourth zone in which the substrate is sprayed again with a neat solvent to remove any excess particles.

In other embodiments, the nanoparticles may be functionalized with TMA and the substrate surface is functionalized with alcohol groups. In other embodiments, TMA can be substituted for any number of potential reactive precursors used in gas phase atomic vapor deposition such as, but not limited to, chlorides, fluorides, organometallics, or acac (acetylacetonates). In other embodiments, the —OH group may be substituted with other groups, such as, for example, an amine (—$NH_2$) group, an ester group, an aldehyde group, a halide, amides, nitriles, or other functional groups known or developed in the art. In other embodiments, the various functionalized groups disclosed herein can be elongated by attaching a carbon chain between the nanoparticle and its functional group (e.g., the —OH group) and/or adding a carbon chain between the substrate and its functional group (e.g., the —$CH_3$ group).

The methods described herein may be employed together with other processes, or to modify surfaces of existing products. For example, surfaces having covalently-bonded nanoparticles attached thereto can be used as a masking agent for subsequent etching processes. In other applications, the covalently bonded nanoparticles can be utilized to allow a solar cell to absorb light at different wavelengths. The substrate of the solar cell can be designed to absorb light at different wavelengths than the nanoparticles, so the overall energy collected from the combined tandem cell can be increased over the single terminal cell. Surfaces modified with nanoparticles can also be used as scattering centers on the bottom of existing solar cells to increase the amount of light absorbed by the cells.

As described above, the present disclosure describes methods to covalently bond nanoparticles to arbitrary surfaces. The introduced nanoparticles can then be leveraged to create novel materials with newly formed surface topographies. The newly created nanometer scale surface topographies change the arbitrary surfaces into valuable new materials including superhydrophilic, superhydrophobic or light-harvesting materials. There are numerous known methods for creating functionalized self-assembled monolayers (SAMs). The present invention uses these SAMs to control valuable surface properties. For example, a substrate may be functionalized with a SAM. The functionalized nanoparticles can then covalently bond to the substrate through the SAM.

In some embodiments, the nanoparticles coated on a substrate may be used to create a mask that partially blocks reactive species from etching away at the substrate. The nanoparticles may then be removed, or alternatively remain covalently bonded to the surfaces and thereby create desired nanometer scale topographies.

In other embodiments, the nanoparticle monolayers can be used to deliberately block a portion of the original surface area, and prevent deposition (limited to the blocked portion of the original area) of additional atoms, molecules, compounds, or materials that are being added to the surface. In this way, the surface topographies at the nanometer scale can be controlled to create desired surface properties. In other embodiments, functionalized nanoparticles can be covalently bonded to the SAMs, to allow for desired light absorption or emission properties.

FIG. 1 is a schematic illustration of the covalent attachment of nanoparticles (NP) to a substrate. In FIG. 1, the nanoparticles (105) are functionalized (110) with a group R', while the surface (120) is functionalized (115) with a complementary group R. A covalent bond X is then formed (125), attaching the nanoparticles to the surface (130). In some embodiments, instead of a $CH_2$—$CH_2$—R chain, simply R can be used where R represents an arbitrary functional group or atom.

Therefore, the SAM on an arbitrary surface is subjected to a reaction which covalently bonds the NPs to the SAM. In some embodiments, the nanoparticles may also not be additionally functionalized, if the specific functional group of the SAM can covalently bond with the specific material of the nanoparticle. The NP-SAM can be used for further manipulations to fabricate surfaces with the desired nanometer scale topographies. Such topographies may render the surfaces, for example, superhydophilic, superhydrophobic, light emitting, or light absorbing.

Figure 2:
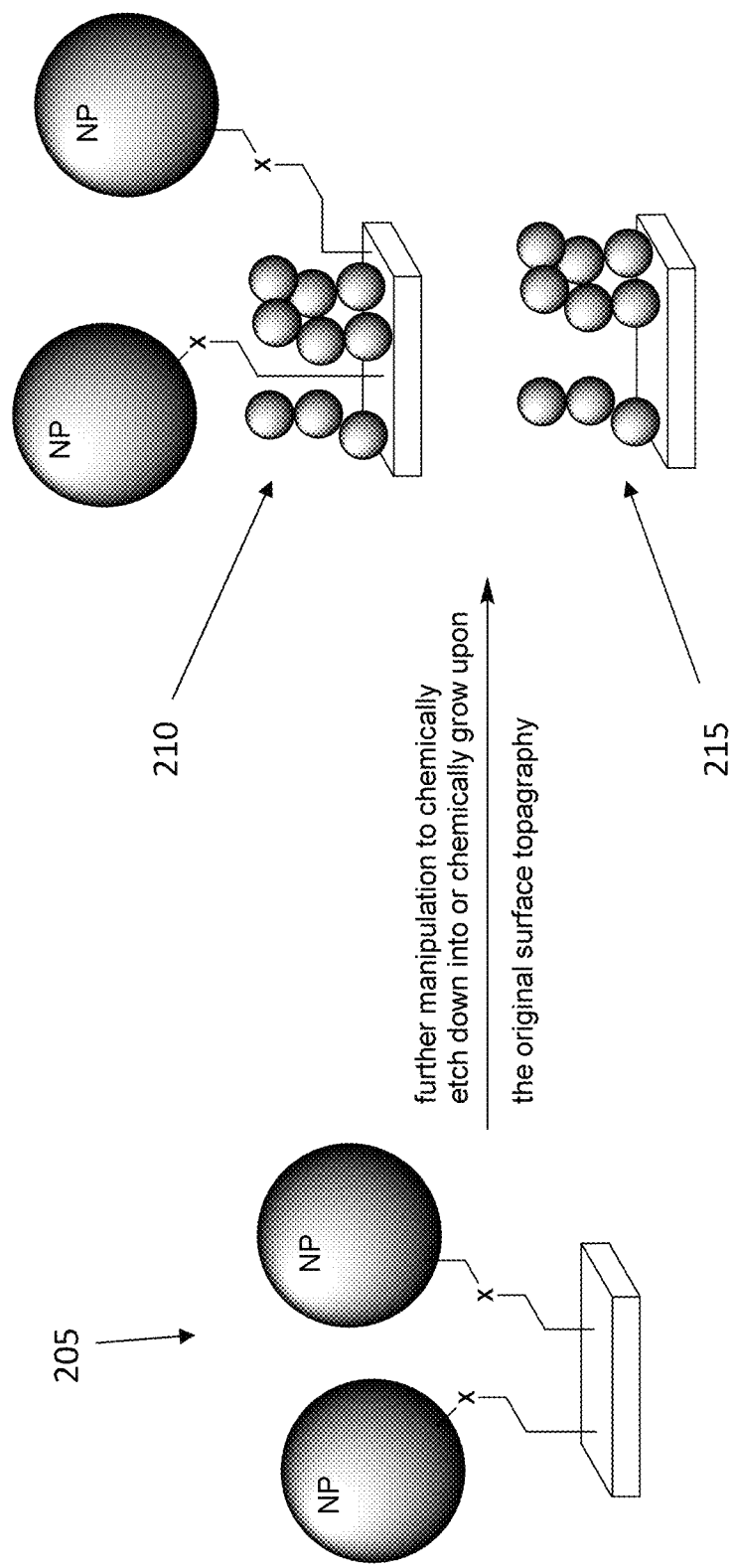
FIG. 2 illustrates an example of using an NP-SAM complex to modify the topography of a surface through blocking.

FIG. 2 illustrates an example of using an NP-SAM complex (205) to modify the topography of a surface. In this embodiment, the NP-modified SAMs are used as substrates for further manipulations of the underlying surface. For example, the NPs may serve as a mask to block the access of reactive ion species in a chemical etch. Alternatively, the NPs may stop the growth of newly introduced matter to the surface of the underlying substrate.

In some embodiments, the nanoparticles may be retained on the surface to which they are already attached to, to obtain a new surface with a newly created surface topography (210). In this example, the nanoparticles remain covalently bonded to the SAM on the substrate. The nanoparticles provide access to certain areas of the underlying substrate, and subsequently a material, e.g. atoms or molecules, may be deposited limitedly to these accessible areas.

In other embodiments, the nanoparticles may be chemically, or otherwise, removed to provide a surface (215) with a new surface topography that is devoid of any NPs. In this embodiment, the nanoparticles are used as a mask to deposit a material only in specific areas of the substrate. The copper catalyzed azide-alkyne cycloaddition reaction (CuAAC) is an example of the type of reaction that may be used to covalently attach functionalized NPs to the appropriately armed SAMs.

Figure 3:
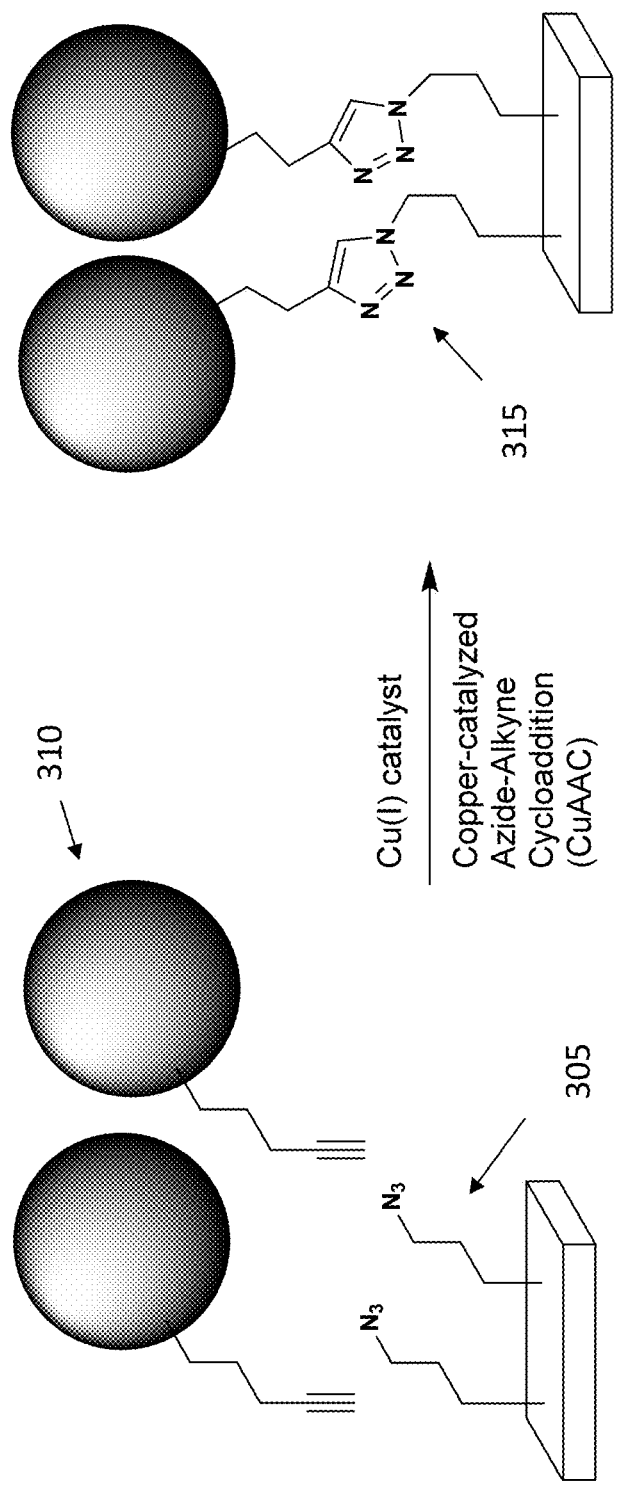
FIGS. 3-6 illustrate examples of nanoparticles and substrates with different functionalization.
Figure 4:
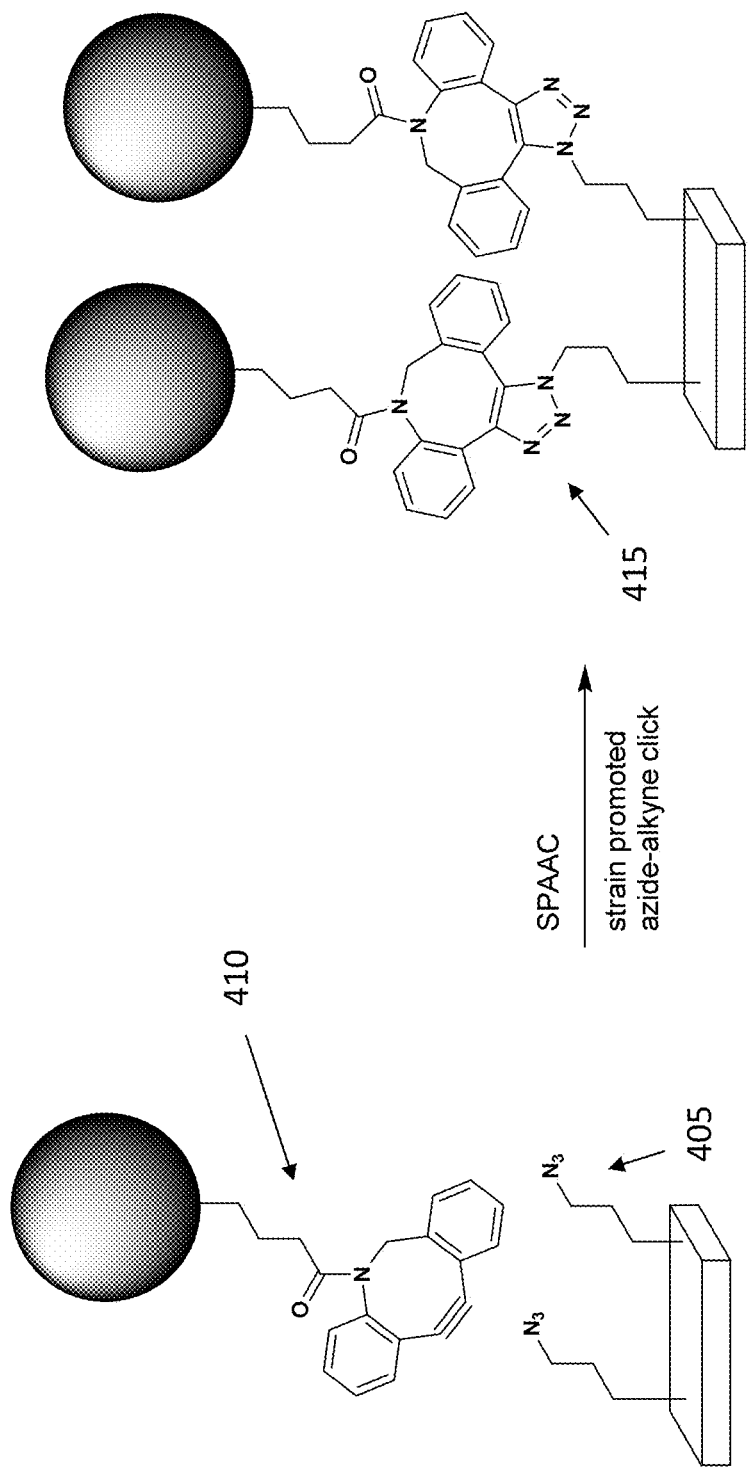
Figure 5:
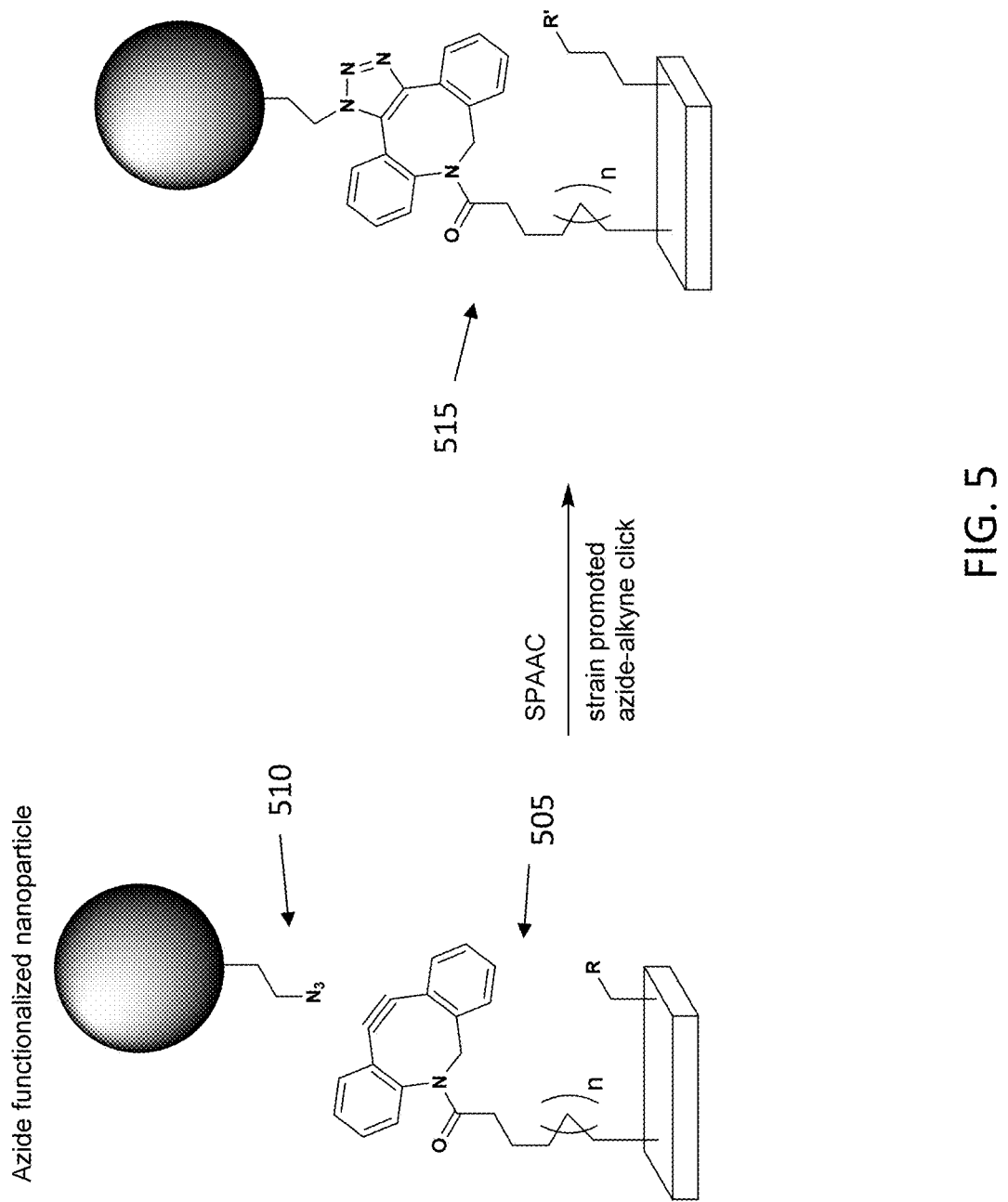

FIGS. 3-5 illustrate examples of nanoparticles and substrates with different functionalization. For example, FIG. 3 illustrates an example using the CuAAC reaction. FIG. 3 illustrates an azide-containing SAM (305) that readily undergoes attachment to alkyne functionalized NP (310), with the aid of copper catalysis at room temperature, to give a triazole (315) that attaches the NP to the surface to create a NP-modified SAM substrate.

FIG. 4 also illustrates a surface with an azide monolayer (405), which can attach to nanoparticles functionalized (410) with dibenzoazacyclooctyne (DIBAC). The covalent bond (415) is through a strain promoted azide-alkyne click (SPAAC).

FIG. 5 illustrates a substrate with a DIBAC monolayer (505), which can bond to an azide (510) on a nanoparticle. The covalent bond (515) is formed via a strain promoted azide-alkyne click, with a newly formed triazle ring. In the example of FIG. 5, the substrate and nanoparticles functionalizing agents are reversed, compared to the example of FIG. 4. As understood by the person of ordinary skill in the art, different functionalizing agents can be used. Each functionalizing agent interacts with a complementary agent, but not with other agents of the same group. In other words, the functionalizing agents on the substrate bond to the agents on the nanoparticles, but do not bond to other agents on the substrate, nor do the agents on the nanoparticles bond to other nanoparticles. In this way, the covalent bonds are selectively formed between the substrate and the nanoparticles, but not between nanoparticles.

Figure 6:
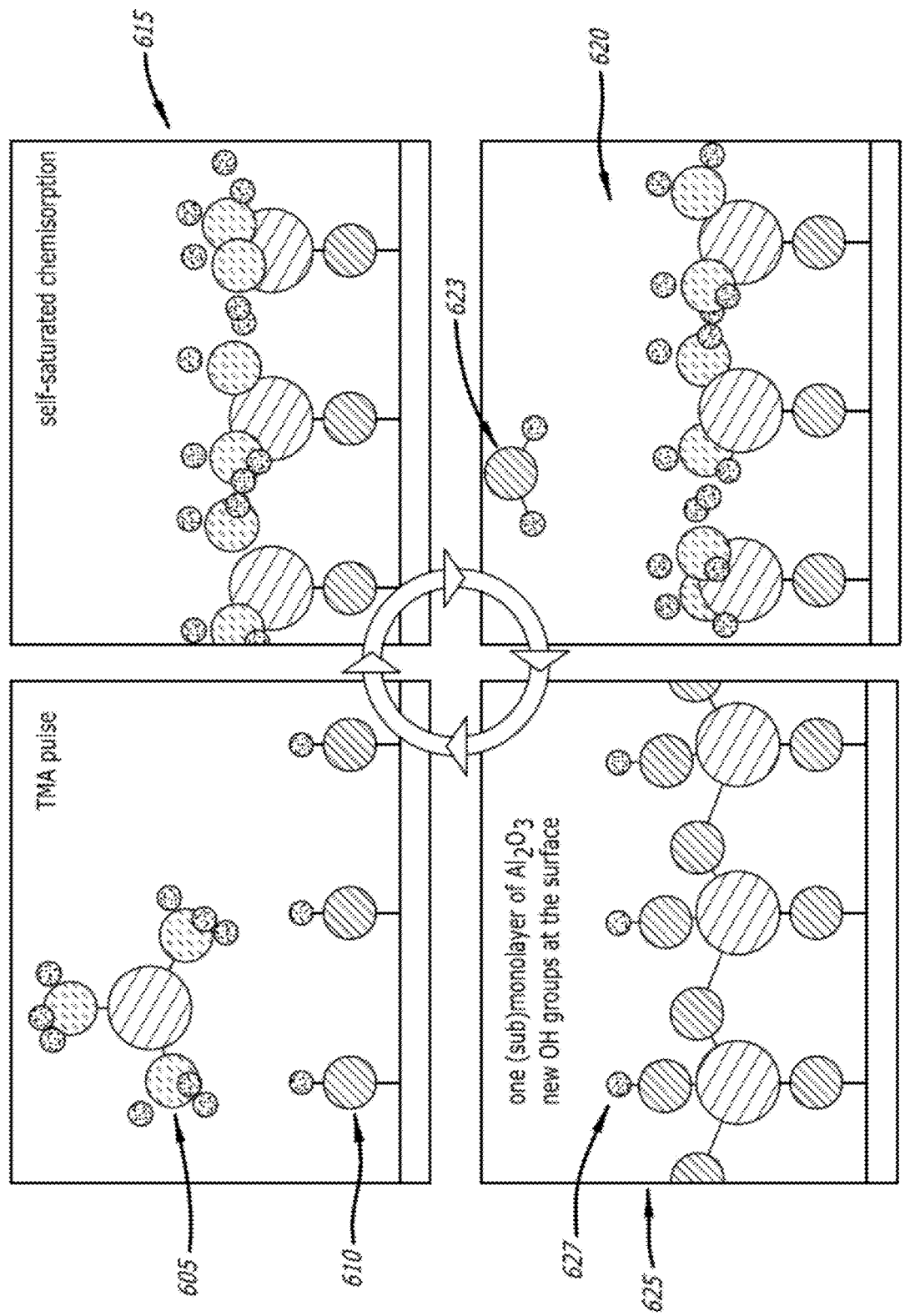

FIG. 6 illustrates a further example of controlled deposition. In this embodiment, the method is similar to the functionalization and bonding of particles, using trimethylaluminum (TMA) and nanoparticles with —OH functional groups. In the example of FIG. 6, a monolayer of aluminum oxide is formed on a surface to bind the particles, as described below.

The high affinity of trimethyl aluminum (605) $Al_2(CH_3)_6$ for —OH functional groups (610) leads to an aggressive reaction to form aluminum oxide and methane. TMA can be introduced, for example, with a TMA pulse. The chemisorption (615) on the surface is self-saturating. The methyl ligands and the —OH ligands have no affinity for each other, leading to the self-limited formation of a single monolayer. Subsequently, an "—OH functionalized nanoparticle pulse" pulse (623) can be introduced (620). As a consequence, a monolayer, or a sub-monolayer of $Al_2O_3$ is formed (625), with new —OH functional groups (627) on its surface. In some embodiments, the aluminum oxide layer may be formed without also introducing new —OH groups on the surface, depending on whether the aluminum oxide surface needs to be functionally active or not. In some embodiments, commercially-functionalized nanoparticles and a TMA solution can also be used. For example, carboxylic acid groups on polyethylene glycol (PEG) encapsulated gold nanoparticles are commercially available. TMA in hexane solutions are also commercially available.

In some embodiments, the methods of the present disclosure can be implemented as a spatially differentiated solution-based ALD. For example, the substrate is sprayed with TMA in a solution, in a first zone of a working area. In a second zone, a neat solvent flushes unreacted TMA. In a third zone, functionalized nanoparticles are sprayed on the substrate. In a fourth zone, a neat solved is sprayed to remove excess nanoparticles. In some embodiments, dipping steps can be used instead of spraying. In some embodiments, solvent mixtures or other fluids can be used instead of a neat solvent.

Figure 7:
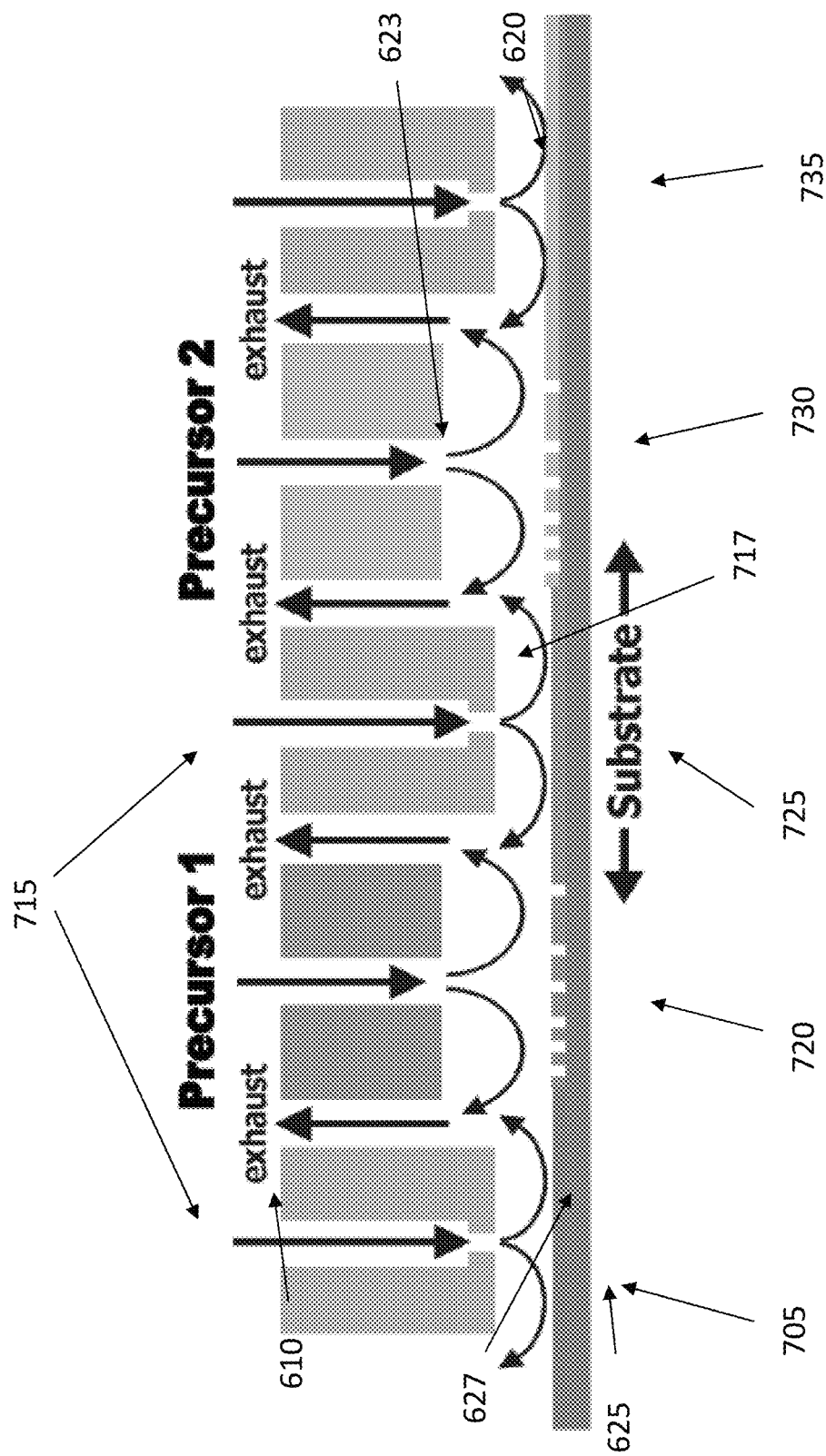
FIG. 7 illustrates a working station with multiple fabrication steps.

For example, FIG. 7 illustrates a working station with multiple fabrication steps. The substrate can be moved across multiple zones along a working surface, for example as indicated by arrows (725). In the example of FIG. 7, each zone has means for applying a liquid or gas to the substrate. For example, gas bearings or liquid pumps (715) could be used to apply fluids in zones (705,717,735). In this example, a first (720) and second (730) precursors can be applied to the substrate in the respective zones. In some embodiments, the precursors are liquids, and liquid flushes can be used in (705,717,735) to flush out any remaining precursor. For example, this method prevents precursors from mixing between each other before being applied to the substrate. Mixing precursors can cause precipitations instead of deposition on the surface being coated. One of the precursors may comprise particles, as described above in the present disclosure. In other embodiments, the precursors and flushes can be in the gas state. The purpose of zones (705,717,735) is then to vent the precursors. Suitable means to exhaust the fluids can be placed between the precursor zones and the flushing zones. For example, a neat solvent may be used in zones (705,717,735), while the precursors may be in a liquid solution comprising a solvent. In some embodiments, one of the precursors is a fluid which leaves functional groups on the substrate, while the other precursor comprises particles which have been functionalized with a functional group complementary to that on the substrate, prior to spraying the particle suspension on the substrate. In some embodiments, the venting or purging steps can be carried out in the same location where the precursors are sprayed.

Several parameters may be adjusted to optimize spray coating, such as the raster speed at which the substrate is moved between zones (e.g. in FIG. 7), the distance of the spraying nozzles from the substrate, whether the nozzles employ ultrasonics or not, the dispersion of particles in the suspension, the pH of the suspension, the use of surfactants, and the specific liquid(s), e.g. alcohol, water, or organic solvents. In some embodiments, a pre-spray sonication step may also be incorporated. Other parameters comprise the flow rate or speed at the feed tube and nozzle, the orientation of the nozzles, and the temperature of the substrate. Surfactants can be added to the nanoparticle dispersion as well to prevent or retard agglomeration. All these parameters may influence the coating of surfaces, such as the uniformity of the monolayers. The spacing between particles may also be controlled through the above parameters. For example, having a spacing between particles greater than half the particle's radius may be considered too large to create a uniform monolayer. In such case, the spray coating would be optimized to give a spacing between particles of less than half a radius. Spray coating may therefore be advantageous, compared to spin coating, due to the greater control possible during coating of the particles on a surface. If the deposition is not uniform, and as the liquid dries, particles could tend to form islands on the surface, instead of monolayers. In some embodiments, partially closed monolayers may be useful, and the same fabrication parameters may be controlled to specify the characteristic length between particles and the degree of agglomeration.

In some embodiments, the particle size and composition can be controlled to obtain the desired functionality, such as antifogging, visible light transmissivity, UV blocking, and etch resistance. In some embodiments, it may be advantageous to have a close-packing arrangement to form monolayers of particles. However, the particles may aggregate in the suspension fluid prior to deposition, which may negatively impact the formation of monolayers. For example, a target may be to have agglomerates of less than 3 particles in the suspension fluid. For example, a charge may be established on the particles to ensure controlled spreading during spraying of the particles. Surface coatings may also be used, either on the particles, the surface to be sprayed, or both. The surface coatings may, for example, improve adhesion of a monolayer of particles. The surface tension of the substrate may, in some embodiments, be matched to the sprayed fluid. Therefore, the surface potential can be taken into account during fabrication. Several fluid parameters can be controlled: dielectric constant (e.g. greater than 10), viscosity, volatility, and ability to suspend particles. For example, in some embodiments the surface coatings may be important in controlling surface tension. In some embodiments, it can be advantageous to match the surface tension of the particles to that of the substrate.

Factors leading to spraying of perfect or nearly perfect monolayers of nanoparticles with no chemical linkages to each other or the substrate are described in the following. The fluid used for dispersion of the nanoparticles is configured to encourage the nanoparticles to remain suspended. In some embodiments, the fluid can be at higher pH. For example, a fluid with pH 10 can be used with alumina particles, to ensure the formation of a negatively charged AlO species on the alumina nanoparticle surface. The negative charge on the particles causes them to repel each other, minimizing possible agglomeration. The dispersion fluid, in which the particles are suspended and which is used for spraying or dipping, can contain a surfactant that forms a micellar structure around the nanoparticles, minimizing agglomeration.

The substrate upon which the particles are to be bonded, and the suspension fluid, can also be chosen so as to have a good match. In other words, certain choices for the fluid and the substrate may lead to an increased or decreased capacity to wet the substrate by the fluid. The increased or decreased wetting capacity can improve the formation of a uniform monolayer of particles depending on the affinity of the particle for the substrate as compared to the fluid. The substrate may also be prepared before the particle deposition, to increase or decrease its wettability. For example, in the case where water is used, a glass substrate can be precleaned with an oxygen plasma to remove any surface oil contamination and to create a hydrophilic surface. In some embodiments, instead of a hydrophilic surface, a hydrophobic surface may be more advantageous, for example, applying hexamethyldisilazane (HMDS) or a fluorocarbon layer to discourage wetting.

The fluid containing the particles can also be configured to evaporate relatively quickly once it wets the substrate. Otherwise, as the fluid evaporates, the fluid can carry the nanoparticles along the liquid/air interface as it evaporates, causing the particles to pile up on the surface unless measures are taken to assure the affinity of the nanoparticles for the substrate. In some embodiments, the evaporation rate can be regulated by controlling the substrate temperature.

For example, if the fluid is water, the temperature could vary between 5° C. and 150° C. The evaporation rate can also be regulated by controlling the amount of liquid that is delivered to the surface. Typical flowrates can range from 0.25 ml/min to 2 ml/min. At low temperatures, the particle motion is controlled by ensuring that there are no surface tension gradients in the droplets on the surface. At high temperatures, the droplets "flash evaporate" and no surface mobility of the nanoparticles is permitted. It is also possible to apply the liquid containing the particles over multiple passes over the same area of the substrate, to further regulate the flowrate and evaporation rate.

The nanoparticle concentration and the amount of sonication can also control the application to the surface of the particles dispersed in the fluid. Typical concentrations are 0.5-5 mg/mL. In some embodiments, sonication can be applied to a rotating canister containing a liquid nanoparticle dispersion, to reduce agglomeration of the particles, for example for a duration of 1 hour.

When multiple monolayers of particles are deposited in successive steps, different fluids may be used. In other words, the precursor fluid used to functionalize the substrate may be different from the fluid used to functionalize the first deposited monolayer of particles, prior to depositing the second monolayer of particles. In some embodiments, the fluids used have to be substantially inert to the functional groups. For example, water would not be an acceptable fluid if the functional groups were Al—$CH_3$.

In other embodiments, instead of spray coating, a bath method could be used, where the surface, or part of the surface, is immersed or dipped into the liquid containing the particles. This method allows coating in batches. Different applications may favor one application method rather than the other. In some embodiments, a catalyst may be used to enable bonding of the particles on surfaces. Chemical or physical means for bonding of the particles on the substrate may be employed, e.g. the use of functional groups on the particles and/or substrate. In these embodiments, the catalyst may be able to interact with both functional groups, the group on the particles and the group on the substrate.

In the following, methods to attach particles by spraying instead of bonding are also described. The particles can be attached by a variety of forces, instead of chemical bonds. For example, electrostatic forces and van der Waals forces. Spraying of nanoparticles to achieve monolayer coverage on a surface requires the concerted engineering effort of several components to the spray.

In some embodiments, the nanoparticles can be dispersed uniformly in a fluid that retards the agglomeration of the particles. For an aqueous dispersion, two exemplary ways to prevent or retard agglomeration are described in the following. A first method is to include a surfactant molecule, for example comprising hydrophilic polyethylene oxide. In a micelluar fashion, the surfactant molecules surround the nanoparticles in a way that helps to prevent them from crashing out of the dispersion or attaching to other nanoparticles. A second method is to change the pH of the solution, and thereby impart an electrostatic charge to the surface of the nanoparticles. For example, by adding 0.5 mL of 0.5 M NaOH solution to 250 mL of a commercial aqueous aluminum oxide nanoparticle solution at pH 7, the surface of aluminum oxide nanoparticles becomes as $Al(OH)_2^-$ as the pH of the dispersion rises to 10.5. The effective negative charge on the nanoparticles helps to prevent agglomeration because the particles repel each other electrostatically.

In some embodiments, the nanoparticle dispersion can be stirred and sonicated. For example, the nanoparticle dispersions can be stirred and sonicated for approximately 1 hour before use. For example, the sonication power can be set to 100 W, but with a duty cycle of less that 50% during that hour in order to avoid raising the temperature of the ultrasonic bath too significantly. Temperatures in excess of 40 C can lead to degradation of the surfactant molecules. The stirring and sonication serves two purposes: 1. it homogenizes the mixture of nanoparticles and surfactant (if present) to ensure that all the particles have an opportunity to access the surfactant benefit; 2. the ultrasonic energy breaks up agglomerated particles to help reduce the chances of delivering an oversized particle to the surface to be coated.

In some embodiments, once the particles suspension is sonicated, it can be loaded into a syringe pump that is stirred constantly with a magnetic stir bar to help prevent settling of the particles. The syringe pump then feeds an ultrasonic nozzle with a constant flowrate of the dispersion (e.g. between 0.25 and 5 ml/min) while the nozzle rasters over a part of the surface that is to be coated.

The ideal flowrate of the nanoparticle dispersion is controlled by a number of factors. For example, by taking the preparation steps described above, it can be reasonably concluded that the nanoparticles are not agglomerated when they are delivered to the substrate being coated. However, various forces on the surface can cause the particles to agglomerate and pile up once the particles arrive at the substrate. An important factor is the balance between the rate of evaporation at the edge of a droplet and the evaporation at its center. If the temperature of the substrate is too high, there is a difference in the temperature between the edge of the droplet (in contact with the substrate) and the top surface of the droplet (air only contact). The temperature difference results in a difference in the surface tension which induces a Marangoni flow within the droplet. The flow leads to the particles within the droplet being carried to the edge and being piled up as the droplet dries. In some embodiments, to ensure monolayer or near monolayer coverage, the surface tension difference needs to be minimized, by managing the substrate temperature to be near that of the ambient gas. Thus, for water dispersions, the ideal substrate temperature is close to room temperature, while the temperature should be lower for a particularly volatile solvent like isopropyl alcohol (propan-2-ol, IPA).

It can be noted that an alternative approach is also possible where nanoparticle multilayers can be used to form an effective porous media that can also be used as an etch mask. For example, multilayers, 3 particles deep, made from an erodible material such as $SiO_2$ can be used as a nanotexturing mask for glass. The effective media method leaves holes and packing defects which ultimately translate into nanotextures when the media is eroded. This can make the overall texturing process less sensitive to forming a perfect monolayer. Degree of porosity can be controlled by selecting larger or smaller nanoparticles to form the layer. An exemplary case is 30 nm $SiO_2$ nanoparticles multilayers, 6 layers deep, on glass etched with a fluorocarbon-based plasma. The substrate temperature in this case can be higher (e.g. 75° C. or above) with less penalty than the monolayer deposition method. In addition, mixtures of erodible nanoparticles such as $SiO_2$ and non-erodible nanoparticles such as $Al_2O_3$ can be used in varying ratios. The erodible nanoparticles help to better distribute the $Al_2O_3$ on the surface, governing the ultimate surface textures.

To ease the formation of monolayers, it can be useful to create an inherent affinity between the nanoparticles and the surface that is to be coated. The paragraphs below describe two methods that result in preferentially forming chemical bonds between the nanoparticle and the substrate surface (click-type organic chemistry and ALD-type inorganic chemistry). However, it can be noted that there are other ways that can create a preferential physical only interaction.

Some exemplary examples of physical (not chemical bond) attractions include: 1. creating a charge on the surface by creating a positive charge on the substrate (by ion bombardment to give one, non-limiting, example) and using a pH greater than 7 to cause the nanoparticles to have a negative surface charge. 2. Creating a hydrophilic interaction where the surface and/or the particles are pretreated with a film or an $O_2$ plasma to generate —OH groups, and the hydrophilicity of the surface attracts the first layer particles.

The advantages of creating an attractive force (either chemically or physically) is making spray processes less sensitive to spray parameters, and making dipping processes viable without resorting to Langmuir-Blodgett techniques. Both of these features make a nanoparticle attachment process as described in the present disclosure more robust and easier to integrate into commercial products.

In some embodiments, ALD methods described above can be used, for example, to fabricate tandem solar cells or cells to be used in tandem with other cells. For example, the surface of silicon solar cells can be modified to increase efficiency, by coating them with nanoparticles. For example, the nanoparticles can increase the efficiency of absorption in the UV (ultraviolet) and visible spectrum of silicon cells. The combined efficiency can be increased to 25% or greater. The nanoparticles can also act as scattering centers on the bottom of existing cells to increase the amount of light absorbed by the cells, as the light is scattered towards into the cells.

In other applications, the surfaces modified with nanoparticles can be used in catalysis or battery applications. The methods described herein allow selective 3D loading of nanoparticles on the surface. In other words, the surface can be controlled at the nanoscale level. It should be noted that the surface, in this case, refers to all exposed surfaces that can be reached by the nanoparticles. For example, some materials like zeolites, polymers, or metal-organic frameworks (MOF) have an internal and external surface area. The methods of the present disclosure can refer to all of such surfaces (the entire 3D topology). In some applications, the nanoparticles on the surface can also be used as absorbers for infrared detectors.

The chemical methods described herein (both organic and inorganic) present a significant improvement over DNA-based methods since the bond between the nanoparticles and the substrate is a covalent bond. The surface links to the nanoparticles have improved temperature and chemical stability, and can be considered permanent. The methods described herein also allow the fabrication of hierarchical surfaces, since the nanoparticles can be deposited in several monolayers with a different topography, forming 3D structures that influence the physical and chemical properties of the substrate.

The methods described herein can also be effectively used to apply a single layer of nanoparticles onto curved or other non-uniform surfaces. Multiple monolayers of nanoparticles may also be deposited on curved surfaces, by attaching the nanoparticles to the surface by direct bonding, through chemical functional groups on its surface which will form a strong, chemical bond with the functional groups on the nanoparticle. In the absence of such chemical bond, prior art techniques required activating the materials' surface before coupling the nanoparticles. Surface activation is a process of generating, or producing reactive chemical functional groups typically using harsh chemical or physical techniques. Therefore, the methods described herein are advantageous as they can be applied to a variety of surfaces which would be negatively affected by harsh chemical or physical techniques.

As described above, surfaces can be modified to provide a textured surface that can be patterned or otherwise tailored for a desired application. In some embodiments, one or more surface structures and/or one or more layers may be applied to the substrate surface in order to modify or alter one or more of the substrate surface's physical properties including, but not limited to, wettability, propensity to promote or inhibit adhesion, conductivity, surface charge, propensity to promote or inhibit condensation, evaporation, corrosion, sublimation, reflectivity, emissivity, light filtering (high, low, or bandpass), light absorption (including polarization), and fluid absorption.

As described in the present disclosure, the modified surfaces are designed to provide a combination of modified physical properties to the substrate. In some embodiments, the modified physical properties can be inherent to the underlying material or substrate, because the modified physical property is not the result of a coating but is inherent of the material. In other words, in some embodiments, the structure itself has at least one of the desired properties. For example, nanoparticles are not needed to obtain UV blocking and antifrosting if the structures have dimensions of 200 nm or less, and have hierarchical nanotextures (nano on micro, or nano on nano, e.g. pillars with rough edges). Nanoparticles can be deposited on the UV blocking structure to also add IR blocking. That structure would be inherently UV blocking and anti-frost, but not inherently IR blocking. This fact provides increased durability as well as consistency of the physical properties over time. The enhanced durability provides a greater resistance to physical damage due to abrasion and delamination, which may otherwise occur with coated surfaces. In the following, several exemplary applications and embodiments are described. Although some applications are described with examples, these examples are not meant to be limiting. For example, the following example is described as relevant to aircraft, however it may also be applied to naval vehicles or other fields.

Anti-Frost in Combination with Radio Wave Absorption.

In this embodiment, one or more external surfaces of an airplane, helicopter, drone, or other flying aircraft could be modified to inhibit the formation of ice (by being hydrophobic) and be made to absorb radio waves to prevent detection via radar (e.g. stealth). In this application, the external surfaces can be modified after their fabrication, or the surface-enhancing method can be applied during fabrication of the relevant structural components. For example, the methods as described in the present disclosure may be applied to a wing manufactured by an aeronautical company, or the methods may be integrated in the manufacturing of the wing.

The structures comprising external surfaces (external to the aircraft) could also be modified to improve the aerodynamic or hydrodynamic performance of the craft. For example, the surface of the aircraft can be made from a composite that incorporates a base layer of a material capable of absorbing radio waves. A hydrophobic surface treatment can then be applied by texturing the surface of the composite panel. For example, a composite containing iron nanoparticles can be textured with micro- or nano-sized features (e.g., spikes or holes) to create the anti-frost and radio wave absorbing effect. In various embodiments, different portions of the composite panel may be provided with more radio wave absorption properties and other portions could have greater hydrophobic properties. In another embodiment, the surface of the aircraft can have a hierarchical structure where the characteristic length of the larger structures is designed to absorb radio waves and the length of the smaller structures is designed to be hydrophobic to repel water and ice. An example of the hierarchical dimensions could be millimetre-scale larger features combined with micro- or nano-scale features.

Anti-Frost/Fog in Combination with UV and IR Absorption.

In this embodiment, a car windshield could be fabricated to prevent frost formation on its external surface, as well as to prevent formation of condensation on its internal surface. The windshield may also be made to absorb or scatter UV light from the sun, as well as absorb IR light (e.g. to regulate the temperature within the car in hot weather). For example, a multifunctional surface could comprise a glass windshield textured on the inside or outside to have some structures less than 400 nm in size, and some structures with a size greater than 100 nm. The larger structures would inhibit frost formation while still allowing visible light to pass; the smaller structures would promote UV scattering and/or absorption. This embodiment could also have a coating of semiconductor nanoparticles that have a bandgap to enable IR absorption, while being small enough to avoid scattering visible light. The coating might be applied to a window and then textured to enable antifogging properties while remaining transparent to visible light and opaque to UV light. The coating of nanoparticles can also be applied afterwards.

Anti-Fogging in Combination with UV Absorption, Polarization, Off-Axis Light Rejection, and Anti-Reflection in any Combination.

In this embodiment, a lens (for a goggle, glasses, mask, or other eyewear) is fabricated to have specific nanotextures. The size of the nanotexture enables UV absorption and anti-fogging, while the height enables anti-reflection of visible light, and the shape enables polarization. For example, using non-spherical nanoparticles, such as elliptical nanoparticles, would enable polarization control. To achieve these effects the following conditions need to be achieved: 1) The structures must be large enough to scatter the incoming UV light. For example, the structure could have elements each having a width of 100-300 nm. 2) To achieve antifogging, the structures should be spaced at a distance no greater than the characteristic size of a water droplet at the intended humidity and surface temperature operating conditions for the structures. For example, the spacing may be less than 10 micrometers. 3) To achieve anti-reflection, the nanostructures should have a vertical height such that the effective medium formed by the air and the nanostructures is tailored to ensure an anti-reflection condition. 4) To achieve polarization control and off-axis light rejection, the nanostructures should be anisotropic in one or more of a number of dimensions. For example, the elements forming the structure can be elongated with aspect ratios greater than one, e.g. 1.5. The aspect ratio, for example, could be considered as the ratio between the longitudinal axis and the lateral axis of an elongated shape. The nanostructures may also be tilted so that the path difference for the light in one direction is different than for the other direction. The nanostructures can also be tilted such that the characteristic dimension of the structure (e.g. the size of one of the constituting elements, such as a nanopillar width or height) in the direction of light travel is less than the scattering size (e.g. 400 nm for visible light), and greater than the scattering size (e.g. greater than 400 nm) in a different direction.

Anti-Fogging/Frost in Combination with Broadband Anti-Reflection and Broadband Absorption and Conductivity.

In this embodiment, a series of structures and layers is added to a solar cell to increase its efficiency (i.e., the ability to convert sunlight into electricity). One or more layers of nanoparticles with a variety of bandgaps can be added to the top surface of a solar cell to increase the range of light absorption. This allows the solar cell to capture a greater percentage of light from the sun because a broader range of wavelengths may be absorbed by the solar cell. To facilitate the collection of the electrons generated by light absorption in these layers, the links between nanoparticles or between the nanoparticles and the substrate (or the surrounding media) can be made conductive to enable energy to be collected by the solar cell substrate. Layers can also be added to the top of the nanoparticle absorber layers, to inhibit frost formation or dust collection on the surface of the solar cell, and therefore improve collection efficiency. In addition, one or more layers can be designed to emit radiation in the mid-long wavelength range of the infrared band (around 8 micrometers, e.g. in the 7.5-8.5 micrometers range) where there is an atmospheric wavelength window to space. This emission can be used to cool the solar cell to improve efficiency, even in bright sunlight, due to the emission of light into the cold, darkness of space. In other words, the modified layers added to the solar cells can be designed to emit in the infrared band to cool off the solar cell, by radiating heat into space. In other embodiments, the bottom of the solar cell can be tailored to promote scattering of the sunlight back towards the absorbing regions of the solar cell. In some embodiments, the bottom of the solar cell can be modified to include upconverting nanoparticles to convert longer wavelength photons to shorter wavelength photons to increase their collection. The energy from these shorter wavelength photons can be collected in a location near to their conversion, or can be reflected back into the main portion of the cell for absorption in a more ideal location.

In the fabrication of a single monolayer of nanoparticles, multiple monolayers of nanoparticles, or more complex structures modifying the properties of a surface, several parameters can be controlled to achieve the desired characteristics. For example, the nanoparticle size and composition can be controlled to achieve the desired functionality, such as anti-fogging, visible light transmission, UV blocking, and etch resistance. The nanoparticles aggregation is also a parameter that can be controlled. For example, during spraying the electrostatic charge on the particles or the ultrasonic energy applied to the spraying nozzle can affect the aggregation between nanoparticles and cause uneven deposition. Controlling the electrostatic and ultrasonic energy input charge can allow controlled spreading of the nanoparticles onto the substrate. For example, one target could be to have less than 3 nanoparticles agglomerated. In some embodiments, surface coatings could be sprayed on the substrate or onto the nanoparticles prior to the nanoparticles being applied. The fluid parameters can also be controlled to optimize spraying. For example, the viscosity, volatility and dielectric constant, as well as the ability of the liquid to suspend particles, are characteristic to be considered in the choice of the liquid. For example, the dielectric constant of the liquid, in some embodiments, is higher than 10. Another parameter to be considered is the surface tension of the surface to be sprayed. In some embodiments, the surface tension is matched to the sprayed fluid. The surface potential of the substrate may also be considered.

Figure 8:
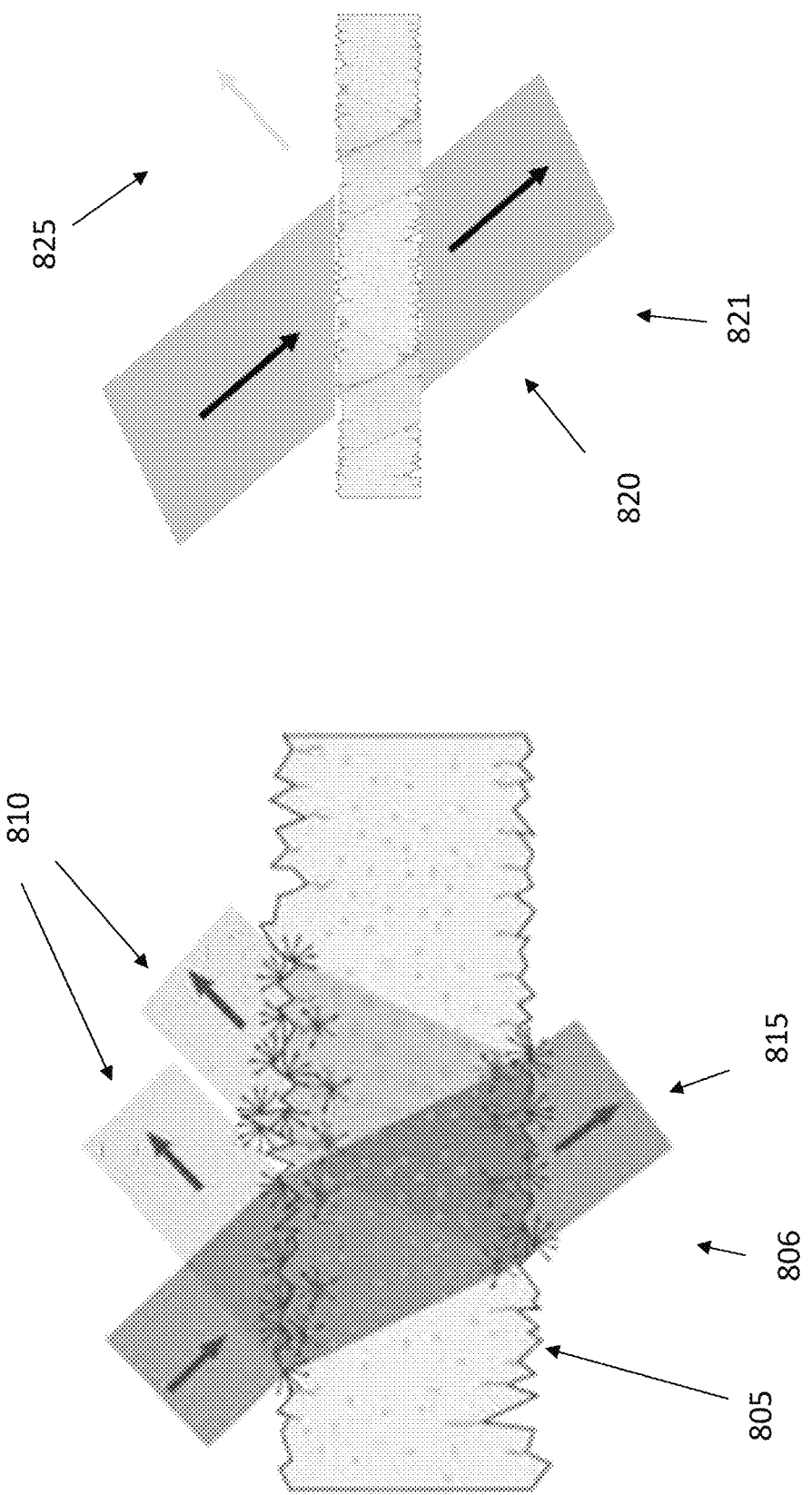
FIG. 8 illustrates an exemplary surface that is transparent to visible light while blocking UV light.
Figure 9:
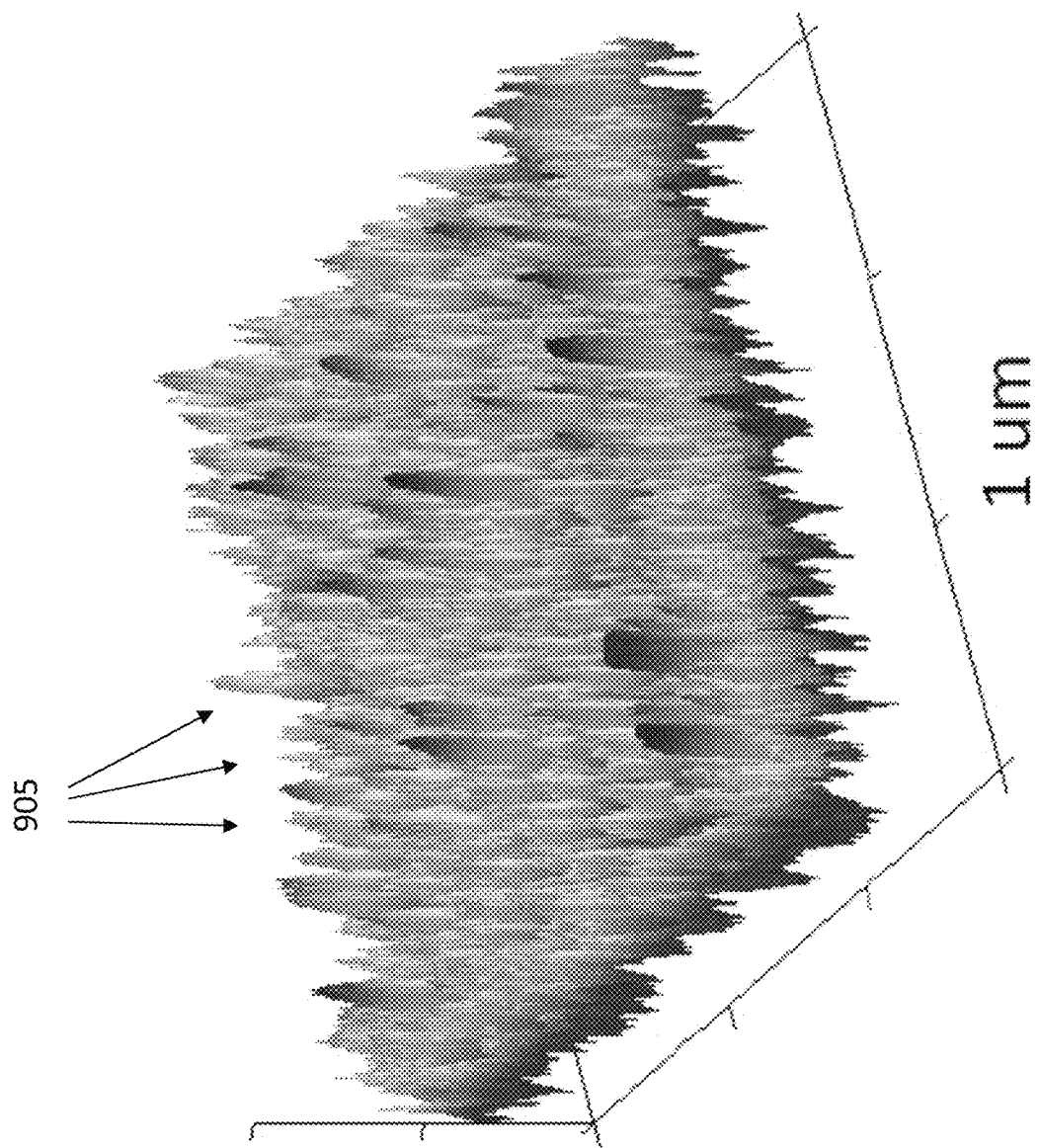
FIG. 9 illustrates an exemplary surface for UV blocking and visible light transmission.

FIG. 8 illustrates an exemplary surface that is substantially transparent to visible light while substantially blocking UV light. UV light has shorter wavelengths compared to visible light. The same surface, having a nanostructured surface, will appear differently to incident UV light compared to incident visible light. In this example, the surface (805) comprises a non-uniform jagged nanostructure, which could be described as rough when viewed in a magnified way (806). The UV light will undergo significant scattering, and the transmitted light (815) will have an overall total intensity that is lower than the light that is reflected (810). For the case of visible light (821), however, the same structure will appear to have a smaller size, or roughness, relatively to the case for UV light. In other words, the nanostructures will appear small, for the case of visible light. The decreased roughness (relative to the wavelength of the incident light), will cause decreased scattering, and the total transmitted intensity of light (820) will be higher than the intensity of light reflected (825). Due to the difference in wavelength, the surface will appear rough to UV light and smooth to visible light, causing a difference in scattering.

FIG. 9 illustrates an exemplary surface for UV blocking and visible light transmission, as described above with regard to FIG. 8. In this example, the surface has comprises a non-uniform jagged nanostructure with dimensions between 100 and 200 nm. This structure could be used also for antifrost applications. While a structure with dimensions in the 40 nm range could be used for antifrost applications while being transparent to visible light, increasing the dimensions to 100-200 nm also allows UV blocking. In fact, a structure with dimensions in the 40 nm range allows antifogging if the size of the droplets is greater than 40 nm, as in this case the droplets are discouraged from forming or attaching to the surface. If the structure has dimensions in the 100-200 nm range, the size of the droplets is still larger, therefore the antifogging characteristic is preserved, while the added functionality of UV blocking is added.

In some embodiments, surfaces can be patterned to define textured and non-textured regions that, in one embodiment, would result in fogging and antifogging regions. For example, the nanoparticles can be sprayed in a controlled way. The spraying pattern can be regulated to have the shape of a fine-tipped pen. The cross-section of the spray pattern would be the same as the smallest feature of a region to be patterned. For example, if the regions having different properties (e.g. fogging vs antifogging) are x micrometers wide, the cross-section of the sprayed nanoparticle suspension would also be x micrometers wide. Due to the spatial selectivity of the spray, only the regions that are coated will have antifogging properties. In some embodiments, the spray coater can achieve about 1 micron spot size. In some embodiments, the spray can be achieved with an inkjet.

In other embodiments, a shadow mask can be used to block certain regions of a surface from being sprayed on. After spraying and removal of the shadow mask, the blocked regions of the surface, if placed in the corresponding environmental conditions, will fog, while the unblocked regions will not fog. A possible application of the above methods is to manufacture logos on different surfaces. For example, an exemplary application would be hotel bathroom mirrors that do not fog, except for a small region of the mirror which will fog to reveal the hotel brand logo. In other examples, other types of text could be designed on surfaces.

In some embodiments, a logo can be fabricated by creating a hole in a sheet of material, such as a sheet of metal. The hole can be shaped to form a text, or an image, for example a brand logo. Subsequently, a nanoparticle mask and etching can be applied to another substrate through the sheet of metal by spray coating. If the sheet of metal is used to fabricate a mirror, the nanoparticles will coat the mirror in the shape of the brand logo. This limited surface will have antifogging properties, unlike the remaining portion of the surface which will fog if the humidity is high enough. The reverse case, where only the logo or desired pattern fogs and the rest does not, is also an option depending on the shape of the hole(s) in the metal and subsequent processing steps.

In some embodiments, the structures fabricated according to the present disclosure are wear-tolerant structures that expose new nanotextures as the material wears down. The structures are designed and fabricated to keep their functionality intact once the external layers (in contact with the environment) are gradually worn down, progressively exposing inner layers. For example, the structures can comprise multiple layers (e.g. tall structures), but have hierarchy so that, as the top portion of the structure is removed, the middle portion and the base portion of the structure continue to have antifogging textures available.

In some embodiments, the fabrication of hierarchical surfaces allows the realization of surfaces with different properties, such as a surface having both UV protection and anti-fogging capabilities. For example, different layers each having a different number of particles may be used, or each having differently sized particles. In these embodiments, the size of the structure allows visible light to be transmitted through the surface, while blocking UV light. The particles could be positioned close enough to control hydrophobicity of the structure, or allow anti-fogging effects. In some embodiments, instead of spherical particles, elongated particles may be used for polarization control. For example, rods or ellipsoids may be used.

In some embodiments, anti-reflection can be achieved by increasing the aspect ratio of the structure. For example, tall structures can be used for anti-reflection. The maximum width of each element in the structure will control the transparency to specific wavelengths. For example, referring to FIG. 9, each of the peaks (905) will have a height and maximum width. The peaks may represent a jagged structure, or, in other embodiments, the structure may be formed by nanopillars, micropillars, or by structured layers of particles. For example, particles could be arranged to form pillars. The height of these peaks can control the reflectivity of the surface. Therefore, having a structure with higher peaks can give anti-reflective properties to the surface. The width of the peaks (e.g. the width of the nanopillars) can control the transparency to light at certain wavelengths. The geometrical dimension which controls the transmission of the light is the maximum width of the elements forming the structure, in the direction of the incident light. For example, if the maximum width is 100-200 nm, UV light can be effectively blocked, while visible light is transmitted.

In some embodiments, a surface can be modified to have antireflective or highly reflective properties according to the concepts described in the following.

In some embodiments, a surface is textured in a way so as to increase or decrease the reflectivity of light incident upon the surface as compared to an untextured surface. In these examples, the characteristic lateral dimensions of the surface texture are smaller than the wavelength of the light. The surface texture may comprise a number of elements, for example nanoparticles, or nanoparticle groups, nanopillars, nanorods, irregular jagged peaks, uniform triangular structures, or other types of structures. The lateral directions of the elements that make up the overall surface texture can be defined as in the plane of the surface, for example as the width of each nanopillar, or the average width of the nanopillars if the pillars are not uniform in width.

The depth of the texture normal to the surface can be designed to modify the refractive index of the surface. For example, the height of pillars will control the refractive index of the surface texture. The depth of the structure on the surface causes constructive or destructive interference of the light at a specified wavelength, or range of wavelengths. As known to the person of ordinary skill in the art, electromagnetic radiation will undergo reflection and transmission at each interface between materials having a different index of refraction. In the right conditions, such as in a structure having dimensions of the order of nanometers or micrometers, the electromagnetic radiation will undergo interference, which can be constructive or destructive. This effect can be controlled by choosing the thickness of each layer accordingly, depending on whether constructive or destructive interference is desired at that specific wavelength. In embodiments where the textured surface is manufactured using an absorbing material, the modification of surface reflectivity may also increase or decrease the absorptivity at a specified wavelength or range of wavelengths of incident light, as compared to an untextured surface. In other embodiments where the textured surface is manufactured using a transparent material, the modification of the surface reflectivity may increase or decrease the transmissivity at a specific wavelength or range of wavelengths of incident light, as compared to an untextured surface.

The polarization properties of a surface can also be controlled by designing the surface structure. In some embodiments, a surface is textured in a such a way that the reflection, transmission, or absorption of light incident on the surface is dependent on the polarization of the light incident upon the surface. For example, light reflected from the environment may have a preferred polarization. A surface can respond to this polarization to decrease reflection; for example, this effect can be used in sunglasses. In these embodiments, the characteristic lateral dimensions of the surface texture are smaller than the wavelength of incident light. In these embodiments, the lateral directions are defined as those in the plane of the surface, e.g. the length of beams formed with a longitudinal axis parallel to the surface. The surface, in some embodiments, can be manufactured using a material with dichroic or birefringent properties. In some embodiments, the surface can be manufactured using a material with dichroic or birefringent properties that arise from the modification of a single material or the combination of materials. In some embodiments, the surface can be manufactured using plastic synthesized from iodine-doped polyvinyl alcohol. In other embodiments, the surface can be manufactured using a material with dichroic or birefringent properties due to the inherent atomic structure of the material.

In some embodiments, a surface can be textured in a such a way that the absorption of light incident on the surface is dependent on the orientation of the electric field of the light radiation. The surface can therefore acquire polarization effects. In these embodiments, the surface can be manufactured using a material with an absorbing layer of finite thickness on top of a material with dissimilar optical properties. In these embodiments the surface texture extends to a depth normal to the surface without discontinuities in the absorbing layer. In these embodiments the structure is asymmetric in the direction parallel to the electric field of the incident light (incident electromagnetic radiation), relative to the direction perpendicular to the electric field (in the plane of the surface upon which the electromagnetic radiation is irradiated). Due to the asymmetry, radiation with an electric field parallel to the direction where the elements of the structure are elongated is preferentially absorbed, compared to radiation with an electric field perpendicular to the elongated axis. The overall effect is that the structure has polarizing properties. The elongated structure can be realized in different ways. For example, elongated ellipsoidal particles or nanorods could be used, if the longitudinal axis of each particle or rod is aligned in a common, parallel direction.

It is possible to understand the polarization effect by considering an array of conductive wires spaced apart and parallel to each other, as illustrated in FIG. 25. FIG. 25 illustrates exemplary wires with a width (for wires with a rectangular cross section) or diameter (for wires with a circular cross section) of 50 nm, and spacing of 250 nm, for an incident radiation at 500 nm. The spacing is therefore roughly comparable to (or slightly smaller than) the incident wavelength, while the width is much smaller than the wavelength. With an incident wave having the electric field oriented in plane as in (2015) (in the plane of the figure), and the corresponding magnetic field as (2510), the radiation will be preferentially absorbed with the electric field in direction (2015), parallel to the longitudinal axis of the wires (2505), relative to radiation with an electric field in direction (2510). Therefore, a surface comprising an array of conductive wires is polarization-sensitive.

A similar structure could be realized by spray coating (or dipping) elongated particles or nanorods on a surface, or by etching beams on a surface. For example, orientation during spray coating or dipping could be carried out under an applied electric, magnetic or both electric and magnetic field. If the elongated particles are electrically polarized, or are sensitive to the magnetic field, the particles can align in a parallel direction during deposition. For example, the present disclosure described, above, how using inorganic precursors allows stable bonding of particles on a surface. If the particles are elongated, the coating carried out under a bias field could allow the creation of polarization-sensitive surfaces, alone or in combination with other surface modifications such as discussed above (UV blocking, antifogging, etc).

In some embodiments, to create polarization-sensitive surfaces, the lateral spacing between discontinuities is smaller in the direction perpendicular to the electric field compared with the spacing between discontinuities in the direction parallel to the electric field of the incident electromagnetic wave. In some embodiments, the textured surface is created by depositing particles upon the untextured absorbing layer. In these examples, the particles have a characteristic axis. Along this characteristic axis, the particles are at least twice as long as compared to the dimensions of the particle along the axes perpendicular to the characteristic axis.

The particles can be preferentially aligned in a specific lateral direction, and in some embodiments the particles are used as a mask to transfer a pattern into the underlying surface. The resulting textured surface results in absorption of light incident on the surface that is dependent on the polarization of the light. In some embodiments, the elongated particles possess an electric or magnetic polarity such that the particles can be aligned upon the untextured surface using an externally applied electric or magnetic field. In some other embodiments, the elongated particles possess an electric or magnetic polarity such that the particles can be aligned upon the untextured surface through electromagnetic interactions with one another. In other embodiments, the elongated particles are attached to other molecules such that the particles can be arranged upon the untextured surface through chemical reactions between the molecules. In some embodiments, the elongated particles are attached to deoxyribonucleic acid (DNA) molecules such that the particles can be arranged upon the untextured surface through DNA self-assembly.

In other embodiments, the elongated particles are applied to the untextured surface using a process that imparts velocity to the particles along a specific lateral direction, thereby causing the particles to align in such a way that their longest dimension is oriented in the same direction. In other embodiments, the elongated particles are applied to the untextured surface, which is subsequently stretched in a specific lateral direction, thereby causing the particles to align such that their longest dimension is oriented in the same direction. In some embodiments, the elongated particles are arranged on the untextured surface through chemical or electromagnetic interactions with features already patterned on the surface. In some embodiments, elongated particles will have a longitudinal length comparable to the incident wavelength, and a width (in-plane) smaller than the incident wavelength. FIG. 25 illustrates an example of elongated particles (2520) aligned along their polarity axis to form a structure functionally equivalent to the wires (2505).

In some embodiments, a surface can be textured in a way so as to limit the angles over which light is transmitted or reflected relative to the surface. For example, such surfaces can be used as privacy screens to limit viewing of a computer screen from certain angles. The depth of the texture normal to the surface, in these embodiments, is greater than the wavelength of the light. For example, the height of nanopillars or nanobeams, if greater than the wavelength of incident light, will limit reflection at certain angles. For example, reflection at angles greater than a certain value will be limited, and therefore only a viewer substantially facing the front of a screen will be able to discern details on the screen. In some embodiments, the voids within the textured region (e.g. the empty space between nanopillars) are partially or completely infilled with a material of dissimilar refractive index. In this way, the textured region is mechanically strengthened by the infilled material. In some embodiments, the textured region is infilled with a solution-based polymer that is subsequently cured to form a solid matrix. Structures having high aspect ratio pillars can be understood to work as an array of vertical fiber optic. Internal reflection of fiber optic limits their emission to a cone, when exiting the fiber optic. Similarly, it can be understood that light from a specific angle will be able to enter the top end of the pillars. In some embodiments, light exiting the structure through the pillars can act in a similar way as an array of parallel fiber optics. Either way, the reflection or transmission of light at specific angles can be controlled by design. In some embodiments, pillars with a high aspect ratio can control the reflectivity of a surface. Additional properties can be controlled, according to the principles described in the present disclosure. For example, if the width of each pillar is about 100-200 nm, the structure can block UV light while being transparent to visible light.

Figure 26:
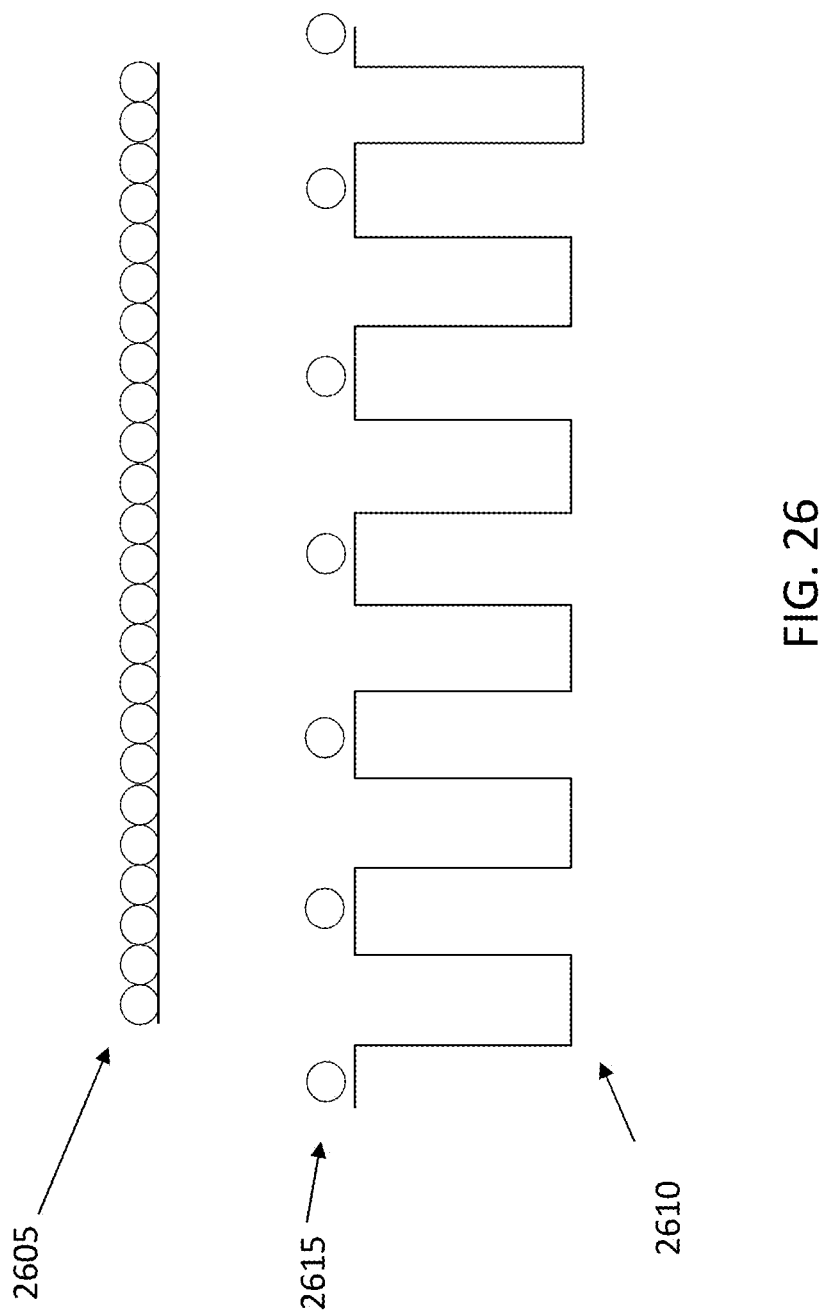
FIG. 26 illustrates an exemplary monolayer of microspheres and a nanoparticle etching mask.

In the following, several examples of modifications of surface properties will be illustrated with reference to FIGS. 26-30. For example, FIG. 26 illustrates an exemplary monolayer of microspheres (2605) deposited on a surface with the any of the methods described above with reference to FIGS. 1-7. FIG. 26 also illustrates an exemplary method using nanoparticles or microspheres as an etching mask. The particles (2615) can be deposited in a desired pattern, for example in parallel rows or dashed parallel lines. An etching step is subsequently undertaken, by an etchant that can etch the substrate without etching the particles (or at least with a significant difference in etching rate for the two materials). As a result, the regions of the substrate not covered by the particles are etched (2610), forming, for example, parallel beams (for parallel rows of particles) or nanopillars (for dashed parallel lines of particles) on the substrate. The above etching process can therefore be considered anisotropic. Subsequently, the particles can be removed, or left on the surface, depending on the application. For example, FIG. 26 shows single particles on each beam, however a number of regions with one or more monolayers of particles could also be deposited instead. Therefore, the surface not attacked by the etchant could have surface properties modified by the particle's structure, as described above in the present disclosure. The etched surface may also be subsequently processed, for example by adding additional nanoparticle structures to further modify the physical or chemical properties of the substrate.

Figure 27:
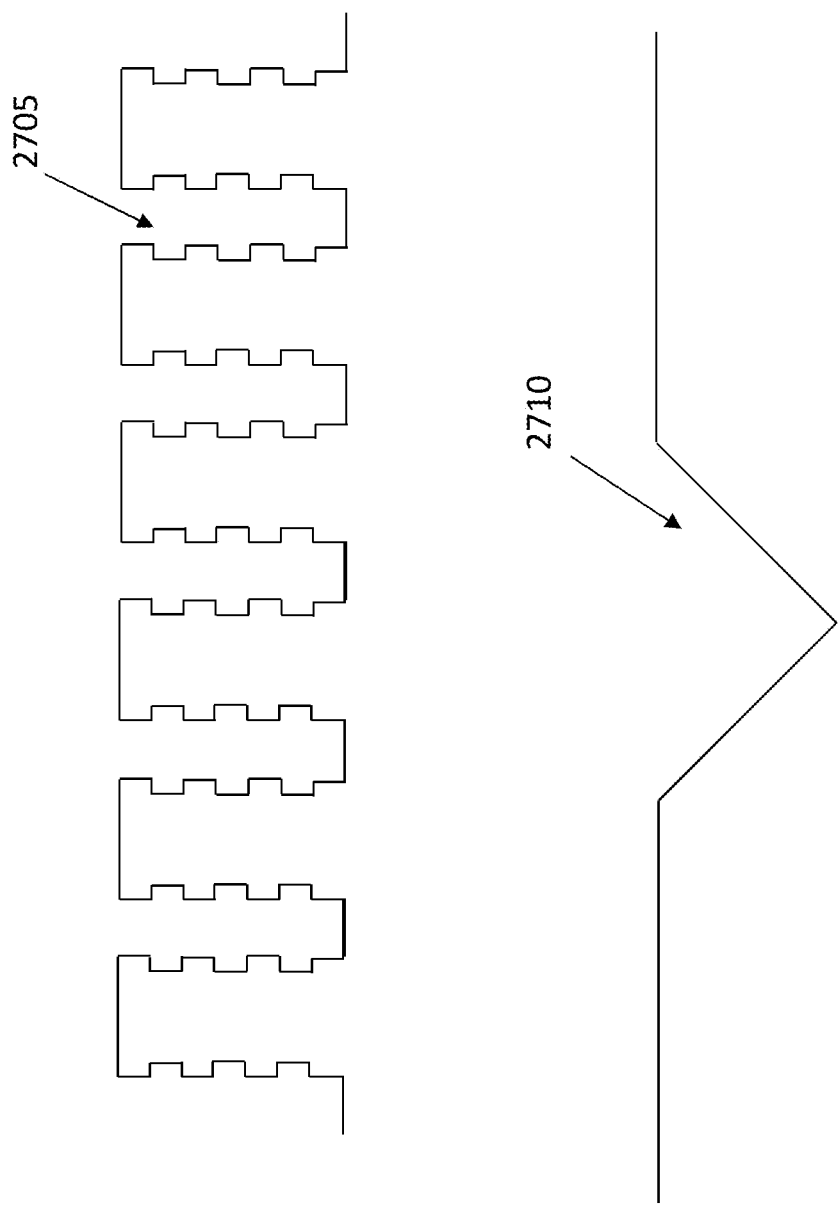
FIGS. 27-28 illustrate exemplary hierarchical structures.
Figure 28:
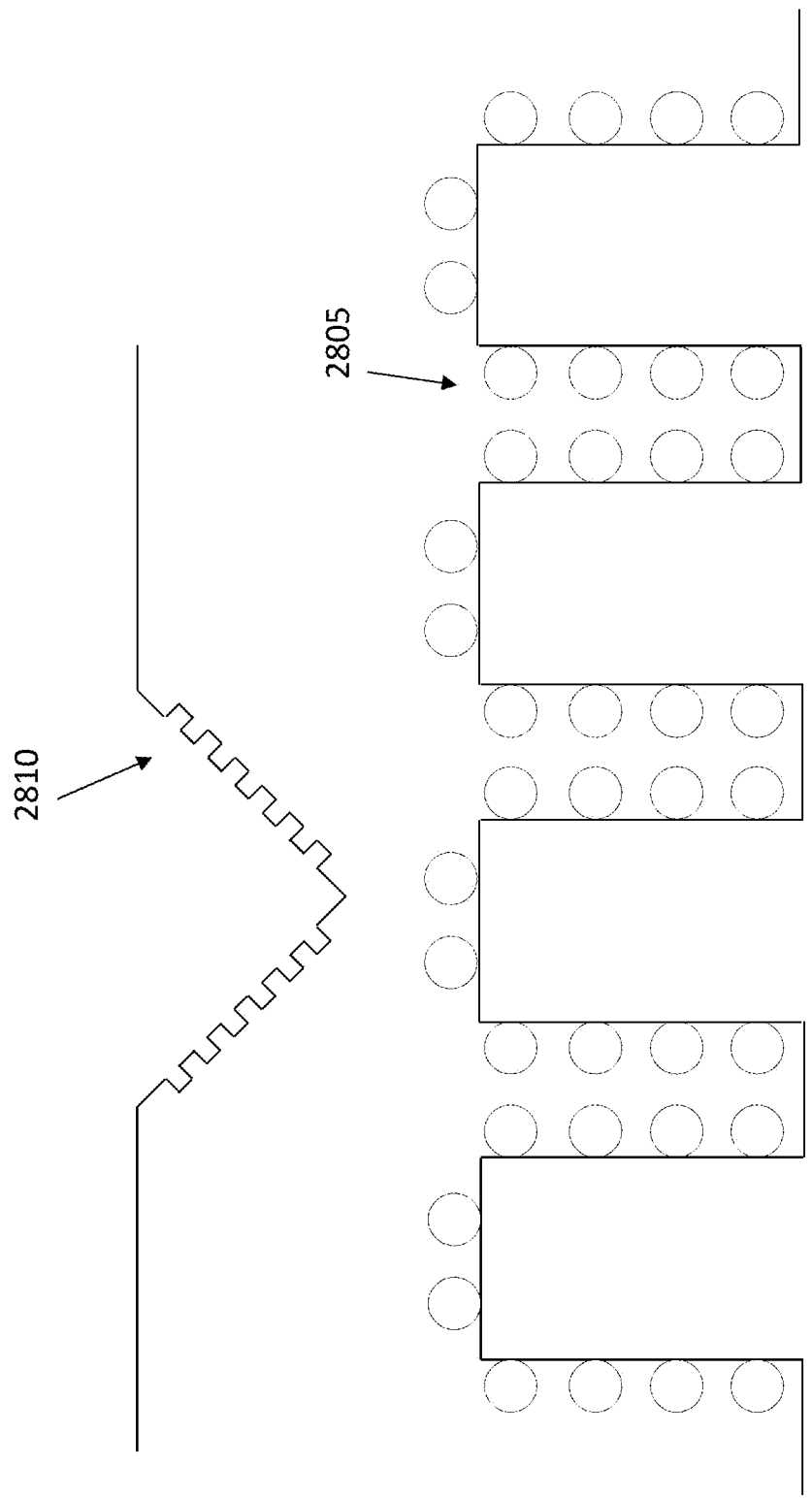

For example, additional particles may be deposited on the surface of the beams or pillars, within the spacing, as illustrated in FIG. 28. In some embodiments, a spacing can be left between particles deposited laterally on the beams or pillars. For example, the spacing could be larger than twice the diameter of a particle, but could also be smaller or larger. These particles can be used to modify the surface properties. In some embodiments, the particles can also be used as an etchant mask as well, to create additional structures on the sides of the pillars, such as illustrated, for example, in FIG. 27, (2705). In some embodiments, several properties of the surface can be controlled at once. For example, the height of the beams or pillars in FIG. 27, as well as the spacing, could control the transparency to specific wavelengths, the polarization sensitivity, and also the reflectivity at specific angles. For example, high aspect ratio structures could control the reflectivity, while the spacing between elements of the structure, as well as the height and width of the elements of the structure, could control polarization sensitivity and transparency at specific wavelengths (e.g. UV blocking).

FIG. 27 illustrates an exemplary groove or pyramid (2710) which could be used for radar reflection, for example to fabricate radar-stealth surfaces. For example, the grooves could have lateral or depth dimensions of the order of wavelengths used in radars. An array of grooves could control radar reflectivity of a surface. The grooves could also be further modified, with the methods described above in the present disclosure, to add additional properties such as, for example, antifogging or antifrosting. For example, FIG. 28 illustrates a groove or pyramid with an additional structure added at a smaller scale. For example, beams or pillars (2810) could be etched by using a particle mask as in FIG. 26 (2610) or FIG. 27 (2705). In some embodiments, the grooves or pyramids can have dimensions in the millimeter range, while the additional textures as (2810) could be in the nanometer range. A possible application could be to fabricate surfaces (e.g. airplane wings) resistant to frost and with lower radar signatures. In some embodiments, the gap between particles deposited in the recesses of the structure in FIG. 28 is substantially greater than double the diameter of the particles. In FIG. 27, the shape could represent a pyramid.

Referring to FIGS. 27 and 28, an inherently antifrost structural material that also has low visibility to radar can be realized, for example, if the roughness of the surface in (2710) or (2810) is 50 nm to 1 micrometer. In some embodiments, the surface may comprise an array of small structures such as (2705). The lateral dimension of each inverted pyramid (2710) or grooves can be of the order of one millimeter.

Figure 29:
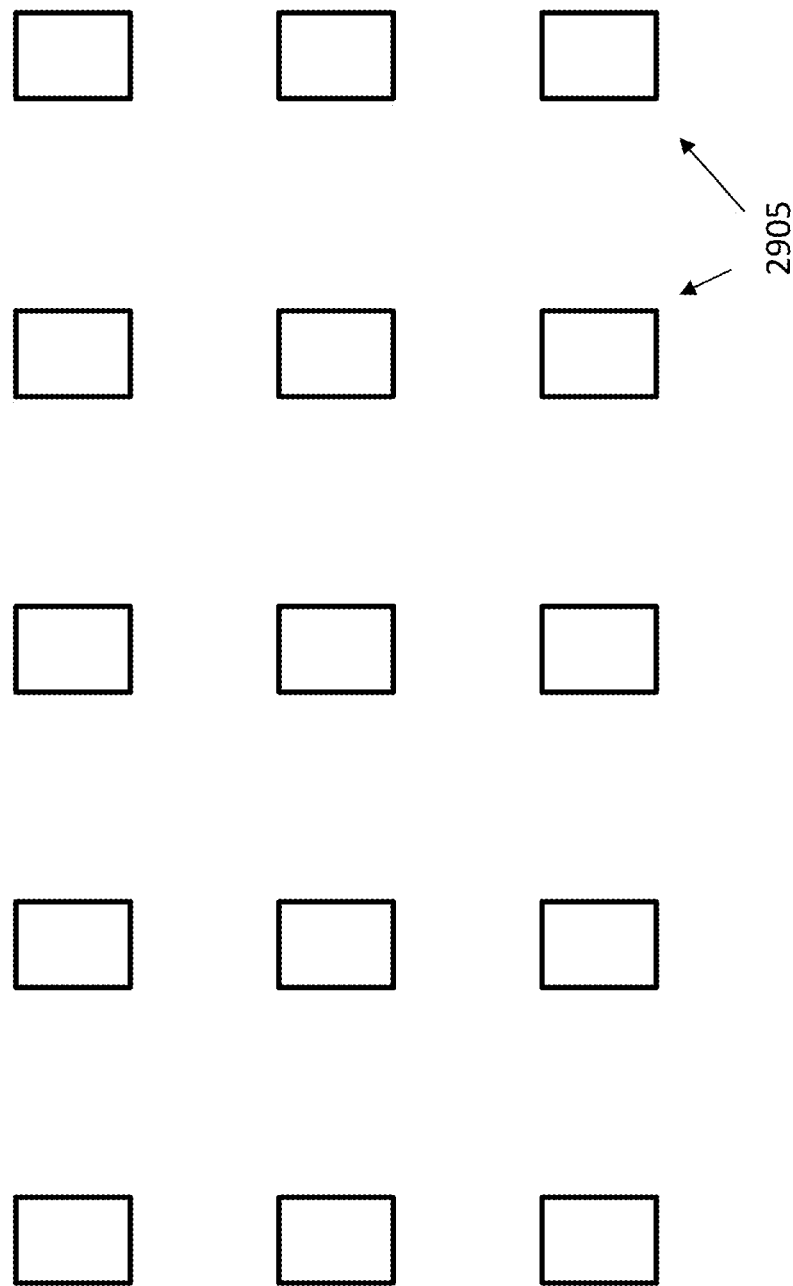
FIGS. 29-30 illustrate an exemplary array of structures.
Figure 30:
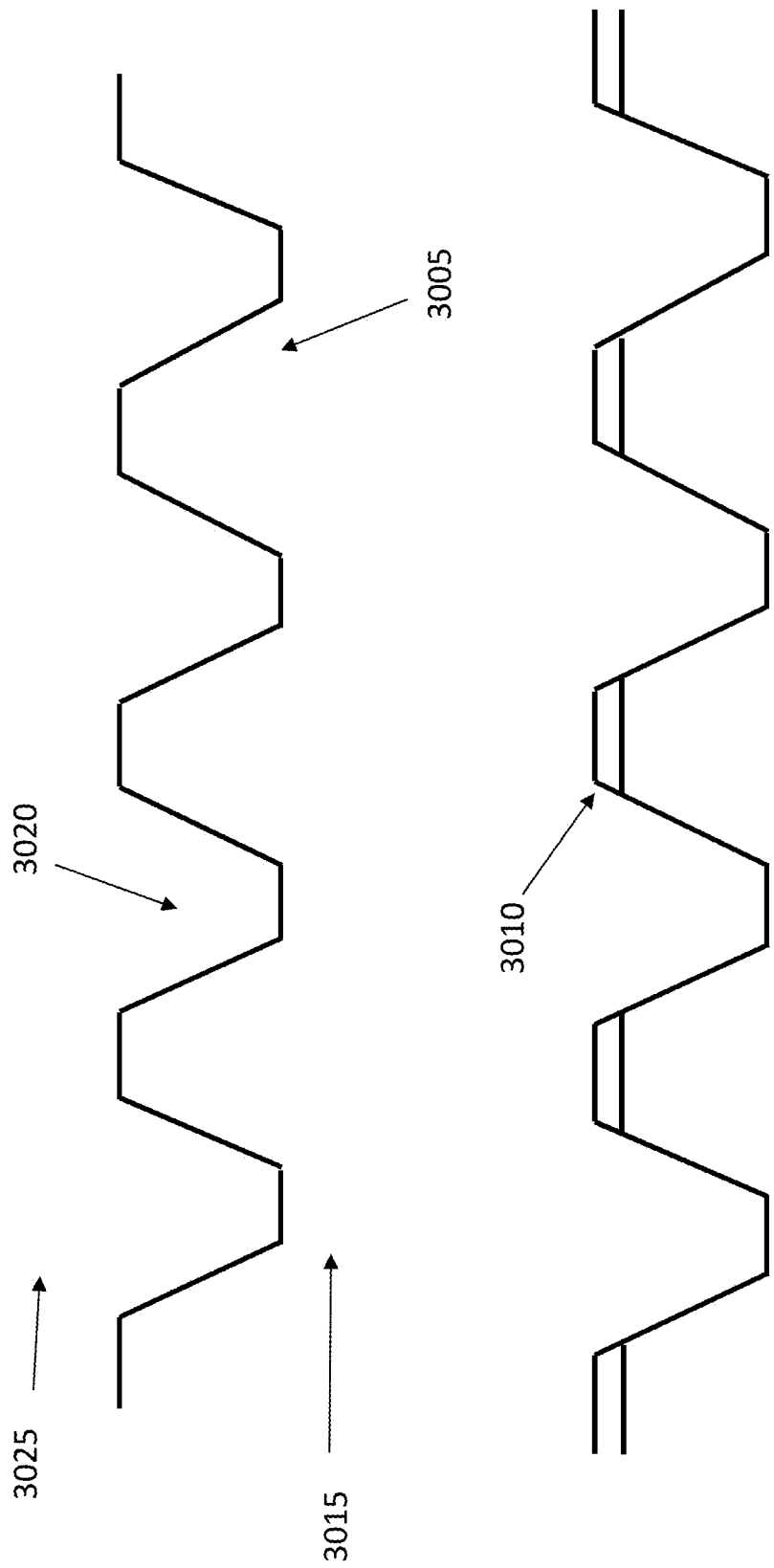

FIGS. 29-30 illustrate an exemplary array of structures. For example, an array of nanopillars (2905) or rectangular cross-section structures viewed from above in FIG. 29 can be used to control surface properties. FIG. 30 illustrates a side view of structures on a surface, with the structures having sloped side surfaces (3005). In some embodiments, additional materials may be present on top (3010). The structures of FIG. 30 can be fabricated, for example, by masking with particles as illustrated in FIG. 26. Particles may also be coated on the structures of FIG. 30 to further modify the properties of the surface.

In FIG. 30, it is possible to distinguish three different zones: a first zone (3015) with a substrate having a refractive index $n_1$, a second zone (e.g. air) having a refractive index $n_2$ (3025) and a third zone with a third (effective) refractive index $n_1(z)$ (3020). The third zone can comprise regions having both the first and second refractive index. The effective refractive index of the third zone, for the case where the medium of the second zone is present between spacings of elements of the third zone (e.g. air between beams) can be calculated as the geometric average of the refractive indexes of the first and second zones, as understood by the person of ordinary skill in the art. The structures that modify the properties of a surface with regard to incident light (e.g. transparency) can be fabricated in the third zone. In some embodiments, the thickness, depth or height of the third zone is equal to ¼ of the ratio between the incident wavelength and the effective refractive index of the third zone. The height, spacing and thickness of the elements in FIG. 30 can be controlled to regulate how the surface responds to electromagnetic waves. For example, the spacing between elements, if less than one half of the incident wavelength, can block the incident wavelength.

For example, a structure as in FIG. 30 can block UV light and be transparent to visible light if the spacing between elements is about 250 nm. This spacing will block UV light, as UV light has a wavelength comparable to the spacing (e.g. 40-400 nm), while visible light at a wavelength of 500 nm or greater will be transmitted through the surface. The structure of FIG. 30, if designed to block UV and be transparent to visible light, could additionally be modified to have other properties as well, such as antifogging or antireflection. One way in which the thickness of the structure influences the transparency of incident electromagnetic waves is due to the reflections at each boundary—e.g. the boundary between the material and air. Reflections from different boundaries can interfere in a constructive or destructive way. If the third zone comprising a structure is considered as having an effective (e.g. geometric average) refractive index and thickness, constructive or destructive interference at boundaries between the first and third zones and between the third and second zones can be considered to control transparency of the structure to incident electromagnetic waves.

With reference to FIG. 26, a structure could comprise InGaAs particles (2615) of a specific diameter, to absorb infrared light. The diameter of the particles would control the width of the elements in the structure. The depth (height) of the structure could control the reflection properties of the surface. The spacing between elements could control the antifogging properties of the surface. In some embodiments, the height of the structure could be about 400 nm.

FIG. 36 illustrates an exemplary embodiment of a multifunctional structure (3605). In this example, the structure comprises a repeating array of pillars, each pillar having recesses, similarly to FIG. 27. In some embodiments, the recesses may be fabricated by differential etching using particles as an etching mask. In this example, the resulting structure is covered by a monolayer of particles. A lateral dimension (3610) of the pillars can be indicated as x, the height (3615) of the pillars can be indicated by y, and the other lateral dimension (3620) can be indicated as z. These parameters can be varied to control different properties of the surface. Additionally, other parameters such as material choice or spacing between pillars may also be specified. For example, if x is between 50 nm and 250 nm, it will enable UV blocking; if y is about one quarter of the incident wavelength, e.g. y=150 nm, it will enable anti-reflection; if z is greater than x, for example if z is at least three times x, the surface will be polarizing. Additionally, if the particles forming the monolayer have a diameter less than 200 nm and are made of an absorbing material, the particles can provide IR absorption. For example, the particles may be made of Si, GaAs, or similar absorbing materials. If x and z are less than 400 nm, the surface will be transparent to visible light. If y is greater than x, for example greater by at least 5 times (or 3 times), the surface will provide angle selectivity (e.g. for privacy screen protectors). In some embodiments, x and z can be substantially equal in value.

In view of the above, in the example of FIG. 36, a UV blocking, antireflection, IR absorbing surface transparent to visible light could be realized with x=z=200 nm, y=150 nm, and with Si particles having a diameter of 50 nm.

Figure 31:
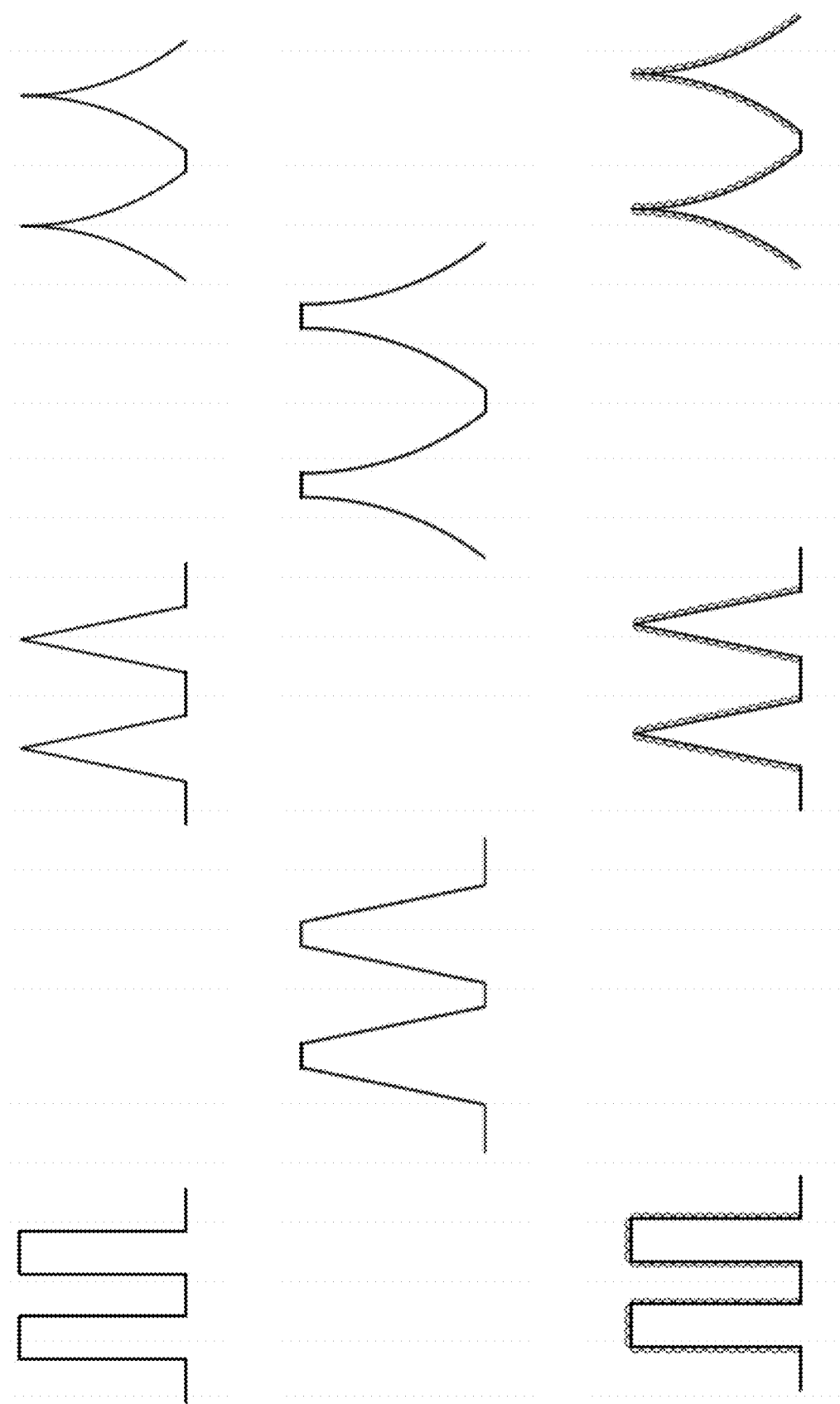
FIG. 31 illustrates exemplary elements that could be included in a structure.

FIG. 31 illustrates exemplary elements that could be included in a structure, as described in U.S. Pat. No. 8,691,104, the disclosure of which is incorporated herein by reference in its entirety. In some embodiments, controlling the hydrophobicity of a surface, in addition to other properties as described above, can be carried out as described in the following, and as described in U.S. Pat. No. 8,691,104. In some embodiments, the structures projected from a surface as in FIG. 31 can also be realized in a negative space version. For example, in FIG. 31, it is also possible to read the shapes as grooves or recesses in a material, if inverting the orientation of the shapes by 180° degrees in the plane of the figure. These shapes can be considered as the reentrant or inverted version of the shapes considered as projecting from a surface. Structures having these shapes can be additively or subtractively combined in any weighting to produce other desired shapes.

For example, for a fixed macroscopic surface area, a microscopic surface area can vary and can be controlled by nanotexturing the surface, for example, by providing nanostructures on the surface, thus providing an increased microscopic surface area. In particular, according to the present disclosure, a higher microscopic surface area can be achieved by a higher number of nanostructures per unit area thus obtaining a higher microscopic surface area over a fixed macroscopic surface area. The size of the textures that affect the properties of a liquid droplet can also be micron-sized and therefore the size of the nanotextures referred to in this disclosure should not be considered to be limited to less than 1000 nm in size.

In particular, in some embodiments by controlling the contact angle that a liquid makes with a surface, wettability of the surface can be controlled. In some embodiments, the higher the specific surface area of a surface, the greater an effect on a contact angle of a fluid with the surface. For example, for a particularly high wettability (e.g. hydrophilic) surface having a low contact angle with a fluid, providing the surface with nanostructures, thus providing the surface with an increased specific surface area with respect to the surface without nanostructures, can provide the surface with super high wettability (e.g. becoming superhydrophilic), having a lower contact angle with the fluid.

The term "specific surface area" as used herein refers to a total surface area per unit mass, cross-sectional area or another defined area. For example, two surfaces can have different specific surface areas over a same macroscopic surface area, for example, by providing a surface with roughness. A first surface having a roughness which is higher than a second surface is expected to have a higher specific surface area than the second surface.

With reference to nanostructural features, the term "height" as used herein refers to a height of a nanostructure from its base at a surface to its distal end.

With reference to nanostructural features, the term "distance" as used herein refers to a distance between nanopillars, the distance can be measured from the center of the base of one nanostructure to the center of the base of another nanostructure; or from the center of the distal end of one nanostructure to the center of the distal end of another nanostructure.

With reference to nanostructural features, the term "diameter" as used herein refers to a largest distance across the base of pillar. The term "diameter" is interchangeably with the term "width" with reference to nanostructural features as the nanostructure bases need not be circular, but can also be squares rectangles or irregularly shaped.

The term "transparent" as used herein refers to an ability of light of a particular wavelength range to pass through a material/surface without scattering the light or with minimal scattering of the light. Accordingly, some amount of optical loss due to light scattering can lead to a translucent material/surface, which is a subset of transparent materials/surfaces according to the present disclosure. The term "transparency" as used herein refers to a feature of a material/surface having the ability to allow light to pass through the material/surface without scattering the light or with minimal scattering of the light. Thus, the term transparency can be used with reference to light of a particular range of wavelengths, for example, visible light, infrared light, ultraviolet light, etc.

With reference to nanostructural features, the term "wall roughness" as used herein refers to a roughness along walls of nanostructure inclusive of all the surfaces of the nanostructures and is distinguishable from the term "surface roughness". Wall roughness can be a result of different physical states of a surface material, for example an amorphous versus a crystalline form of a material, the amorphous form having a more smooth surface and the crystalline form having a rougher surface resulting from crystallites. As another example, wall roughness can be a result of porosity of a material, a higher porosity leading to a rougher surface than a lower porosity material. As another example, wall roughness can be a result of a applying a coating to the wall coating comprising particles which leads to surface roughness.

The term "nanostructures" as used herein refers to a column-like structure which protrudes from a surface to which the column-like structure is substantially perpendicular. A nanostructure in the sense of the present disclosure encompasses, for example, nanoneedles, nanopillars, and nanocones. Nanostructures of the disclosure, comprising nanopillars, nanoneedles, and nanocones, can be perpendicular to the surface from top to bottom of the nanopillar (inclination angle≈0) or can be a cone-shaped or needle-like structure having a wider end at the surface from which it protrudes and coming to a point away from said surface (inclination angle≠0). A nanostructure according to the present disclosure can range in size from 5 nm to 100 microns.

More particularly with respect to nanocones, nanocones can encompass nanocone-shaped structures wherein substantially inclined surfaces of the nanocones are concave or convex surfaces. Wettability (e.g. hydrophobicity or hydrophilicity) of a surface can be analyzed by measuring a contact angle of a water droplet on the surface. A surface having a high contact angle between approximately 90-150° can be defined herein as having low wettability (e.g. a hydrophobic surface). A surface having a higher contact angle between approximately 150-180° can be defined herein as having super low wettability (e.g. a superhydrophobic surface). A surface having a low contact angle between approximately 20-60° can be classified as having high wettability (e.g. a hydrophilic surface). A surface having a lower contact angle between approximately 0-20° can be classified as having super high wettability (e.g. a superhydrophilic surface).

In some embodiments, fluidic properties of a liquid can be controlled by a type of material of which the surface is comprised and nanostructural features of the surface. In particular, a surface comprising nanostructures can be used to provide the surface with control fluidic properties. More particularly, the configuration of the nanostructures can provide the surface with control of fluidic properties based on an average height ($h_{avg}$), an average inclination angle ($i_{avg}$), and an average distance ($d_{avg}$) between the nanostructures.

In some embodiments, efficacy of particular configuration of nanostructures, and in particular, nanostructures of a particular average height ($h_{avg}$), average inclination angle ($i_{avg}$), and having average distance ($d_{avg}$) between one another, can be estimated by measuring contact angle that a surface comprising the nanostructures makes with a liquid and comparing this contact angle to a desired contact angle.

In some embodiments the surface is a rigid surface. A rigid surface in the sense of the present disclosure comprises materials which cannot readily be deformed by an applied pressure. For example, the rigid surface can comprise a metal, ceramics, sapphire, fluoride optics, and glass. Metals according to the present disclosure can include, but are not limited to a transition metal or transition metal alloy; any p-block metal or p-block metal alloy; and a semiconductor or semiconductor alloy. Glass according to the present disclosure include but are not limited to boro-, fluoro-, phospho-, borophospho-, and alumino-silicate, other types of silicon-based glass, and metallic glasses.

Fogging can be minimized by either promoting wetting of condensates to avoid a formation of light scattering droplets or by decreasing the surface wettability (e.g. increasing hydrophobicity), causing water droplets to bead up and rapidly run off. Wettability of a surface can be altered by depositing thin films of varying wettability (e.g. a hydrophilic or a hydrophobic film) or by intentionally increasing its roughness in a controlled fashion through incorporating nanostructures that promote or minimize a spreading of water.

In some embodiments, surface roughness has been shown to increase or decrease wettability (e.g. to enhance hydrophobicity or hydrophilicity) by creating a larger contact area between a surface and a liquid droplet. This change in contact angle changes the dynamics of a liquid-gas-solid equilibrium and can enhance wettability, or lack thereof. Thus, a slightly wettable (or slightly hydrophobic) surface can become a super wettable surface (or superhydrophobic) through addition of roughness or nanoscale surface textures, and liquids can attain a meta-stable state where droplets are suspended, creating an additional liquid/solid/gas interface at the bottom of the droplet.

The term "resistance" as used herein refers to a rate at which wetting of a surface occurs for a particular fluid. For example, two different surfaces can have equal wettability with respect to a particular fluid, however, if one the surfaces has a greater resistance toward the fluid then it can have a lower rate of wettability, even though a final state of wetting for the surfaces can be the same.

In some embodiments, a nanostructuring of a surface can result in an increased resistance between the surface and a fluid which contacts the surface. Additionally, roughness on a nanostructure can provide additional resistance between the surface and the fluid. Wall roughness/nanostructure roughness can be a result of different physical states of a surface material, for example an amorphous versus a crystalline form of a material, the amorphous form having a more smooth surface and the crystalline form having a rougher surface resulting from crystallites; wall roughness can be a result of porosity of a material, a higher porosity leading to a rougher surface than a lower porosity material; and wall roughness can be a result of applying a coating to the wall coating comprising particles which leads to surface roughness.

The distance between nanostructures, the height of the nanostructures, and the width of the nanostructures can create various resistances to eliminating the space created by the height, distance, width, and inclination angle/curvature. Thus, by controlling height, distance, width, and inclination angle/curvature, resistance of the surface to a fluid can be controlled to result in different wetting characteristics.

In some embodiments, a substantially flat surface (non-nanostructured) having a lower wettability on a flat surface can exhibit increased wettability by nanostructuring the surface according to embodiments of the disclosure. For example, if a substrate material inherently has a low wettability and thus substantially avoids wetting, providing the surface with nanostructures can increase its wettability and accordingly, a rate of wetting can be controlled. Additionally, by providing a surface with nanostructures suitable for increasing wettability followed by providing a coating on the surface, in which the coating itself inherently exhibits a low wettability (e.g. hydrophobic); the rate of wetting can be controlled based on opposing wettability characteristics (i.e. the coating having a low wettability (e.g. hydrophobic) and the nanostructured surface having a high wettability (e.g. hydrophilic)).

For example, a nanostructure configuration on a surface can be configured to increase or decrease wettability of the surface and a coating can be selected based on wettability of the coating (e.g. of the coating being hydrophobic or hydrophilic). Selection of the surface configuration and the coating based on opposing wettability characteristics such that the coating has a lower wettability (e.g. hydrophobic), and can provide a means to control a rate of wetting of the coated, nanostructured surface.

For example, an $R_a$ (RMS) of typical glass surfaces as produced, are less than approximately 0.5 nm. Surfaces of the present disclosure comprising nanostructures can range from 1-400 nm which is microscopically rougher than typical glass surfaces while still appearing macroscopically, as a smooth surface, that is, appearing similar to a corresponding surface prior to nanostructure fabrication. In some embodiments, the surfaces of the present disclosure comprising nanostructures can be approximately 30 nm. The term "wetting" as used herein refers to an ability of a liquid to maintain contact with a solid surface and can be related to a ratio of a surface area of a liquid droplet that is in contact with the solid surface to the total volume of the droplet, wherein the larger the contacted surface area to total volume, the greater the wetting.

In a consideration of light transmission in a nanostructured surface, both feature of distance and width are considered in connection with a desired size of the nanostructure to avoid light scattering. For example, both features being less than the wavelength for which transmission of light is desired can avoid light scattering.

The distance between nanostructures and the width of the nanostructures can be configured to maintain transparency of a surface for a given range of wavelengths of light. For example, a ratio of approximately 10:1 of wavelength to feature size can provide a higher transparency. However, a smaller ratio can be used with a small loss in transparency.

Thus, increasing a feature size with respect to a given wavelength of light can decrease transparency of the surface with respect to the wavelength of light, while decreasing a feature size with respect to a given wavelength of light can increase transparency of the surface with respect to the wavelength of light.

Depending on wavelength of light for which passage of the light through a surface is desired, a target feature size can vary. For example, if passage of ultraviolet (UV) light though a surface is desired, given that UV light ranges from 10-400 nm, much smaller feature sizes can be used on a surface for which passage of UV light is desired than for a surface through which passage of visible light is desired given that visible light ranges from 400-750 nm. Thus, the smaller the wavelength of light for which passage of the light through a surface is desired, the smaller the feature size can be. However, depending desired criteria for transparency, dimensions of nanostructures having a size equal to a lowest wavelength of a selected range of wavelengths can provide the nanostructured surface with approximately 10% loss of transparency.

While transparency of light of a certain wavelength can be a consideration for some applications, if a surface for which control of fluidic properties of a liquid is desired is for a non-transparent surface, this consideration may not be necessary. For example, if the control of fluidic properties is desired to achieve anti-fouling properties on a boat hull, then the size and periodicity of the nanostructures can be selected based on a desired contact angle and passage of light does not need to be considered.

In some embodiments, the height of a nanostructure can be selected based on a wear rate. For example, nanostructures comprising surface on an optical lens is likely subject to less wear than nanostructures comprising surfaces on a boat hull or airplane. Accordingly, a larger nanostructure height can be used in applications where wear is expected. Thus, with a larger nanostructure height, the nanostructures can wear down to a larger extent than shorter nanostructures before the control of fluidic properties is affected.

In some embodiments, the transparency of a substrate is unaffected by the etching treatments based on nanoparticle shadow masks. This is because the characteristic length scale of the roughness is at least 40 times smaller than the wavelength of the transmitted visible light.

Figure 10:
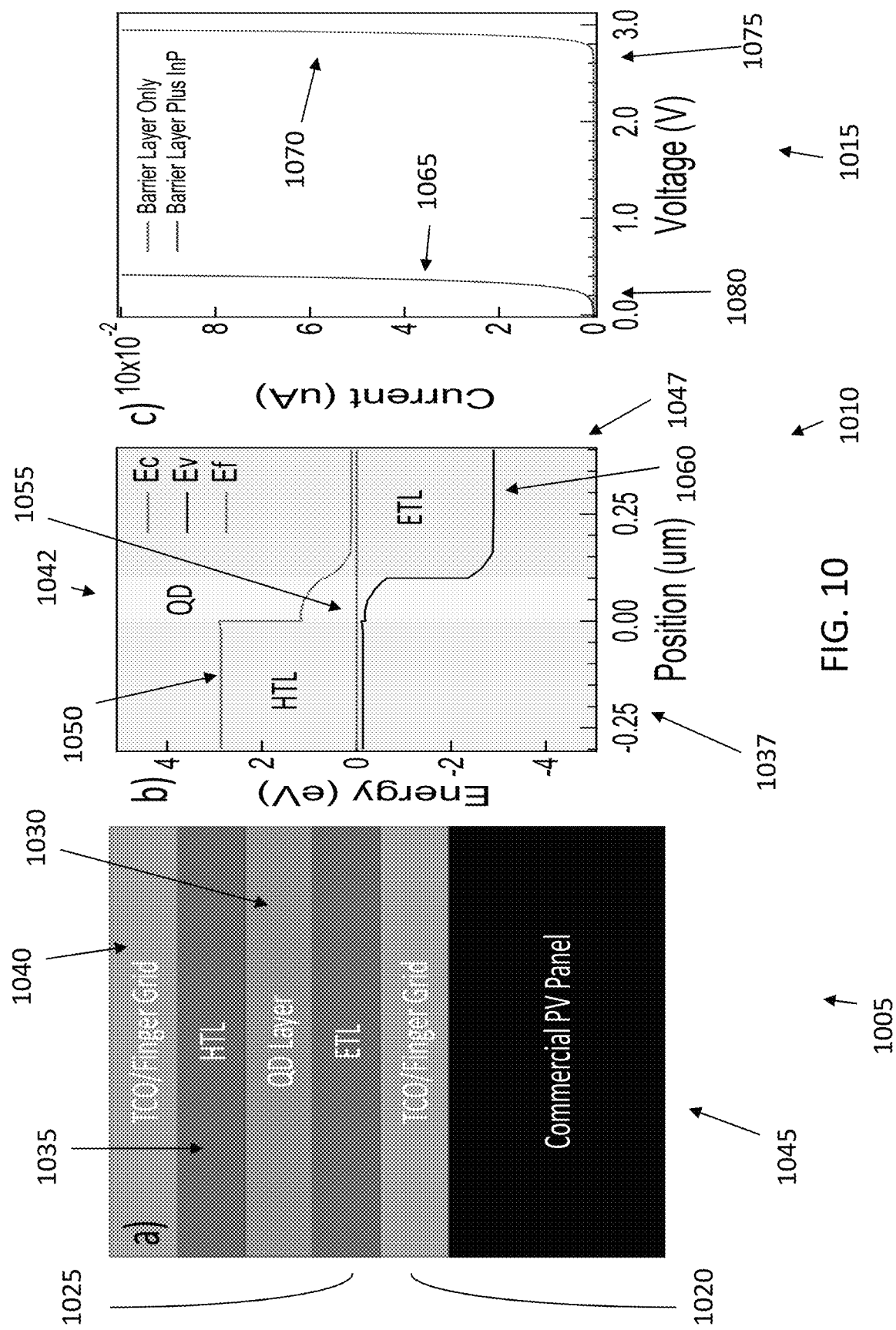
FIG. 10 illustrates an exemplary device to boost a solar cell efficiency.

In some embodiments, a surface can be modified to boost the efficiency of a solar cell. The device layers for an exemplary device of this embodiment are schematically shown in FIG. 10. FIG. 10 comprises: panel a (1005), illustrating a device schematic with layers to be sprayed on a solar cell commercial or previously fabricated panel; panel b (1010) showing an example band diagram illustrating the relationship between the electron transport layer, hole transport layer and quantum dot (QD) absorber layers; panel c (1015) showing a simulated current-voltage curve for a device with only the hole transport layer (HTL)/electron transport layer (ETL), and a device with ETL/QD absorber/HTL.

The structure of FIG. 10 comprises a bottom electrode layer (1020) comprised, for example, of a transparent conductive oxide (TCO) and/or a metallic finger grid array or array of electrodes which is used for current collection. On this bottom electrode (1020), an electron-selective transparent contact layer (ETL,1025) can be deposited. Layer (1025) enables transport of electrons towards the bottom electrode (1020), and blocks the transport of holes from the active semiconductor layer (1030) and top contact (1040) to the bottom electrode (1020). Next, the quantum dot/microparticle layer or active semiconductor layer (1030) can be deposited. This layer will absorb the incident solar photons. On the absorber layer (1030), a hole transport layer (1035) can be deposited. This layer is analogous to the ETL, as it blocks electrons from flowing into the top contact. Subsequently, a top electrode (1040) comprising, for example, a transparent conductive oxide and/or a metallic finger grid can be deposited.

FIG. 10, panel b shows an exemplary energy band diagram, with the HTL (1037), absorber (1042), and ETL (1047) conduction and valence bands. The diagram shows the conduction band through the device (1050,$E_C$), the valence band (1060,$E_V$), and Fermi level (1055,$E_F$). As known to the person of ordinary skill in the art, electrons tend to move towards lower energy states in the band diagram, while holes act as quasi-particles with an effective positive charge and tend to move towards higher energy levels in the band diagram.

For the device to behave as desired, the difference in conduction bands of the ETL and absorber layer must be small, while the difference in valence bands of the HTL and absorber layer must be small. There should also be a significant energy barrier for the current between the HTL and ETL. This is quantified by the exemplary I-V curves of the device in FIG. 10 panel c, with a curve for a device having only the barrier layers (1070) and a curve for the device having barrier layers with the QD layer (1065). Specifically, it can be noted that the turn on voltage of the barrier layer only device (1075) is significantly larger than the turn on voltage for the other device (1080).

In some embodiments, the metal grids that comprise both the top and bottom electrode should be spaced as the metal grid of the previously fabricated photovoltaic (PV) panel (1045) on which the spray-on photovoltaic device is added. This approach minimizes the photon loss due to reflection by the metallic grid. Furthermore, the cells can be sized with the same dimensions of the underlying PV panel. The material options for some examples for each layer are listed in Table 1. The thicknesses of the electron and hole transport layers can range, for example, from 1 nm to 20 nm, while the absorber layer thicknesses can range, for example, between 100 nm and 5 micrometers. In some embodiments, the QD layer may comprise a monolayer of nano or microparticles. For example, a monolayer of microparticles or microspheres having a diameter of about 1 micrometers could be used. In some embodiments, the optimal thickness of the QD layer is about 1 micrometer. A thickness of 1 micrometer can be realized by having multiple monolayers of nanoparticles, or by using a monolayer of particles with a diameter of 1 micrometer. In some embodiments, instead of a photovoltaic panels other types of solar cells may be used.

In some embodiments, the layout of the exemplary device of FIG. 10 can further comprise another particle multilayer on the bottom of the PV panel. This bottom attachment may be similar to the top structure, or have a different structure. In these embodiments, the top structure, for example comprising layers (1020,1025,1230,1035,1040) allows the absorption of UV and visible light, while the PV panel could absorb near-infrared light, and the bottom structure may absorb long-wavelength infrared light (longer wavelengths than those absorbed by the PV panel). The efficiency of a PV panel can be greatly increased by the inexpensive deposition of particles on the top, bottom, or both top and bottom surfaces. In some embodiments, layers (1040,1035) and (1020,1025) may have each a thickness of 10-100 nm, while the QD layer could have a thickness of about 1 micrometer.

One possible advantage of using microspheres is the decrease in defects compared to smaller nanoparticles, due to the fact that most defects are present on the surface of a particle, and larger particles have a greater volume to surface area ratio. In some embodiments, the device may comprise a QD layer with electrodes, without the ETL, the HTL, or either the ETL and HTL. The structure may be fabricated by liquid deposition as described in the present disclosure, or other methods described herein. In some embodiments, particles with different dimensions may be used in the same QD layer—for example, a layer of particles having a first diameter, and a second layer of particles with a second diameter smaller than the first diameter. The layers with the larger diameter may also be deposited in multiple layers, with the smaller particles filling the spaces between the larger particles. A voltage may be applied to the structure of FIG. 10, between electrodes (1020) and (1040), to optimize the load on the device. For example, the structure may operate at 0.4-0.5 V. In some embodiments, the particles may be fabricated by ball milling of bulk materials, to create microspheres or nanoparticles.

TABLE 1

| Electron Transport Layer | Hole Transport Layer | Bottom Absorber Layer | Top Absorber Layer |
| --- | --- | --- | --- |
| $TiO_2$ | GaP | PbS | InGaP |
| $WO_3$ | AlSb | PbSe | CdSe |
| PbO | ZnTe | PbTe | CdZnTe |
| $MnTiO_3$ | NiO | HgS | AlGaAs |
| $SnO_2$ | $AlCuO_2$ | HgCdTe | CdSTe |
| $In_2O_3$ | $MoO_x$ | HgCdSe | CdSSe |
| Ca | $WO_x$ | $Bi_2Se_3$ | CsPbCl |
| $LiF_x$ | CuPc | Ge | CsPbBr |
| $CsF_x$ | CuSCN | GaSb | CsPbI |
| $KF_x$ | $CuO_x$:N | InGaAs | |
| $CsO_x$ | $V_2O_x$ | | |
| $MgF_x$ | | | |
| $LaB_6$ | | | |

In some embodiments, attaching a top and bottom structure to a PV panel can allow an overall efficiency, for example, of 25-50%, due to the increased light absorption capacity across a larger spectrum of wavelengths. In some embodiments, the efficiency of the top structure needs to be at least 13% to not have detrimental effects on the efficiency of the underlying PV panel. The overall efficiency with only the top structure added to a PV panel may be, for example, about 25%. In the following, material choices for layers to add to PV panels are described, with reference to Table 1. Table 1 lists exemplary materials for the optional ETL and HTL layers, as well as materials for the structure to be deposited on top of a PV panel, and materials for the structure to be deposited on the bottom of a PV panel. Other materials suitable for the same purpose may be substituted for the materials of Table 1.

Electron Transport Layer

The material options for the electron transport layer (ETL) can be separated into three categories: 1. wide bandgap materials (e.g. with a bandgap Eg>2 eV) which have a conduction band that matches up with the conduction band of the semiconductor absorber layer; 2. wide bandgap materials which when deposited as an amorphous structure, or sub-stoichiometrically, form defect states in the bandgap near the conduction band of the semiconductor absorber layer; 3. very low work function metallic materials. Of the materials listed for electron transport layers (Table 1), $TiO_2$, PbO, $SnO_2$, $In_2O_3$ fall into the first category, $LiF_x$, $CsF_x$, $KF_x$, $CsO_x$, MgF, fall into the second category, and Ca, and $LaB_6$ fall into the third category.

Hole Transport Layer

Similarly to the ETL, the material options for the hole transport layer (HTL) can be separated into two categories: 1. wide bandgap materials (e.g. $E_g > 2$ eV) which have a valence band that matches up with the valence band of the semiconductor absorber layer; 2. wide bandgap materials, which when deposited as an amorphous structure, or sub-stoichiometrically, form defect states in the bandgap near the valence band of the semiconductor absorber layer. Of the materials listed for hole transport layers (Table 1), GaP, AlSb, ZnTe, NiO, and $AlCuO_2$, CuSCN, and CuPc fall into the first category, and $MoO_x$, $WO_x$, $V_2O_x$, $CuO_x$:N, fall into the second category.

Absorber Layers

The absorber layers for the top and bottom cell layers can be chosen according to the bandgap of the material. Specifically, in some embodiments the bandgap of the top cell may fall within the range from 1.6 eV to 2.5 eV, while the bandgap of the bottom cell may fall within the range of 0.15 eV to 0.75 eV. Each of the binary and ternary semiconductors for the top cell (Table 1) were chosen such that at least one attainable mixture or compound exhibits a bandgap within the range between 1.6 eV and 2.5 eV. Analogously, each of the materials chosen for the bottom cell (Table 1) were chosen such that one phase of those materials exhibits a bandgap between 0.15 eV and 0.75 eV.

Figure 11:
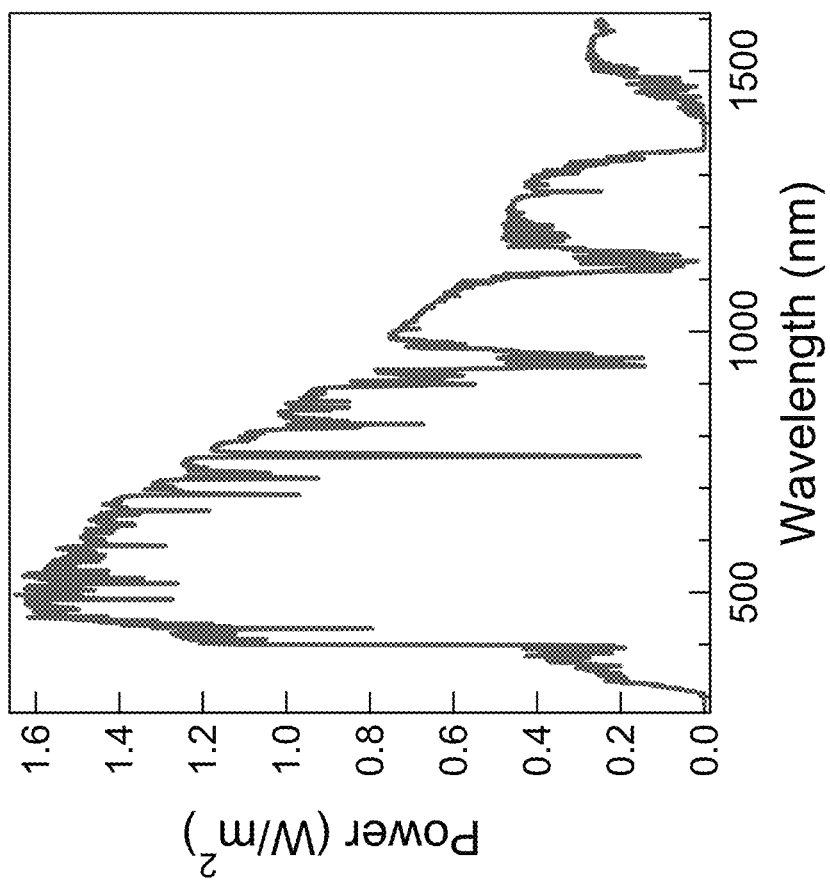
FIG. 11 illustrates an exemplary available power as a function of wavelength.
Figure 12:
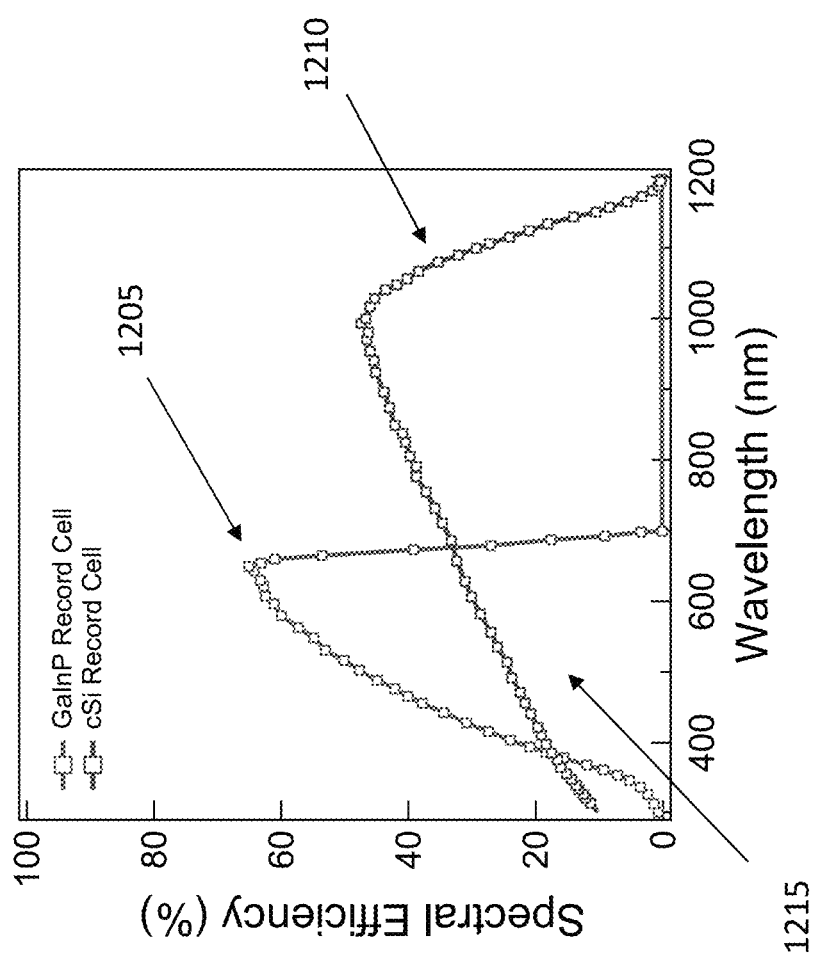
FIGS. 12-13 illustrate exemplary spectral efficiency for two cells.

FIG. 11 illustrates an exemplary available power as a function of wavelength, e.g. power available in the solar spectrum at a ground location. FIG. 12 illustrates an exemplary spectral efficiency for a GaInP cell (1205) and a Si solar panel (1210). It is possible to note a boost in efficiency in the wavelength range (1215) due to the different absorption and bandgaps of different semiconductor materials. By adding a top, bottom, or both a top and a bottom structure to a Si panel, it is possible to boost the overall efficiency by combining different absorption profiles of different materials which have different absorption efficiencies.

Figure 13:
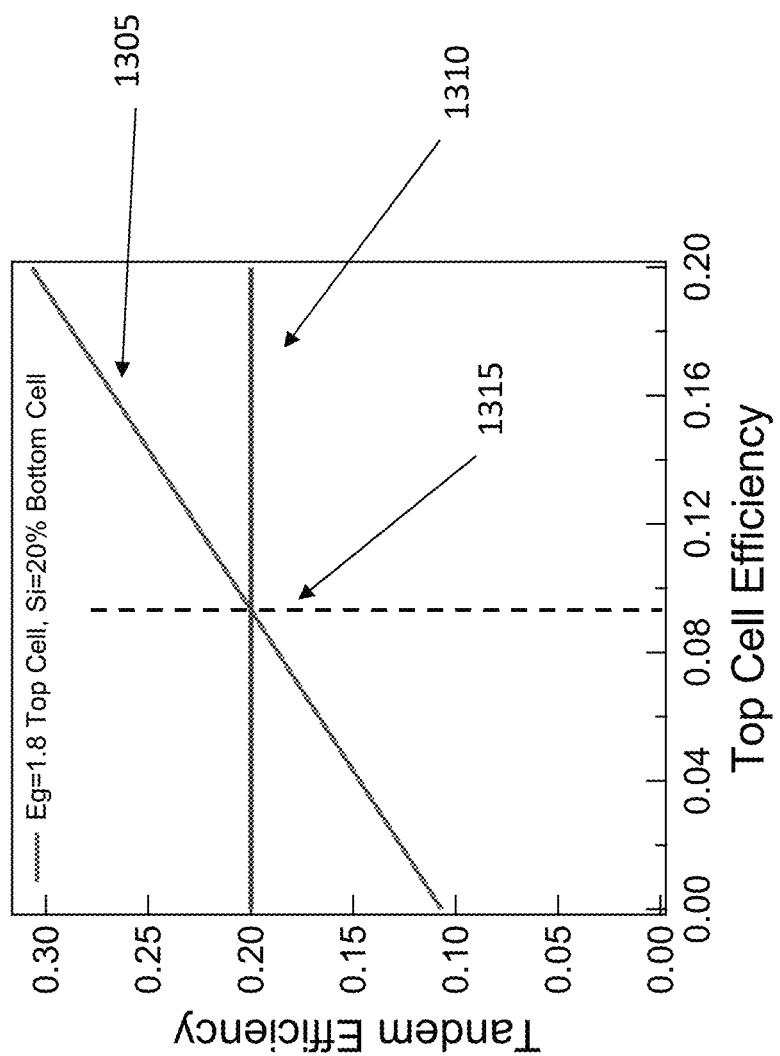
Figure 14:
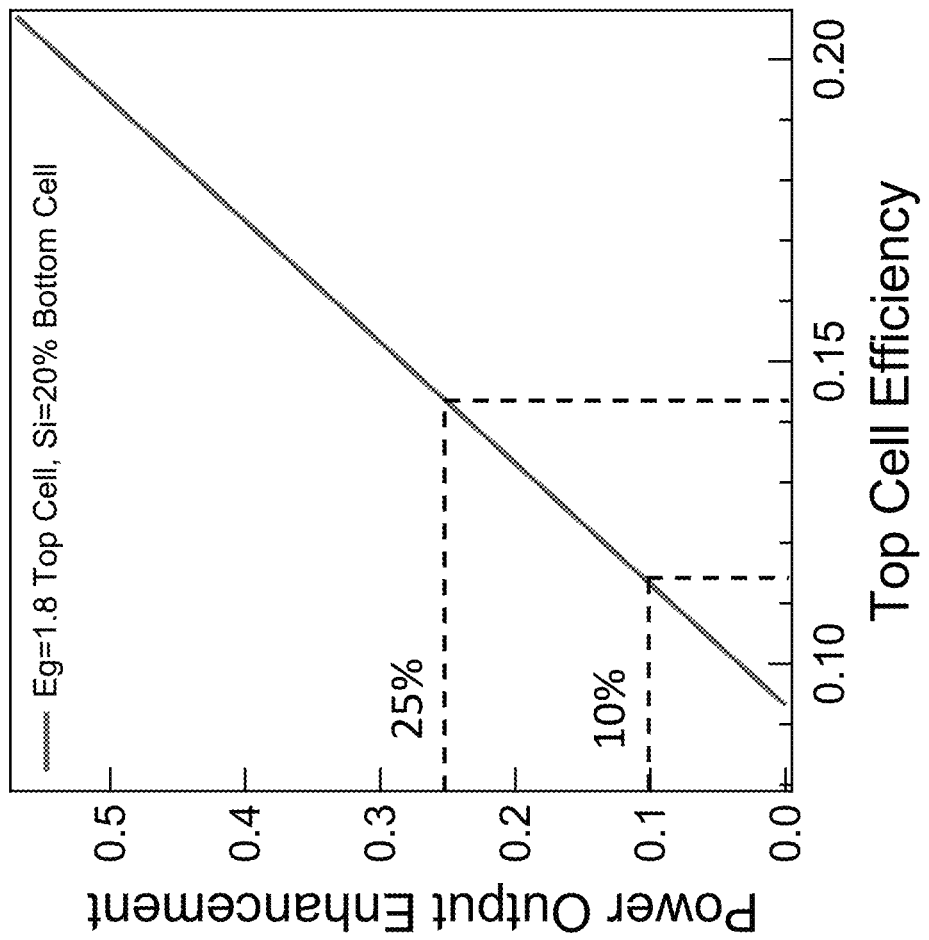
FIG. 14 illustrates exemplary power enhancement.
Figure 15:
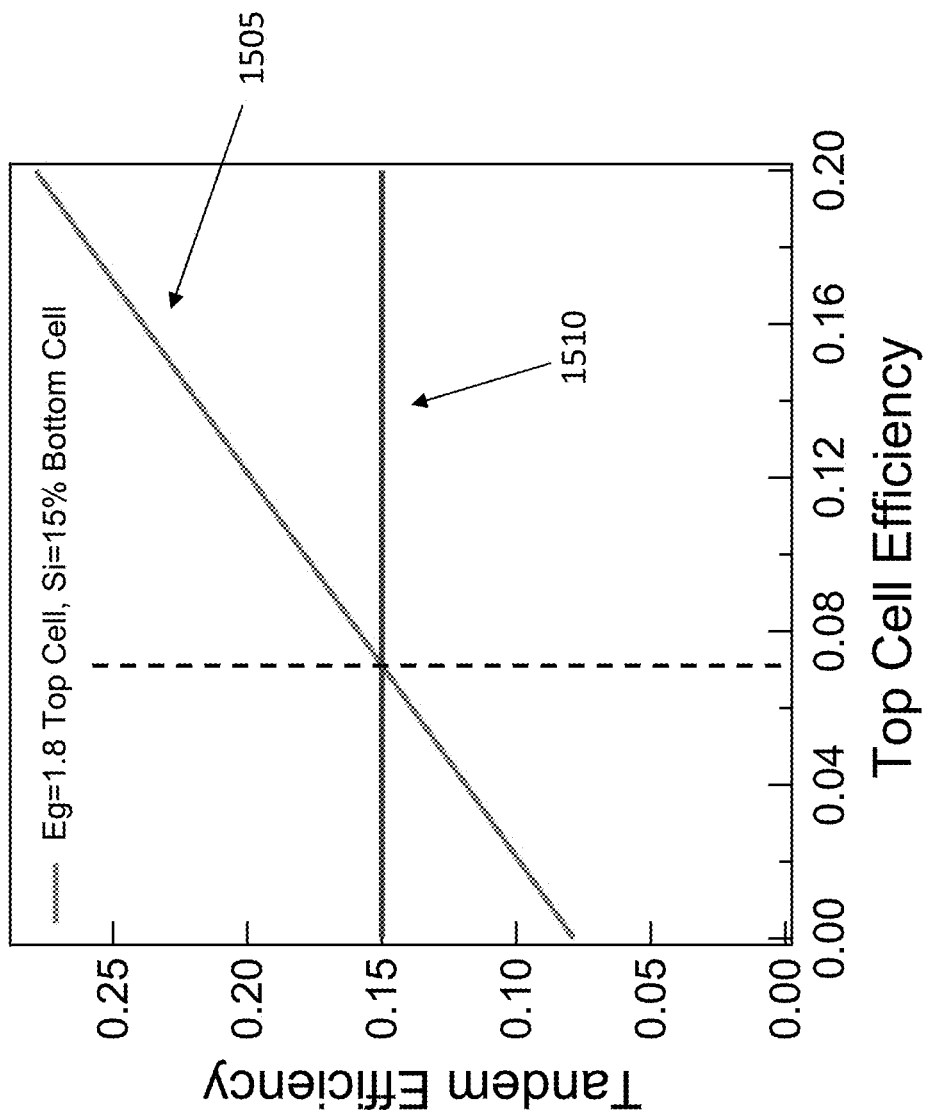
FIG. 15 illustrates similar data as FIG. 13, but for a 15% efficiency Si cell.
Figure 16:
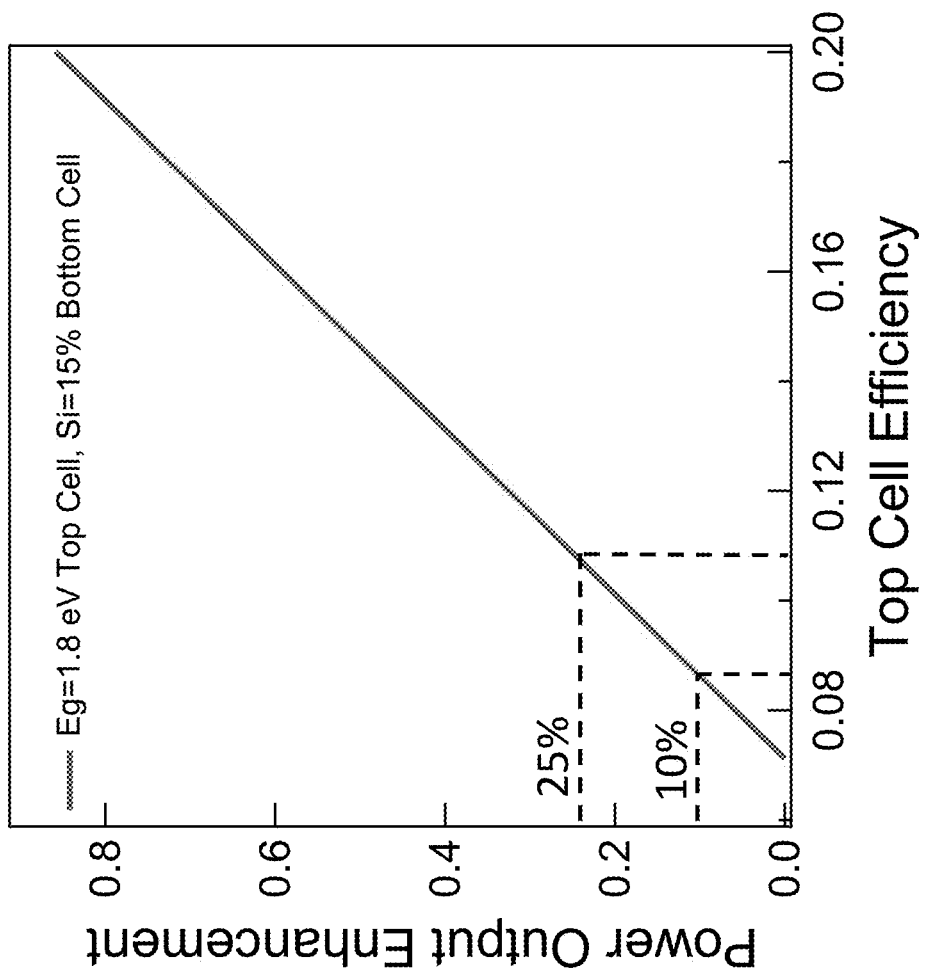
FIG. 16 illustrates similar data as FIG. 14, but for a 15% efficiency Si cell.

FIG. 13 illustrates the efficiency for a Si cell (1310), as a constant, and the overall efficiency of the same Si cell with a 1.8 eV top cell (1305). The Si cell has an efficiency of 20%. The overall efficiency is lower when the top cell has a low efficiency, but it increases as the top cell efficiency is increased, surpassing the bare Si cell at the breakeven point (1315). FIG. 14 illustrates an exemplary power enhancement as the top cell efficiency is increased. FIG. 15 illustrates similar data as FIG. 13, but for a 15% efficiency Si cell. FIG. 16 illustrates similar data as FIG. 14, but for a 15% efficiency Si cell. It can be noted that, for a specific PV panel efficiency, there is a minimum efficiency required for the top structure, in order for the overall efficiency to surpass the efficiency of the PV panel alone. It can be further noted that this concept can work for other panels beside Si panels.

Figure 17:
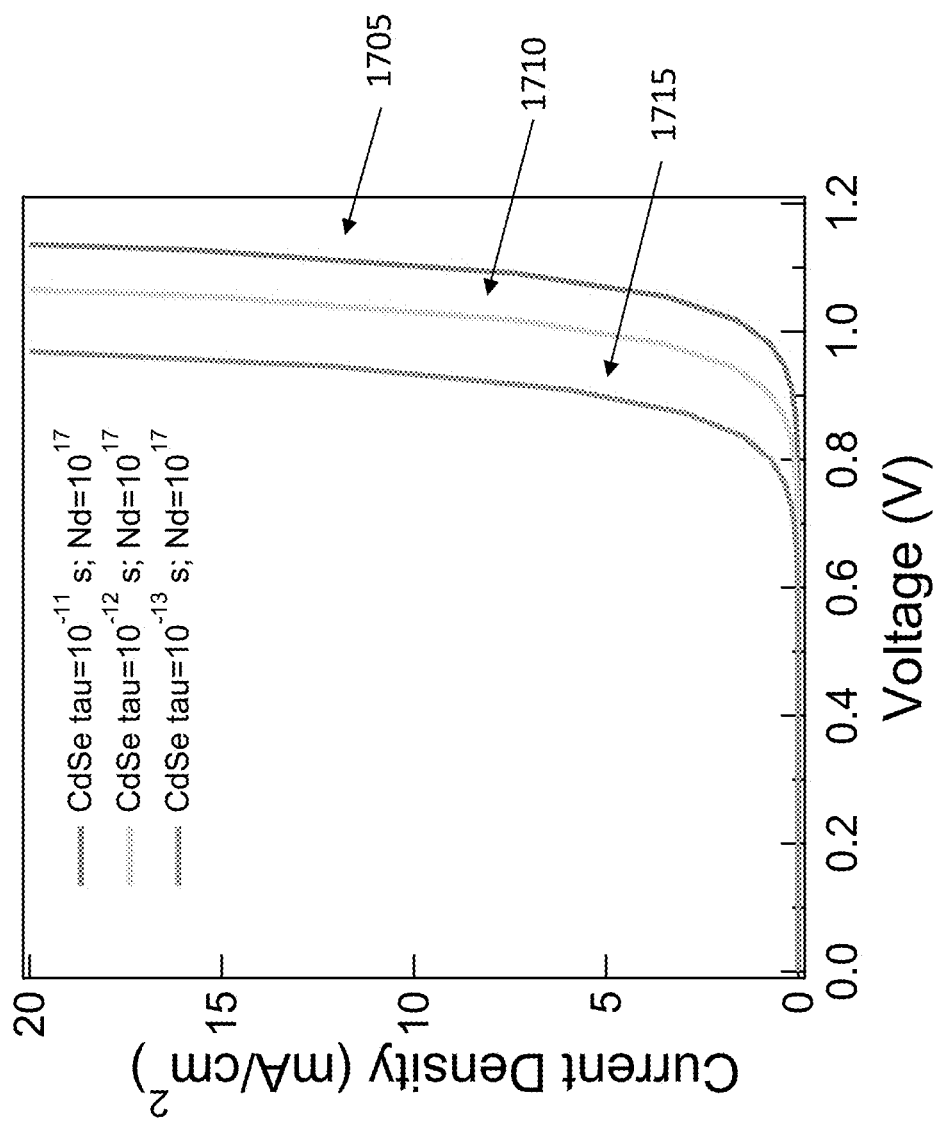
FIG. 17 illustrates dark current-voltage (I-V) curves for a simulated structure.

FIG. 17 illustrates dark current-voltage (I-V) curves for a simulated structure having a top and bottom electrodes, with an ETL and HTL on either side of an absorber layer, similarly as in FIG. 10. In FIG. 17, the absorber layer is CdSe, for example microspheres of CdSe. For doping levels of $10^{17}$, three curves are plotted for three different values of τ, a parameter indicating different recombination lifetimes: $10^{-11}$ (1705), $10^{-12}$ (1710), and $10^{13}$ (1715). Typical CdSe QDs normally exhibit lifetimes between $10^{-10}$ and $10^{-12}$ S. The data of FIG. 17 can be compared favourably to a state-of-the-art InGaP cell. Such a InGaP cell has $V_{oc}$=1.4 V ($V_{oc}$ is the open-circuit current), $J_{sc}$=15 mA ($J_{sc}$ is the short-circuit current) and FF=0.88. The Fill Factor (FF) is a measure of quality of the solar cell. It is calculated by comparing the maximum power to the theoretical power that would be output at both the open circuit voltage and short circuit current together.

A structure as in FIG. 10, simulated in FIG. 17, could have $V_{oc}$ between 0.8 V and 1 V. CdSe are known, currently to have spectral efficiencies of 40-60%, comparable to the InGaP state-of-the-art cell. Therefore, with a $V_{oc}$=0.8-1 V and $J_{sc}$=13 mA/cm$^2$, it would be possible to achieve an efficiency of 13% for the QD structure.

Figure 18:
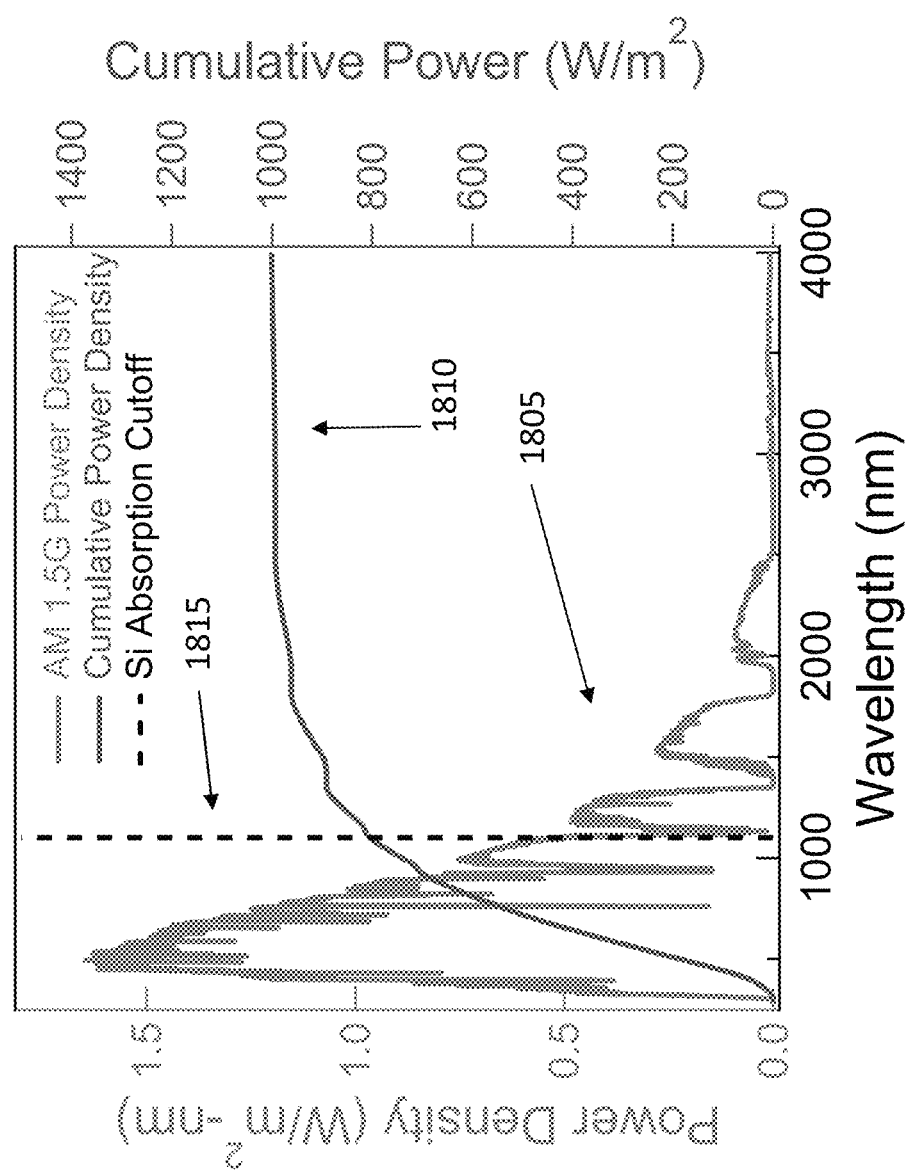
FIG. 18 illustrates the power density for AM 1.5G power.

FIG. 18 illustrates the power density for AM 1.5G power (1805). As known to the person of ordinary skill in the art, AM 1.5G is a standard set of values for power irradiated in a range of wavelength, used to simulate solar power during development or testing of a solar panel device. FIG. 18 also illustrates the Si absorption cut-off (1815) and the cumulative power density (1810). It can be noted that about 200 W/m$^2$ of power is not absorbed by the Si cell, representing about 20% of incident AM 1.5G power. By selecting a rear absorber, a bottom structure as described in the present disclosure, with a bandgap around 1800 nm (about 0.7 eV) it is possible to absorb about 150 W/m$^2$ of the power that would be otherwise wasted by the solar panel.

Figure 19:
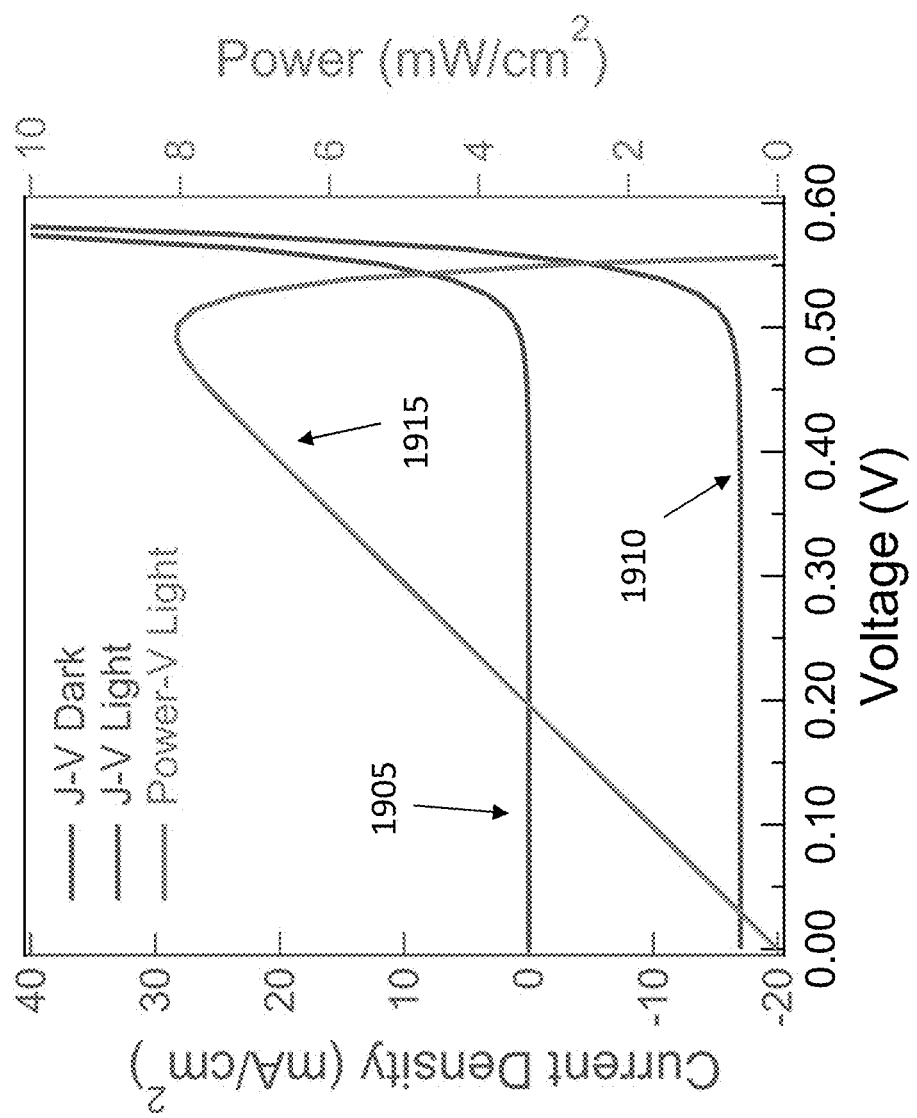
FIGS. 19-20 illustrate current-voltage characteristics for a simulated device comprising a semiconductor with $E_g=0.67$ eV.
Figure 20:
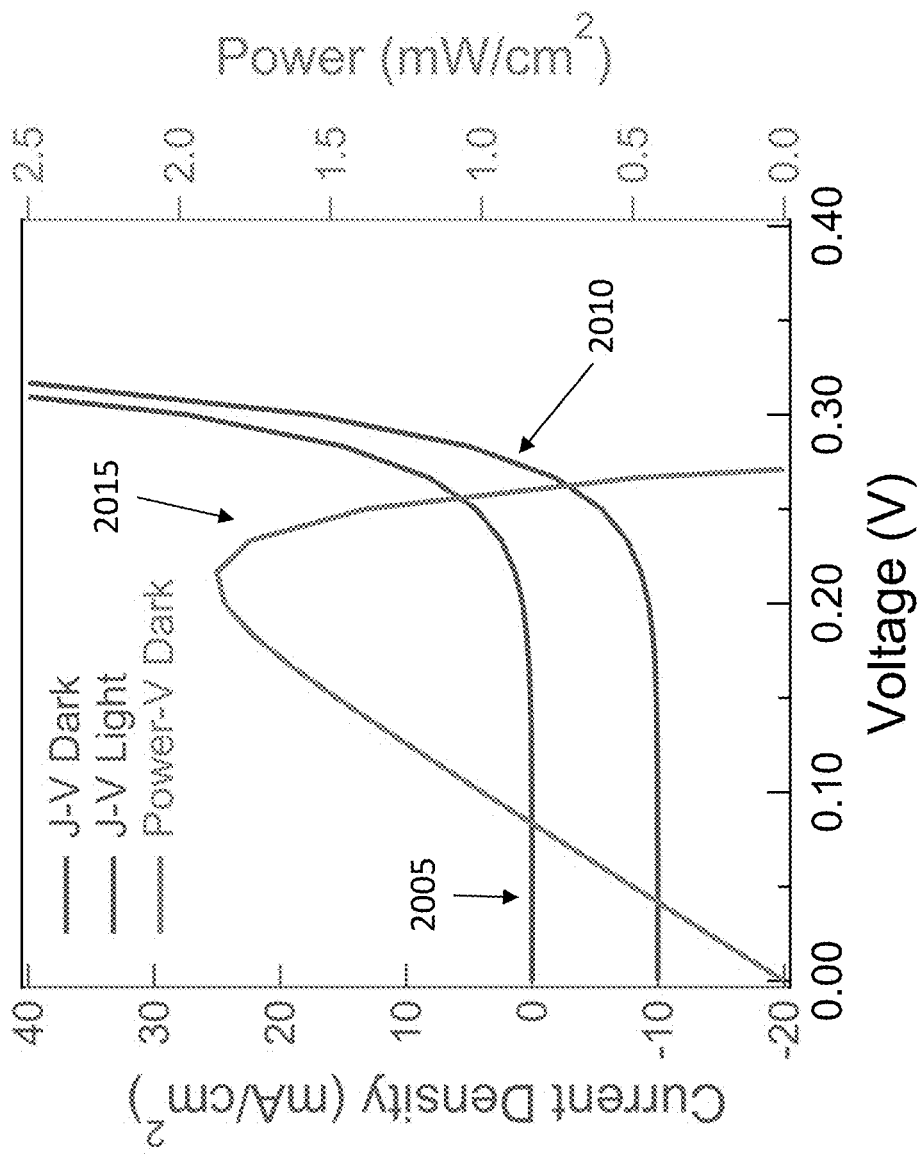

FIGS. 19-20 illustrate current-voltage characteristics for a simulated device comprising a semiconductor with $E_g$=0.67 eV. In FIG. 19, three curves are plotted: J-V dark (1905), J-V with irradiated light (1910) and power-voltage with irradiated light (1915). In FIG. 20, three curves are plotted: J-V dark (2005), J-V with irradiated light (2010) and power-voltage with irradiated light (2015). With an ideal PV cell, it is possible to generate about 8 mW/cm$^2$ of power, a 40% boost in power output for a 20% efficient Si panel. With a relatively low quality PV absorber material cell, it is possible to generate about 1.9 mW/cm$^2$ of power, a 10% boost in power output for a 20% Si PV cell.

The implementation describe above is based on the fact that commonly available solar panels are based on Si, due to the cost of production and availability of the material. However, Si has poor spectral efficiency in the UV and visible spectrum, as well as in portions of near infrared. Therefore, it is possible to pair Si with a top absorber that is efficient in capturing shorter wavelengths. By using both a top and bottom cell, it is also possible to capture shorter and longer wavelengths and therefore increase the efficiency of solar panels.

Figure 22:
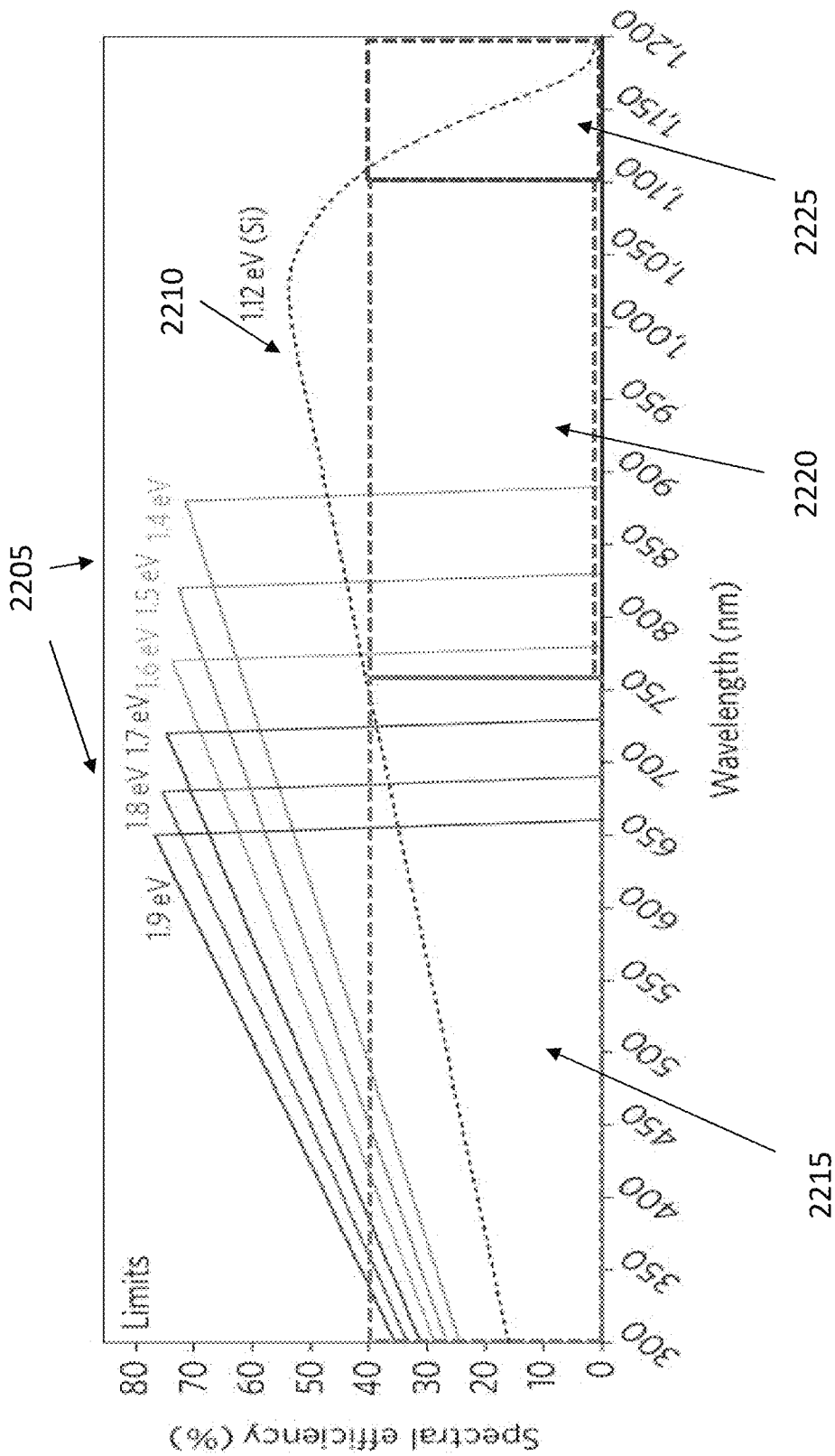
FIG. 22 illustrates an exemplary concept of spectral efficiency at different wavelengths.

FIG. 22 illustrates an exemplary concept of spectral efficiency at different wavelengths for Si and different absorbing materials to be used in the top and bottom of a PV panel, having different bandgaps. In FIG. 22, spectral efficiencies for different bandgaps (2205) between 1.4 and 1.9 eV are schematically illustrated. A curve for the spectral efficiency of Si is also illustrated (2010). A first region (2215) illustrates the wavelength range where the spectral efficiency could be improved by adding a top absorber to a Si panel. The middle region (2220) illustrates the wavelength range where Si could efficiently absorb light not absorbed by the top cell. The third region (2225) illustrates the wavelength range where a bottom cell attached to the Si PV panel could absorb longer wavelengths that are not as efficiently absorbed by Si. The first and third regions could also be termed tandem short and tandem long, respectively, as the top absorber works in tandem with Si at shorter wavelengths, while the bottom absorber works in tandem with Si at longer wavelengths. Although the example of FIG. 22 illustrates wavelengths up to 1200 nm, longer wavelengths may also be used, for example up to 1800 nm.

Figure 23:
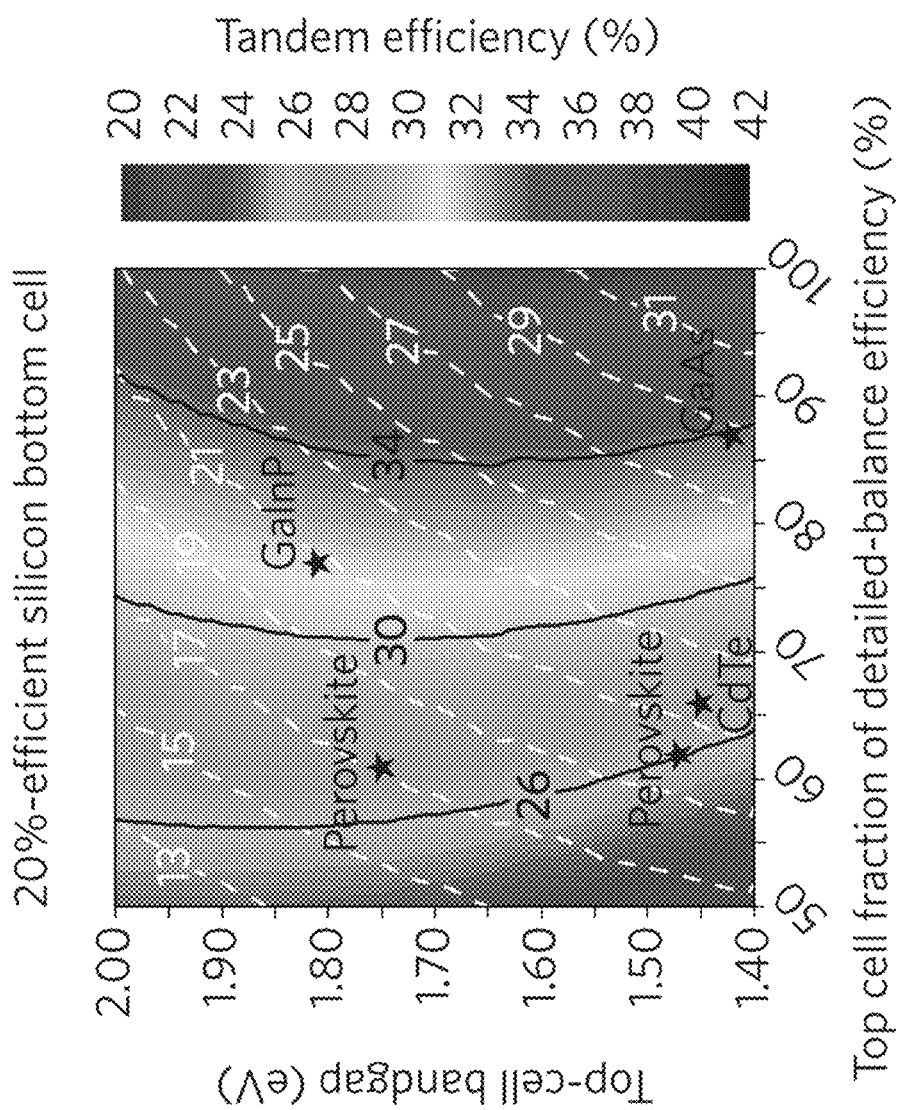
FIG. 23 illustrates an exemplary simulation for the overall tandem efficiency.

FIG. 23 illustrates an exemplary simulation for the overall tandem efficiency as a function of the top cell bandgap and the top cell fraction of detailed-balance efficiency, for a 20% efficient Si panel with an absorber structure on top. Exemplary data points are indicated for GaInP, GaAs, CdTe and different perovskites. In FIG. 23, the tandem efficiency generally increases from left to right of the top cell fraction efficiency axis. In some embodiments, the top and bottom absorbing structures can boost the efficiency of commercially available solar panels by up to 30%.

Figure 24:
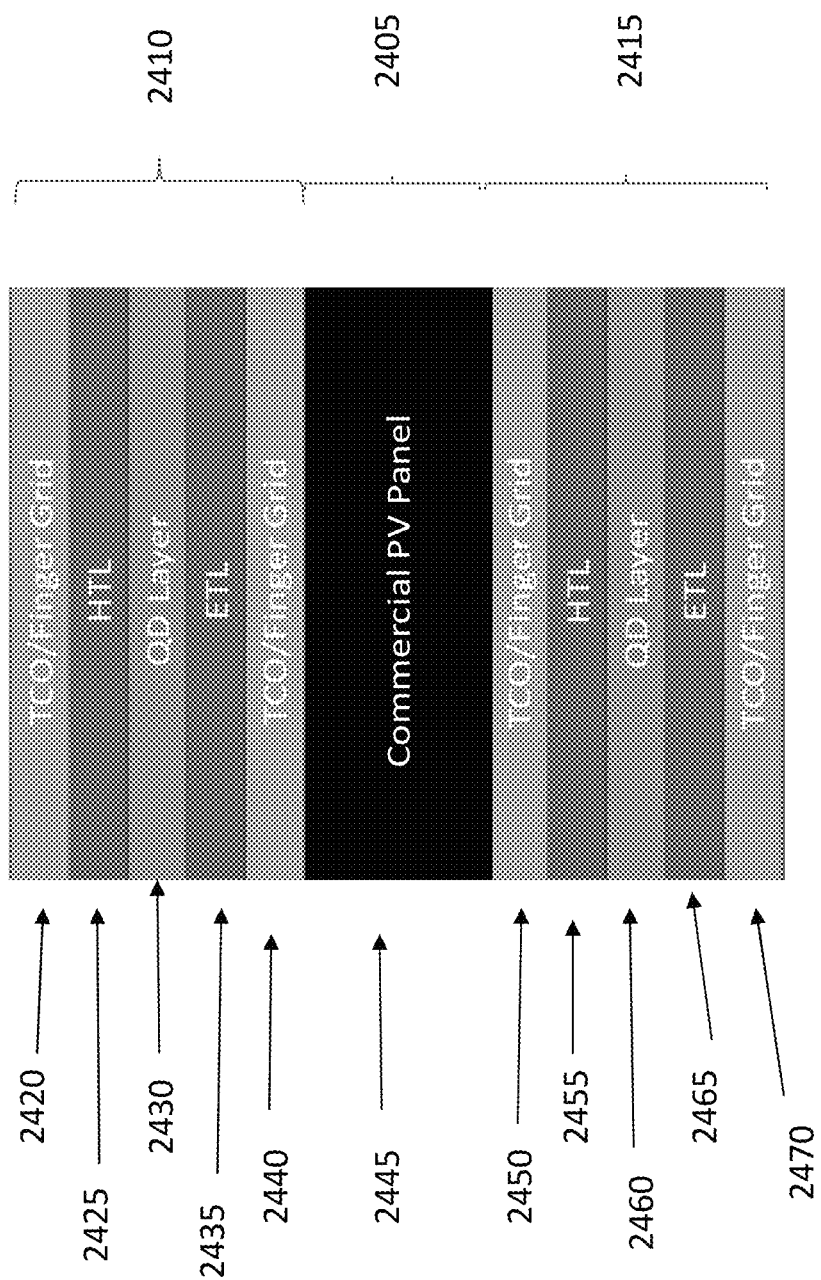
FIG. 24 illustrates an exemplary structure with a PV panel and top and bottom absorbers.

FIG. 24 illustrates an exemplary structure with a PV panel (2405) to absorb light at 700-1000 nm, such as a Si panel, a top structure (2410) to absorb UV and visible light (e.g. CdSe QD or microspheres) and a bottom structure (2415) to absorb at 1000-1300 nm (e.g. GaSb, InGaAs, etc). The structure may comprise: a transparent conductive oxide electrode (2420); HTL (2425), QD layer (2430), ETL (2435), a bottom electrode (2440), a PV panel (2445), a transparent conductive oxide electrode (2450); HTL (2455), QD layer (2460), ETL (2465), a bottom electrode (2470). It should be noted that other layers can be added, as desired. For example, anti-reflection coatings may also be added as well as electrode layers.

According to the present disclosure, the substrate surface can be modified by additive processes such as, but not limited to, 3D printing of surface textures or bulk materials, nanoparticle attachment/layering, nanoscribing or similar writing of sacrificial or permanent molds/templates for coatings, vapor deposition, and liquid phase and/or supercritical phase deposition. The structures can be therefore created by a large number of processes, some of which never use nanoparticles or ALD. In other words, it is possible to 3D print the entire hierarchical texture, or mold the entire textures.

Alternatively, the substrate surface can be modified by subtractive processes such as, but not limited to, wet (e.g., liquid phase or supercritical phase) etching or dry (e.g., plasma or vapor) etching, and/or physical methods of removing materials from the substrate surface. In other embodiments, the substrate surface can be modified by a stamping or embossing process.

The various methods of surface modification (additive, subtractive, stamping, or embossing) can be used in isolation or in any combination to produce the structure(s) and/or layer(s) to achieve the desired physical effects. As those skilled in the art will appreciate, the structures and/or layers may be made from the same or different materials.

In other exemplary embodiments, the structures or layers can be monolithically fabricated as one continuous material with the substrate. Alternatively, the structures or layers can be added to the substrate before, during, or after the substrate's fabrication. In other exemplary embodiments, various techniques can be combined to create hierarchical structures or layers of a variety of materials to get the precise function and highest possible performance desired for any given application. In other exemplary embodiments, 3D printing techniques or direct writing processes can be used to produce functional structures or layers in combination with or in isolation of the substrate.

Figure 21:
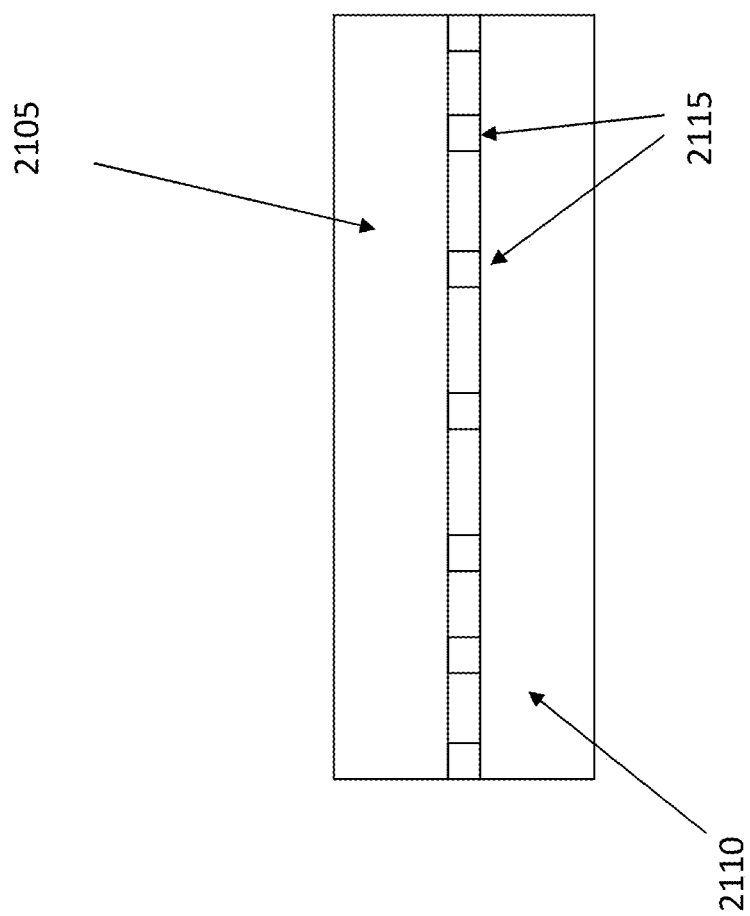
FIG. 21 illustrates an example of spacers between a solar cell and a top structure.

As described above, silicon solar cells can be optimized by adding a top and bottom structure to absorb additional light when compared to a Si solar cell without additional components. In some embodiments, an antireflection coating can also be added. For example, the antireflection structure could be added on top of layer (2420) in FIG. 24, or incorporated in layer (2430) or (2425). In some embodiments, the PV panel already has an antireflection coating. For example, some previously fabricated PV panels may have an antireflection coating on top—e.g. as part of the top surface of (2445). In this case, the application of structure (2410) can take into consideration the antireflection coating, in order to prevent any decrease in efficiency. In some embodiments, an air gap can therefore be advantageously added to the top structure—e.g. structure (2410) in FIG. 24. For example, the air gap may be between (2445) and (2440)—between (2405) and (2410). If the gap between the top quantum dot cell (2410) and the previously fabricated silicon cell (2405) is larger than a few microns, the antireflection coating present on (2405) does not need to be modified, thus reducing technological requirements and costs. In some embodiments, small posts (pillars) may be used, to standoff the quantum dot cell on top of the previously fabricated PV panel. For example, the posts may have a thickness in the millimeter or centimeter range. FIG. 21 illustrates an example of such standoff spacers (2115) between a solar cell (2110) and a top structure (2105).

A back reflector can also be added at the bottom of the composite structure. For example, a back reflector layer could be added below layer (2450), (2460) or (2470). Alternatively, a back reflector can also be added to the bottom of (2405), or may already be present in the previously fabricated PV panel. The back reflector can be configured to reflect any radiation not absorbed by the layers above, back towards the absorbing layers. The back reflector can therefore increase the overall absorption efficiency. In some embodiments, a wavelength selectable reflector can be used at the bottom of (2405), to ensure that only the visible light and the radiation around the 1200 nm wavelength is reflected back towards the absorbing layers, while radiation with a wavelength longer than 1200 nm is not reflected up, and is instead absorbed by the bottom structure (2415). For example, the back reflector may comprise a Au film or a multilayer dielectric stack.

Figure 32:
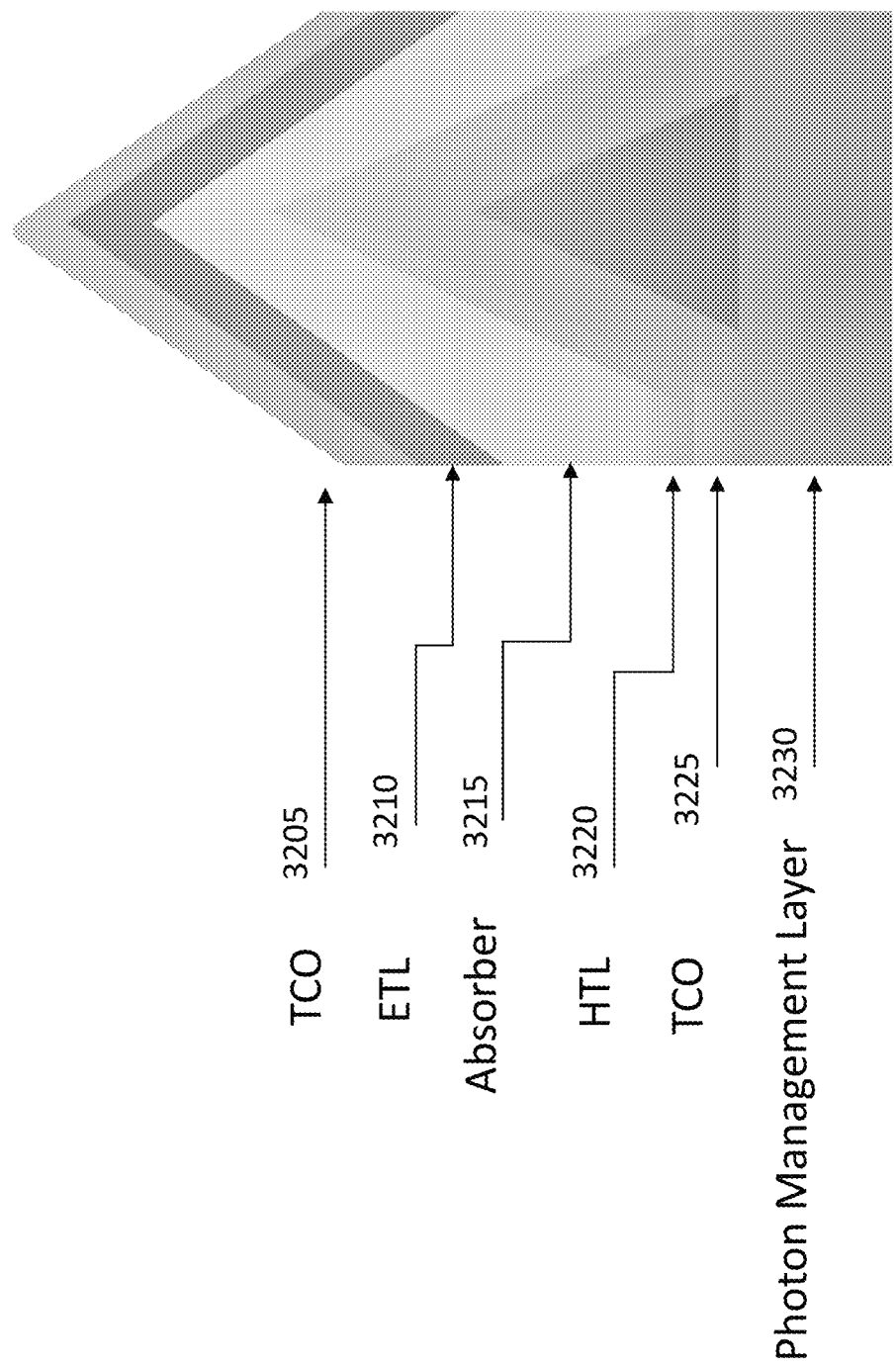
FIGS. 32-35 illustrate exemplary photo absorption structures.
Figure 33:
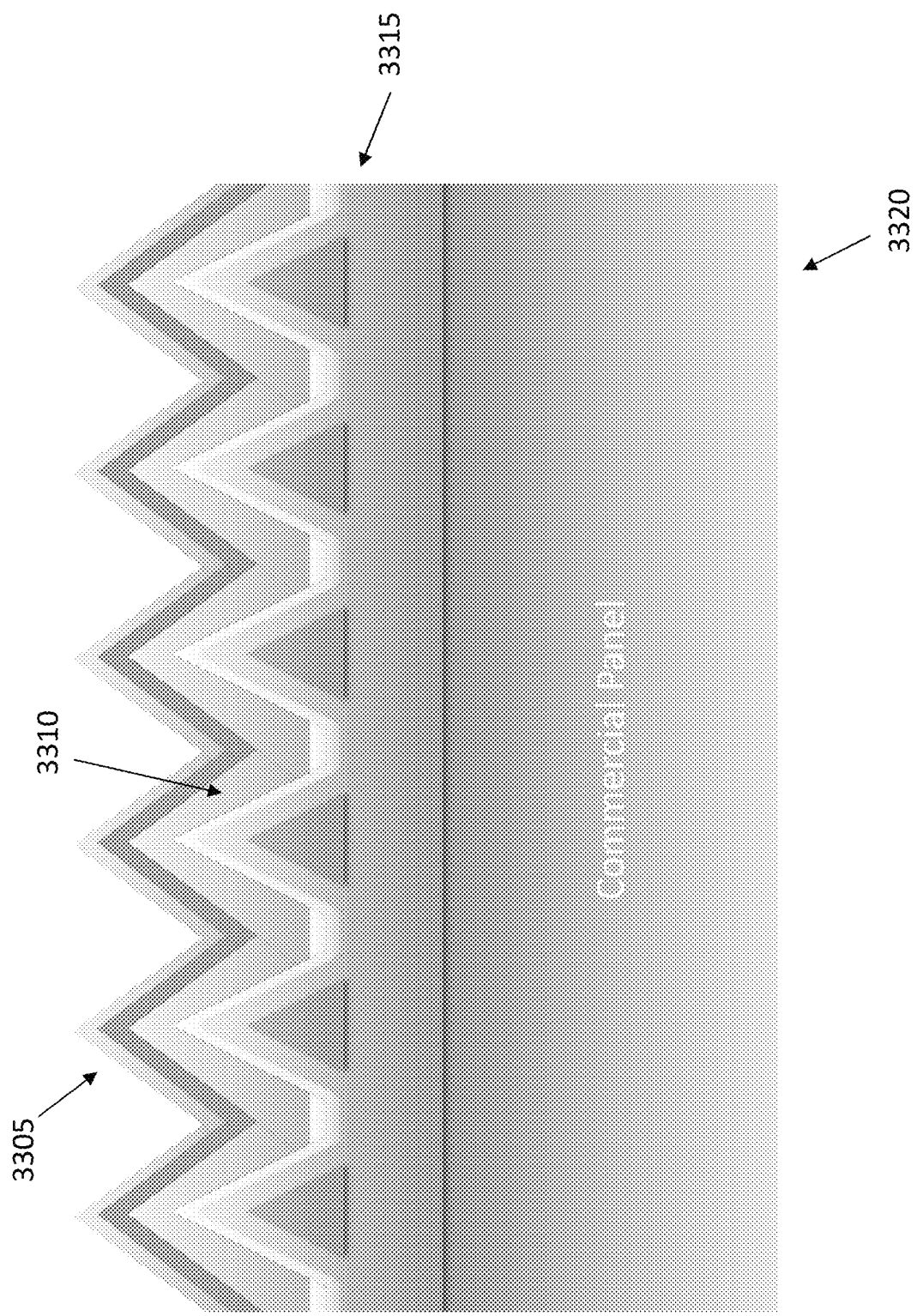
Figure 34:
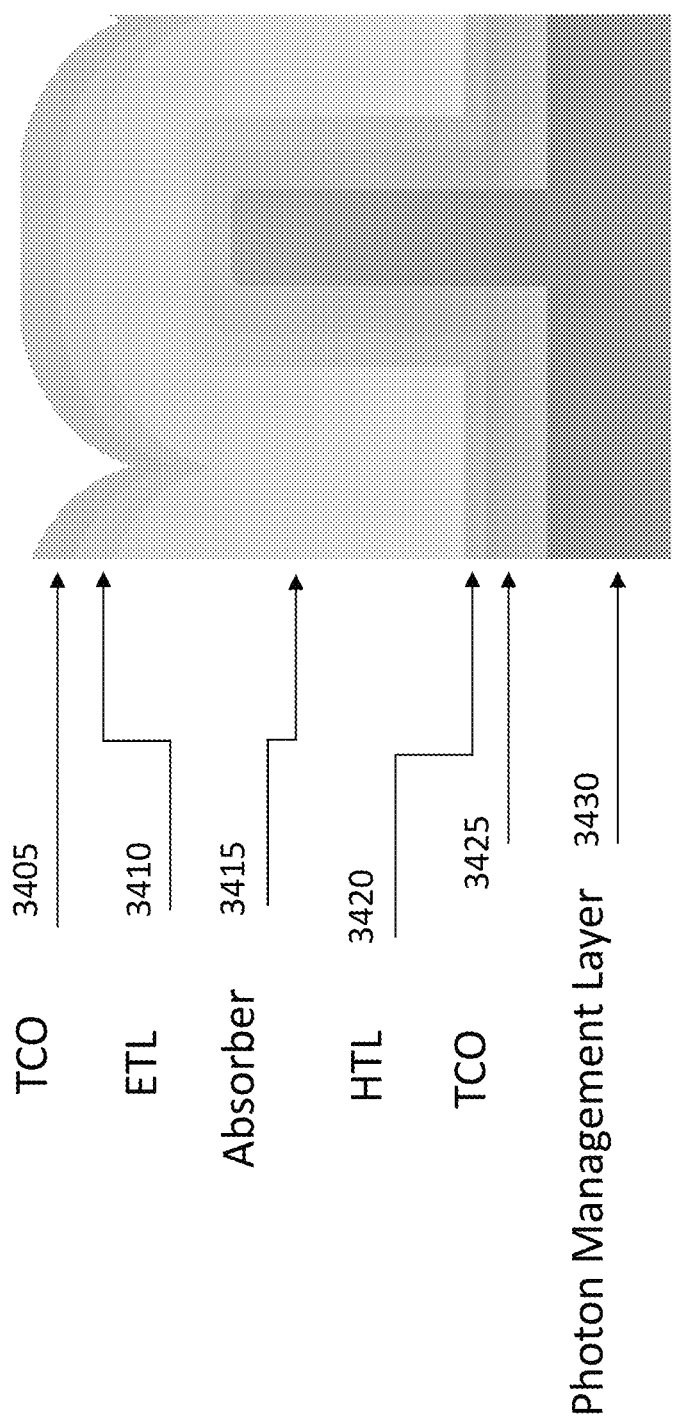
Figure 35:
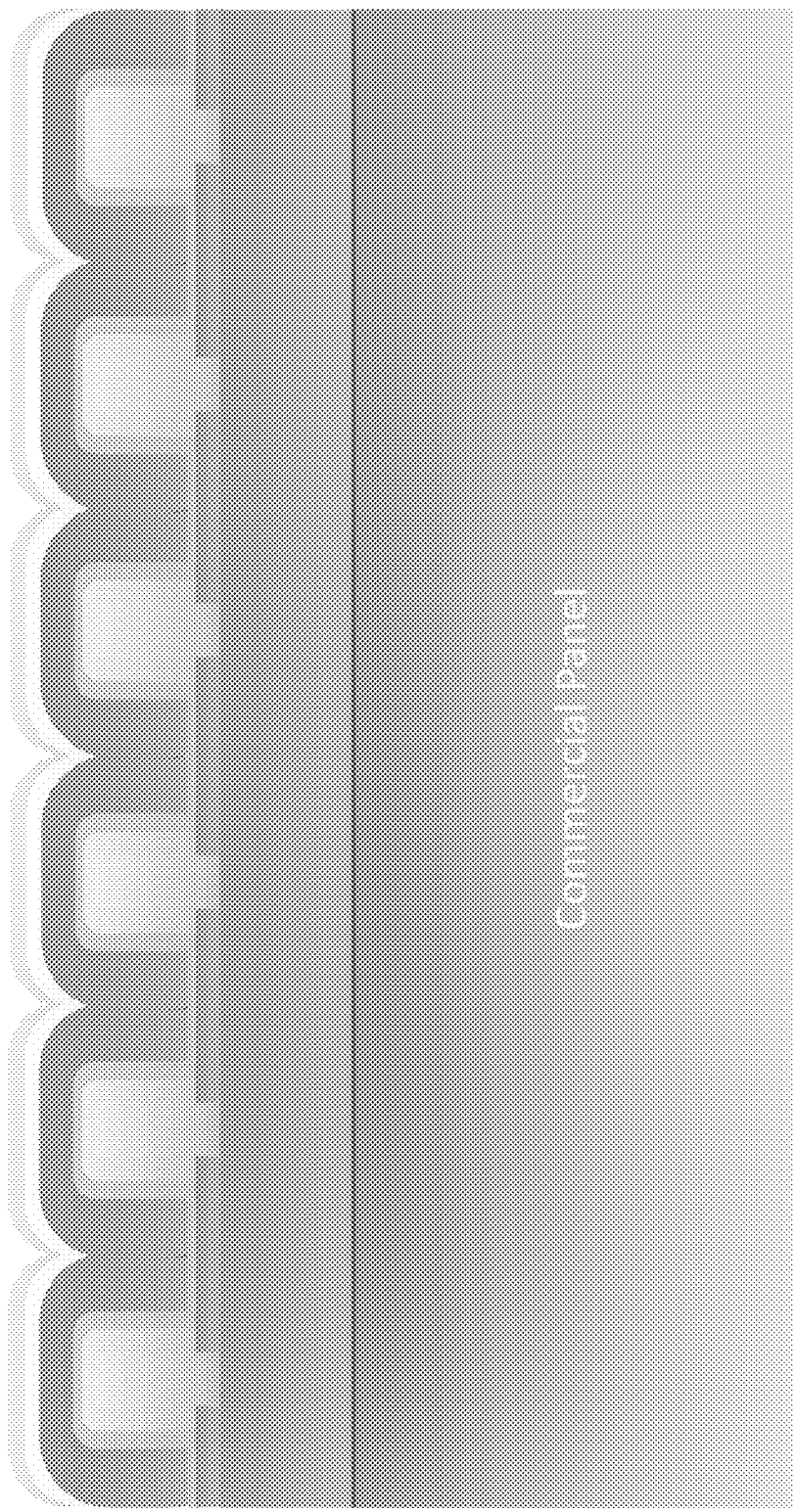

FIGS. 32-35 illustrate exemplary photo absorption structures on top of a PV panel. In particular, FIG. 32 illustrates a detail of the structure of FIG. 33, while FIG. 34 illustrates a detail of FIG. 35. The structures of FIGS. 32-35 illustrate photon management via nanopatterning. These structures can reduce reflection across a wide range of angles, increase absorption for a given material thickness, and reduce material costs. The contact engineering enables the fabrication of optimal electron and hole selective contacts, maximizes open circuit voltage for a given material quality, and mitigates the effect of physical defects such as pinholes. The carrier collection engineering decouples light absorption and collection directions, enables matching of material carrier collection length with device structure, and increases cell short circuit current and efficiency as compared to planar structures.

These methods allow flexibility in the choice of absorber material, as the spray-on technique enables a wide choice of materials with similar device structures, significantly reducing cost as compared to traditional high temperature processing. The low-temperature processing enables direct deposition on commercially available panels. The layers of FIGS. 32-33 can correspond to those of FIG. 10 or FIG. 24: a transparent conductive oxide (3205); an electron transport layer (3210); an absorber layer (3215); a hole transport layer (3220); a transparent conductive oxide layer (3225), and, additionally, a photon management layer (3230). For example, the photon management layer is configured to reduce reflection, so that more photons are transmitted into the underlying PV panel. FIG. 33 illustrates a structure comprising multiple elements as in FIG. 32. In the example of FIG. 32 and FIG. 33, the structure has a jagged shape, formed by elements having a triangular cross-section. For example, the structure may comprise pyramids or may comprise long lines extending normally to the plane of FIGS. 32-33, where each line has a triangular cross-section, forming a jagged grating structure. The inclination angles of the jagged elements may be different for each layer, as visible for example in FIG. 33, where a first inclination angle (3305) is different from a second inclination angle (3310). In FIG. 33, the jagged structure of the top absorber (3315) is deposited on a previously fabricated PV panel (3320).

FIG. 34 illustrates another embodiment, where the structure comprises rounded mounds instead of jagged elements as in FIG. 32. The layers of FIGS. 34-35 correspond to those of FIG. 32: a transparent conductive oxide (3405); an electron transport layer (3410); an absorber layer (3415); a hole transport layer (3420); a transparent conductive oxide layer (3425), and a photon management layer (3430). In some embodiments, the structure of FIG. 35 may comprise an array of nanopillars, or a beam grating with the beams extending normally to the plane of FIG. 35. The dimensions and distance between elements in FIG. 33 or 35 may be chosen so as to control the physical properties of the structure, as described above in the present disclosure.

The photon management layers in FIGS. 32 and 34, (3230) and (3430) are examples of layers that can be used for photon management. In some embodiments, the photon management layers may comprise structures such as the jagged profile in FIG. 32, or the pillars in FIG. 34. In other embodiments, these layers may also be flat layers without a complex structure. The photon and minority carrier management structural layer can serve two purposes: improvement of device interaction with photons, and reduction of minority carrier recombination. By creating nanoscale structures on the top surface of the photon management layer, this layer can act as a broadband, wide-angle, anti-reflection structure. The anti-reflection structure minimizes reflection of normally incident solar photons by the underlying solar cell structures. The anti-reflection property can apply to the UV, visible, and near IR photon wavelength ranges. The anti-reflection structure can also reduce reflection for off-normal solar photons.

The mechanism by which the anti-reflection structure reduces reflection is through a gradation of the effective index of refraction from the air to the solar cell underneath it. This gradation occurs when the dimensions of the structures are in the sub-wavelength regime with respect to the incident photon wavelength. For example, to have an effect in the UV band, the structures would have dimensions less than the wavelength in the UV range (e.g. 250 nm). As a consequence, the electric field of the incident electromagnetic waves can simultaneously interact with the solar cell material and air. If, for example, a structure is surrounded by air, the effective index of refraction of the layer comprising the structure surrounded by air can be calculated as $n_{eff}(f) = n_{air}*f + n_{mat}*(1-f)$, where $n_{eff}(f)$ is the effective refractive index felt by the photon in the mixed region, and f is the fraction of the plane orthogonal to the direction of photon travel that is air. The index of refraction of air and the material is given by $n_{air}$ and $n_{mat}$, respectively. Thus, by creating structures with continuously varying fractions f, it is possible to grade the refractive index. In other words, the refractive index will not be uniform across the depth of the material, but will have a gradient which can be controlled by changing the shape of the structure. For example, if the structure has pillars with a specific spacing, by keeping the height constant and decreasing the spacing, a greater fraction of the mixed layer will be occupied by the structure material instead of air. As a consequence, the effective refractive index will weigh the contribution from the refractive index of the material more than that of air, compared to the case with increased spacing between pillars. The width of the pillars could also be changed, or a slope could be introduced to form truncated pyramids or cones. The slope angle could be changed for a similar effect.

The person of ordinary skill in the art will understand that, for structures not in contact with air but covered by additional material layers, such as in FIGS. 32 and 34, the same averaging principle for the effective refractive index is valid, by substituting the refractive index of air by the refractive index of the material layers deposited conformally to the structure.

Therefore, the gradient for the effective index can be controlled by varying the geometrical dimension and shape of the anti-reflection structure, as well as choosing appropriate materials with specific refractive indexes.

Another photon management effect of the absorber structure is to allow coupling of the incident photons into multiple, local, guided modes and resonances. The result of this coupling is an increase of absorption per unit volume of material in the absorber layer. Several mechanisms can enable this feature. For example, by creating structured top and bottom surfaces, local broadband resonances are created due to the internal reflection of light from the top surface of the solar cell which occur into multiple internal modes. These resonances can then increase the absorption of photons which couple into them. This feature allows a reduction in the amount of material used, which in turn enables carrier collection engineering as described herein. Specifically, by creating feature sizes that are between 0.25 to 0.5 times the wavelength representing the midpoint of the spectrum of interest, we can expect enhancements in absorption by up to 2×. For solar materials, the wavelengths corresponding to the bandgap energy of the semiconductor (Eg) up to Eg+0.1 eV are absorbed the most weakly. Thus, to enhance the optical absorption of this range by up to 2×, devices with lateral feature sizes between 0.25*1.24/(Eg+0.05) to 0.5*1.24/(Eg+0.05) can be used. The vertical feature size can be 1 to 2 times the absorption length of the semiconductor in the wavelength range between Eg and Eg+0.05 eV. The absorption length can be defined as the length light must travel in the semiconductor structure before l/e of the incident light remains unabsorbed.

Specifically, these resonances can be observed through electromagnetic simulations of the film and observation of the photon generation rate in the material with computational simulations. In planar materials, the generation rate decays monotonically in a direction orthogonal to the light facing surface, and is uniform in directions parallel to the surface facing the incident light. However, the resonances created by nanostructuring cause the photon generation rates to locally increase at the location of the resonance in the film. This can be observed through simulation as a deviation from the generation rate profiles of the planar material in both the parallel and orthogonal directions from the light-facing surface.

As an example, if the semiconductor bandgap energy is 1.8 eV, corresponding to a wavelength of approximately 690 nm, then the structures may have lateral dimensions ranging from approximately 160 nm up to 340 nm. If the semiconductor has an absorption depth of 400 nm at the wavelength of interest, the structure can have heights ranging from 400 nm up to 800 nm. Due to the feature size being of the same order of magnitude as the photon wavelength, the interactions between the photons and the structured features are rigorously described by full three dimensional finite difference time domain electromagnetic simulations. However, the effect is created due to the interaction of the photon with these non-planar geometries. Specifically, the resonances described here are created by incident photons interacting with these sub-wavelength structures, which may be pyramidal, conical, or cylinders, and scattering from their initial direction. When multiple scattering events occur, interference between the photons cause local resonances to occur. As the films are absorptive, these resonances occur when the path length of photons in the material is larger than the photon scattering lengths. If the path length of photons in the material before absorption is significantly shorter than the scattering length, then the photons will be absorbed before multiple scattering events can occur, and no resonances will occur. By engineering the dimensions of the structures as previously described, both periodic and random structures will create these resonances within the wavelength range of interest, e.g. 400 nm-700 nm.

The carrier collection engineering aspect of this structure emerges from the proximity of the electron and hole collection layers to every point in the device. In standard planar photovoltaics, the photon absorption and carrier collection both occur in the same direction. However, by generating local resonances, and through the use of nanostructured materials, it is possible to decouple the photon absorption and minority carrier directions. As a result, the maximum distance any minority carrier must travel in the device before being collected can be reduced. The short circuit current of the cell will therefore improve. In view of the above, the photon management layer can also be considered a minority carrier management layer. Due to the change in the local photon generation rate, it is possible to engineer such films to have a larger fraction of the photons absorbed closer to a carrier collecting surface or layer. This enables the losses of generated minority carriers to be engineered and minimized by designing the structure to maximally absorb photons and generate minority carriers near carrier-collecting surfaces such as the electron transport layer and hole transport layer.

In view of the above, if the characteristic dimensions of the nanotextures are carefully controlled, the scattering length of the photons is lower than the photon path length. The photons, therefore, have a chance to be scattered at the nanostructures a few times as they travel to the base of the nanostructure, for example to the base of the pyramidal or rod-shaped elements. The increased scattering increases their effect chance of being collected. If the structures are too small or too large, multiple scattering events do not occur before the photon makes its way through the absorber. It can be noted that, in the present disclosure, a surface can be engineered by forming a structure formed by elements with typical dimensions less than half an incident wavelength. These wavelength is the blocked by the surface. As a consequence, more photons of the incident wavelength will scatter back up away from the surface. Similarly, the absorber layer can be formed by elements having typical dimensions less than half a wavelength of the photons to be scattered back towards the solar cells absorbing layers.

In some embodiments, the aspect ratio, or height, of the elements can increase the scattering of photons back towards the absorbing layers of the solar cell. In some embodiments, the scattering effect is maximized if the elements of the structures have a height of about 1 micrometer. For example, the pillars of layer (3430) in FIG. 34 or the pyramids of layer (3230) in FIG. 32 can have a height of about 1 micrometer to advantageously maximize scattering of photons towards the absorbing layers of the solar cell, above.

In some embodiments, the photon management layer can be realized by first fabricating a high aspect ratio ETL (e.g. an aspect ratio between 5:1 and 10:1 and lateral dimension of 100 nm-200 nm). Normally, the lithography steps involved in fabricating such a high aspect ratio layer would increase the cost substantially. However, by using any of the methods described in the present disclosure, this high aspect ratio layer can be fabricated at a greatly reduced cost. For example, the structure may be formed by building monolayers of particles. The structure may also be formed by using particles as an etch mask, as described in the present disclosure. The structure may also be fabricated by building monolayers of particles and fusing the particles together. Once the high aspect ratio structure is fabricated, a uniform and conformal layer of quantum-dot particles can be coated on the high aspect ratio structure. The absorber layer of QDs may comprise a monolayer of particles, or multiple layers, as described in the present disclosure. Therefore, the fabrication of a high aspect ratio structure coated with nanoparticles can be realized due to the methods described in the present disclosure, at an affordable cost.

As known to the person of ordinary skill in the art, current solar installations are primarily based on single junction solar cells. The present disclosure describes methods that works with present day technologies, and improves their power output with minimal required changes to the overall cell and panel architecture. In some embodiments, the methods and structures of the present disclosure can be integrated through post processing, independently of solar manufacturers, or at the end of the manufacturing process, before encapsulation. These methods also work with multijunction cells.

In some embodiments, the first functional group is selected from the group consisting of: —$CH_3$, —OH, —$NH_2$, an ester group, an aldehyde group, an amide group, and a nitrile group, and the first fluid is selected from the group consisting of: trimethyl-aluminum, a chloride compound, a fluoride compound, an organometallic compound, and an acetylacetonate compound, hexane mixed with trimethyl-aluminum, hexane mixed with a chloride compound, hexane mixed a fluoride compound, hexane mixed an organometallic compound, hexane mixed an acetylacetonate compound, a metal-organic chemical vapour deposition precursor, and an atomic layer deposition precursor. Other mixtures comprising different solvents than hexane may also be used. In some embodiments, the surface of the particles might comprise a functional group, obviating the need to prepare the particles' surface with a precursor. Alternatively, the surface to be coated may comprise these functional groups, and therefore only the particles' surface needs to be prepared. For example, if a nanoparticle inherently has —OH on the surface, it may be unnecessary to prepare its surface with a —OH functional group, since the particle's material already comprises it. In this example, it may be possible to prepare the surface to be coated, for example with TMA, and then spray or otherwise attach the particles to the treated surface, without a particle preparation step.

In some embodiments, the particles bonded on a surface may have the same chemical composition as the substrate. In some embodiments, the particles may be coated with the same material as the substrate. In these cases, the outer region of the particles will be the same as the substrate, while the internal region of the particles may be different. In some embodiments, particle mixtures may include a majority of particles of the same material as the substrate, and a minority of particles that have a different material. This different material may have a different etching rate compared to the material of the substrate. For example, the minority of particles may etch at a faster rate than the substrate, or at a slower rate than the substrate. In some embodiments, using the same materials for the particles and the substrate can render the coating process (of the particles to the substrate) easier. In some embodiments, the etching process can also be simplified, by using the same material for both the particles and the substrate, or a different material with a different etching rate. In some embodiments, the roughness of the structures can be controlled to form hierarchical structures.

In some embodiments, forming a first monolayer of particles on the surface is by forming less than one monolayer by providing a flux of nanoparticles insufficient to completely saturate the surface. In some embodiments, forming a first monolayer of particles on the surface is by forming more than one monolayer, comprising a first monolayer and at least one other particle in a partial second monolayer, by flushing in part particles in excess of the first monolayer. In some embodiments, the first plurality of particles comprises particles having different sizes, shape or composition. In some embodiments, the first plurality of particles has a different size, shape or composition than the second plurality of particles. In some embodiments, if differently-sized particles are used together, the smaller particles may attach to the bigger particles, as well as to the substrate, in gaps between the bigger particles. In some embodiments, if different materials are used for the particles, these particles can be used as shadow masks thanks to their differential etching rate. For example, by using dissimilar materials, it is possible to pattern a surface due to the differential etch rates. For example, if a mixture of $SiO_2$ and $Al_2O_3$ nanoparticles is sprayed on a surface, the particles would etch very differently in fluorine etchants. The different etching rates can result in inherent patterning.

Matrixes comprising metal and dielectric nanoparticles may also be used to fabricate meta materials, for example metamaterials having exotic properties, such as metamaterials used for cloaking applications to render objects invisible or less visible. Particles can also be used to create materials with a negative index of refraction.

In some embodiments, nanoparticles can be sintered with lasers or heat after application to surfaces. Particles can also be used to fabricate antifogging optics for environmental chambers for LED and solar cell characterization in high humidity environments. In some embodiments, the particles and substrates have been described as being covalently bonded. However, in other embodiments, the particles and substrate can be physically interacting, for example through electrostatic or van der Waals forces. Therefore, the descriptions of the present disclosure can be referred to also as physically interacting instead of covalently bonded. In the present disclosure, therefore, covalently bonded can be substituted for physically interacting, as appropriate.

In some embodiments, the control of different properties of the surface, such as transparency and reflectivity at specific wavelengths, can be described as control of the effective refractive index of each layer. The refractive index of a layer comprising different materials is effectively controlled by the type of material as well as the relative dimensions and contributions of each material to the layer's volume. For example, by varying the shape of a structure, the effective refractive index of that structure can be controlled.

In some embodiments a low temperature can be used for the deposition process to minimize gradients in surface tension during evaporation of the relevant fluids. The structure of the present disclosure may also be fabricated by building monolayers of particles and fusing the particles together, for example by raising the temperature, or by forming chemical bonds between particles. In this way, metamaterials can be fabricated, by using similar or dissimilar particles.

The various embodiments described above are provided by way of illustration only and should not be construed to limit the present disclosure. Those skilled in the art will readily recognize various modifications and changes that may be made to the present disclosure without following the example embodiments and applications illustrated and described herein, and without departing from the true spirit and scope of the present disclosure.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

What is claimed is:

1. A method comprising:
   determining a first lateral dimension of each element in a structure on a surface, the structure comprising a plurality of elements, the determining based on a first physical characteristic of the structure, the first lateral dimension being in a horizontal orientation relative to the surface;
   determining a second lateral dimension of each element, the second lateral dimension being perpendicular to the first lateral dimension and in a horizontal orientation relative to the surface;
   determining a height of each element based on a second physical characteristic of the structure, the height being in a vertical orientation relative to the surface;
   determining a spacing between the elements based on the first and second physical characteristics;
   fabricating the structure comprising the plurality of elements;
   defining a plurality of patterned features on the plurality of elements, the patterned features having dimensions smaller than any of the first lateral dimension, the second lateral dimension, and the height of each element, the patterned features based on a third physical characteristic of the structure;
   functionalizing the structure with a self-saturated monolayer of a first functional group;
   functionalizing a first plurality of particles with a second functional group, the second functional group chosen so as to form a covalent or ionic bond with the first functional group; and
   forming a monolayer of the first plurality of particles on the structure,
   wherein the structure comprising the plurality of elements and the plurality of patterned features is monolithic.

2. The method of claim 1, wherein the first and second lateral dimensions are equal to each other.

3. The method of claim 1, wherein the first physical characteristic is transparency to electromagnetic radiation, and further comprising:
   determining a first wavelength range comprising wavelengths between a first maximum wavelength and a first minimum wavelength, the first minimum wavelength being less than the first maximum wavelength;
   determining a second wavelength range comprising wavelengths between a second maximum wavelength and the first maximum wavelength, the second maximum wavelength being greater than the first maximum wavelength, wherein the first lateral dimension and the second lateral dimension are less than half the first maximum wavelength.

4. The method of claim 3, wherein the second physical characteristic is reflectivity to electromagnetic radiation, and further comprising determining a third wavelength range, wherein determining a height of each element is to increase the reflectivity of the surface at the third wavelength range.

5. The method of claim 3, further comprising determining an inclination angle for lateral surfaces of each element of the structure, according to a contact angle for a droplet of a liquid contacting the structure, a smaller contact angle corresponding to an attractive force between the structure and the liquid, and a higher contact angle corresponding to a repulsive force between the structure and the liquid.

6. The method of claim 3, further comprising selecting a diameter and material of the particles based on the first and second physical characteristics.

7. The method of claim 3, wherein the first wavelength range is UV electromagnetic radiation, and the second wavelength range is visible electromagnetic radiation.

8. The method of claim 1, wherein: determining the first lateral dimension, the second lateral dimension, and the height of each element comprises selecting a shape for each element, and the shape is selected from the group consisting of: a parallelepiped, a pyramid, a cone, a cube, a beam, an ellipsoid and a sphere.

9. The method of claim 3, wherein the first plurality of particles comprises particles selected from the group consisting of: metals, metal oxides, metal nitrides, carbon nanotubes, buckyballs, and architectured 3D nanostructures, and the surface comprises a material selected from: glass, ceramics, plastics, polymers, textiles, semiconductors, metals, 3D printed materials, and 3D architectured materials.

10. The method of claim 6, wherein determining an inclination angle according a hydrophobic property is limitedly to a sub-region of the structure, so that for an environmental humidity range which will cause fogging, the sub-region will not fog.

11. The method of claim 1, wherein the first physical characteristic and the second physical characteristic are selected from the group consisting of: reflectivity to incident electromagnetic radiation, transparency to incident electromagnetic radiation, antifogging, hydrophobicity, sensitivity to polarization of incident electromagnetic radiation, absorption of incident electromagnetic radiation, blocking of incident electromagnetic radiation, blocking of incident electromagnetic radiation in a first wavelength range and transparency to incident electromagnetic radiation in a second wavelength range different from the first wavelength range, emissivity to incident electromagnetic radiation, antifrosting, oil repellency, water repellency, absorption of incident electromagnetic radiation, ability to emit electrons, ability to amplify and emit electrons, and combinations thereof.

12. The method of claim 1, further comprising:
   a) functionalizing the monolayer of the first plurality of particles with a self-saturated monolayer of the first functional group;
   b) functionalizing a second plurality of particles with the second functional group; and
   c) forming a monolayer of the second plurality of particles on the monolayer of the first plurality of particles.

13. The method of claim 12, further comprising iterating steps a)-c) to form additional monolayers of particles.

14. The method of claim 3, wherein the second physical characteristic is reflectivity to electromagnetic radiation, and further comprising determining a third wavelength range, wherein determining a height of each element is to decrease the reflectivity of the surface at the third wavelength range.

15. The method of claim 6, wherein a sub-region of the structure has no elements.

16. A method comprising:
   determining a first lateral dimension of each element in a structure on a surface, the structure comprising a plurality of elements, the determining based on a first physical characteristic of the structure, the first lateral dimension being in a horizontal orientation relative to the surface;

determining a second lateral dimension of each element, the second lateral dimension being perpendicular to the first lateral dimension and in a horizontal orientation relative to the surface;

determining a height of each element based on a second physical characteristic of the structure, the height being in a vertical orientation relative to the surface;

determining a spacing between the elements based on the first and second physical characteristics;

fabricating the structure comprising the plurality of elements;

defining a plurality of patterned features on the plurality of elements, the patterned features having dimensions smaller than any of the first lateral dimension, the second lateral dimension, and the height of each element, the patterned features based on a third physical characteristic of the structure; and attaching a monolayer of the first plurality of particles on the structure through van der Waals forces or hydrogen bonds, wherein the structure comprising the plurality of elements and the plurality of patterned features is monolithic.

17. The method of claim 16, further comprising attaching additional monolayers of particles to underlying monolayers of particles.

* * * * *